(12) United States Patent
Suhara et al.

(10) Patent No.: US 7,043,824 B2
(45) Date of Patent: May 16, 2006

(54) ELECTRIC-COMPONENT MOUNTING SYSTEM

(75) Inventors: Shinsuke Suhara, Kariya (JP); Toshiya Ito, Nishio (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 531 days.

(21) Appl. No.: 10/137,434

(22) Filed: May 3, 2002

(65) Prior Publication Data

US 2002/0167801 A1    Nov. 14, 2002

(30) Foreign Application Priority Data

May 14, 2001  (JP) ............................ 2001-143553

(51) Int. Cl.
*B23P 19/00* (2006.01)

(52) U.S. Cl. ............... 29/740; 29/741; 29/742; 29/759; 29/831; 29/832; 211/1.51; 211/1.52; 248/200; 248/300; 361/728

(58) Field of Classification Search .......... 29/740–742, 29/759, 831, 832; 211/1.51, 1.52; 248/200, 248/300; 361/728
See application file for complete search history.

(56) References Cited

U.S. PATENT DOCUMENTS

| | | | | |
|---|---|---|---|---|
| 4,747,198 A | * | 5/1988 | Asai et al. | ............... 29/407.04 |
| 6,189,683 B1 | * | 2/2001 | Svejkovsky et al. | ........ 198/769 |
| 6,317,972 B1 | * | 11/2001 | Asai et al. | ................... 29/833 |

FOREIGN PATENT DOCUMENTS

| | | | |
|---|---|---|---|
| JP | A 9-16240 | | 1/1997 |
| JP | 09150229 A | * | 6/1997 |
| JP | A 10-163677 | | 6/1998 |
| JP | A 11-11446 | | 1/1999 |
| JP | A 2000-36700 | | 2/2000 |
| JP | A 2000-261197 | | 9/2000 |

OTHER PUBLICATIONS

"High-reliability epoxy molding compound for surface mount devices"; Fujita, H.; Mogi, N.;☐☐Electronic Components and Technology Conference, 1993. Proceedings., 43rd; Jun. 1-4, 1993 pp.:735-741.*

* cited by examiner

*Primary Examiner*—Paul Kim
(74) *Attorney, Agent, or Firm*—Oliff & Berridge PLC

(57) ABSTRACT

An electric-component mounting system wherein a determining device is operated for presently required operations of working devices disposed on a common main body, to determine a cycle-time-determinant working device which determines a cycle time of the system such that the cycle time is determined by a required operating time of the cycle-time-determinant working device as calculated when the presently required operation is performed at predetermined maximum acceleration and deceleration values or a predetermined maximum operating speed, and a slowdown device determines actual acceleration and deceleration values or an actual operating speed of each of non-cycle-time-determinant working device, so as to be lower than the predetermined maximum acceleration and deceleration values or operating speed thereof, such that the presently required operation of each non-cycle-time-determinant working device can be completed within the cycle time determined by the cycle-time-determinant working device.

18 Claims, 23 Drawing Sheets

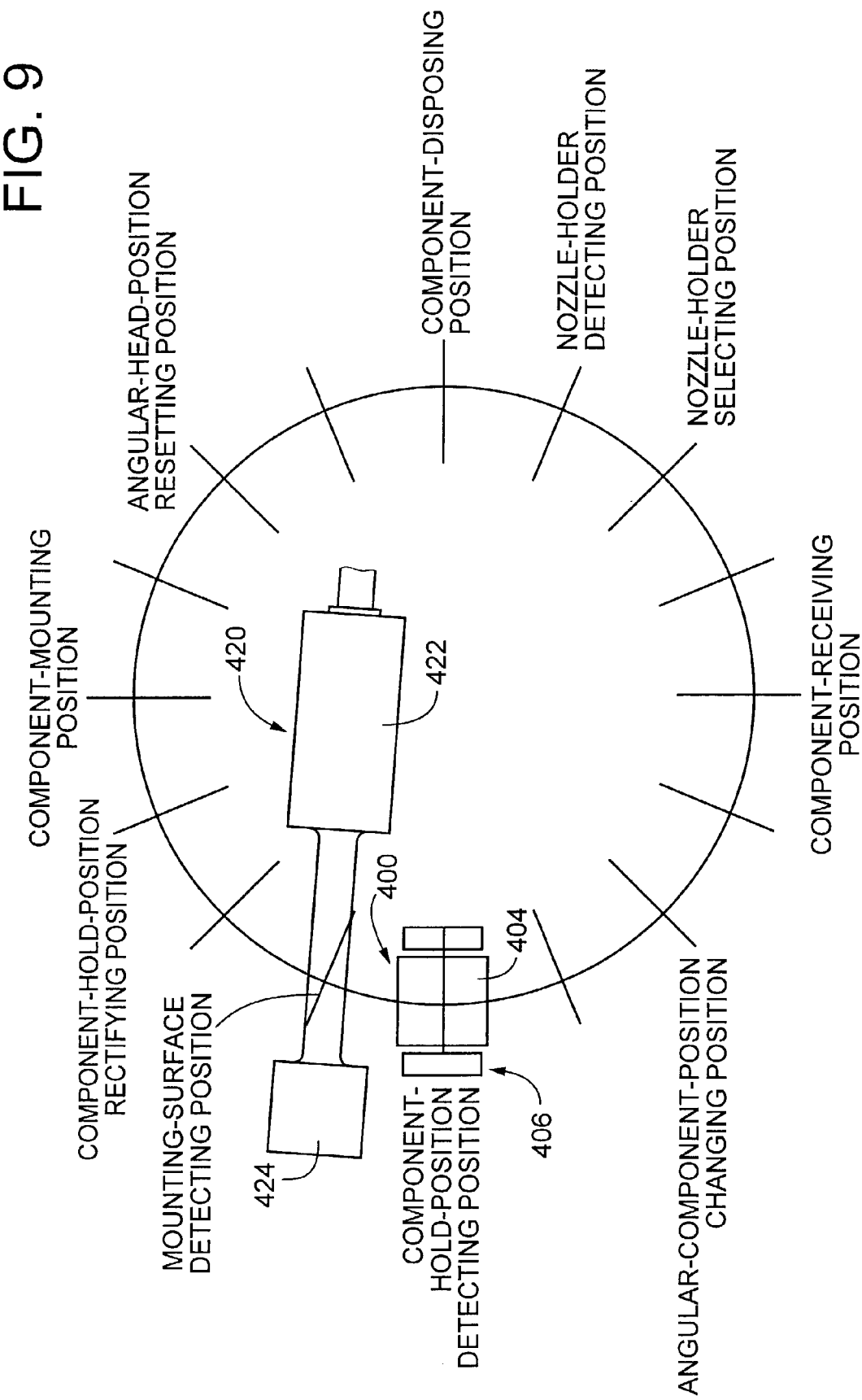

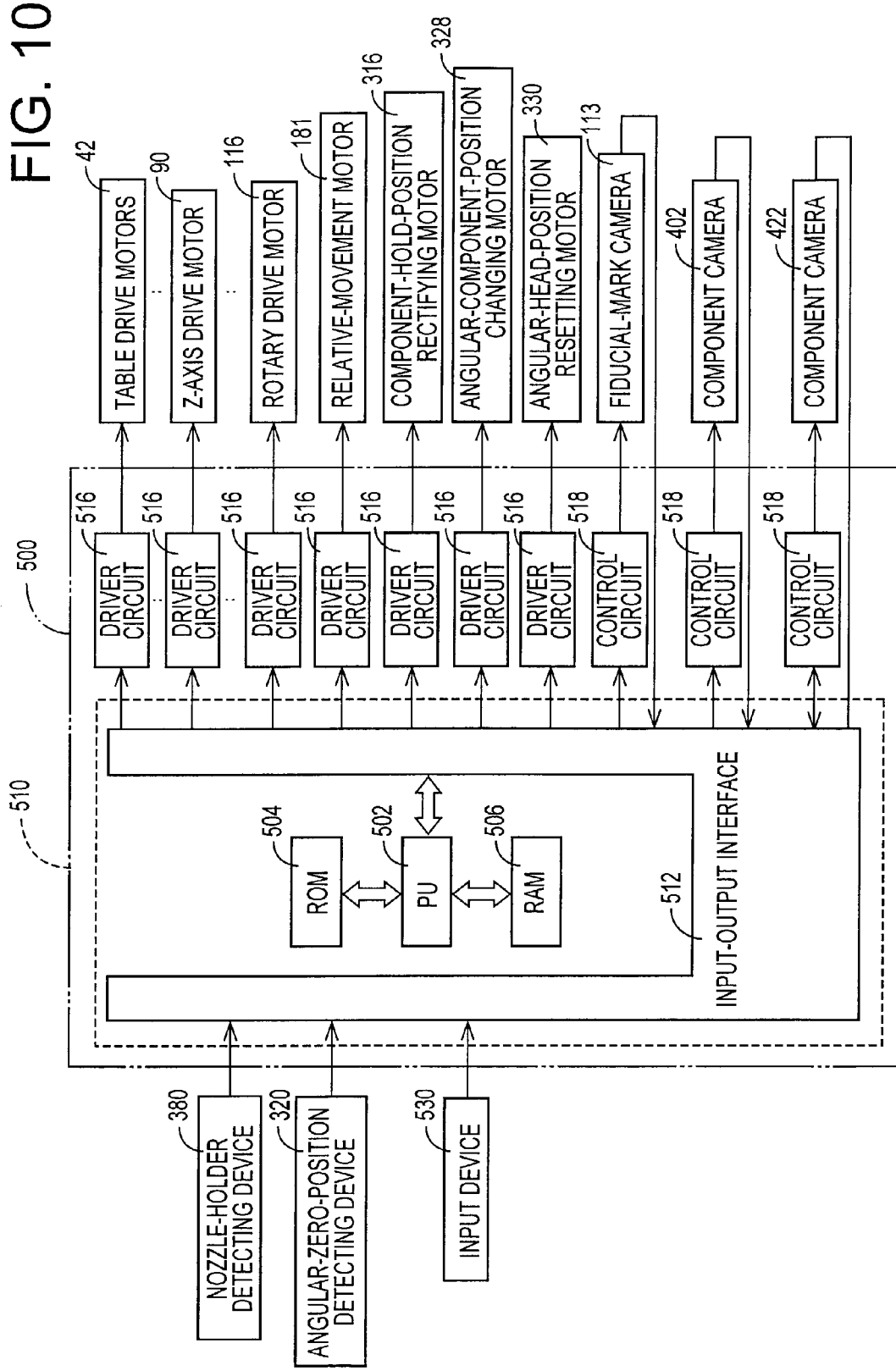

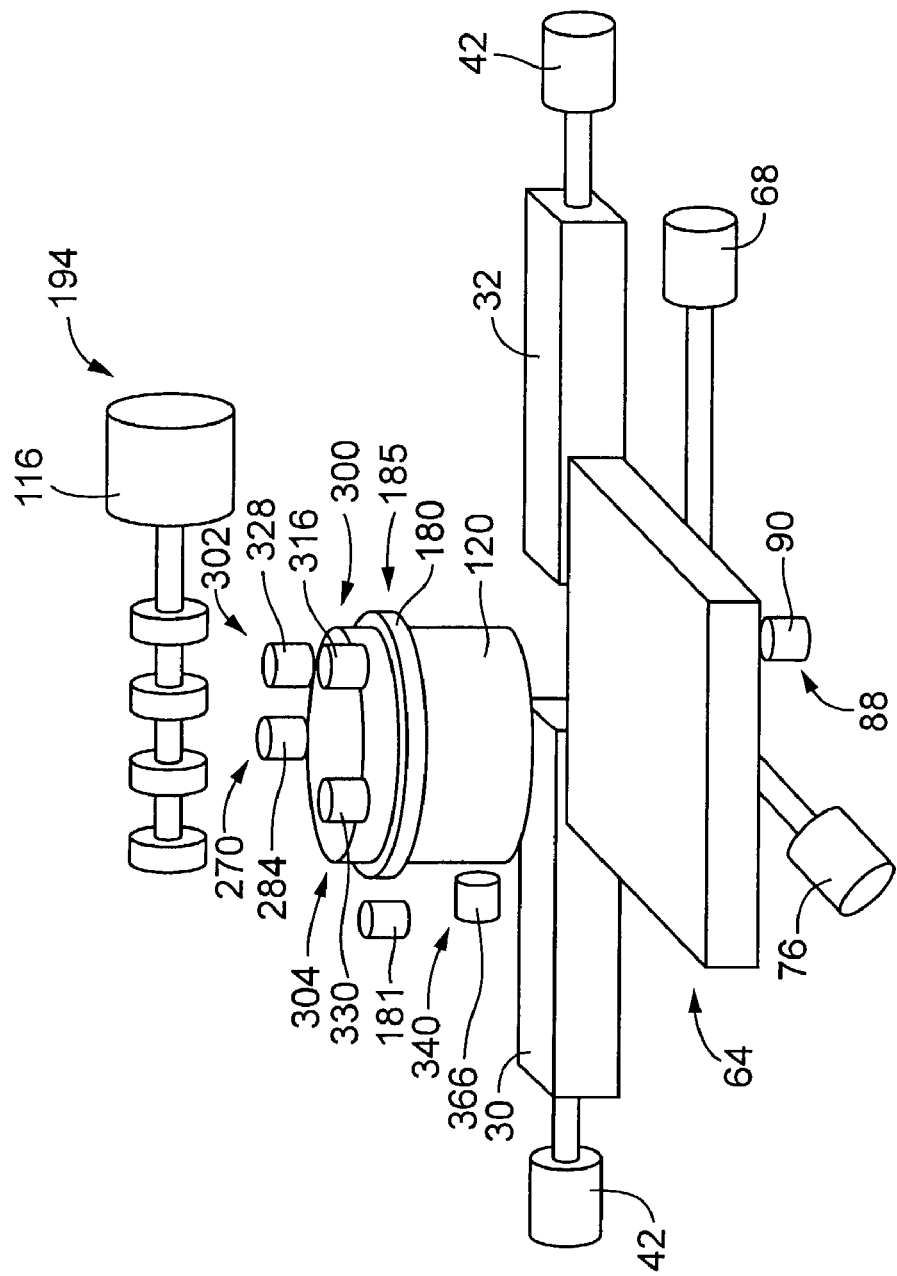

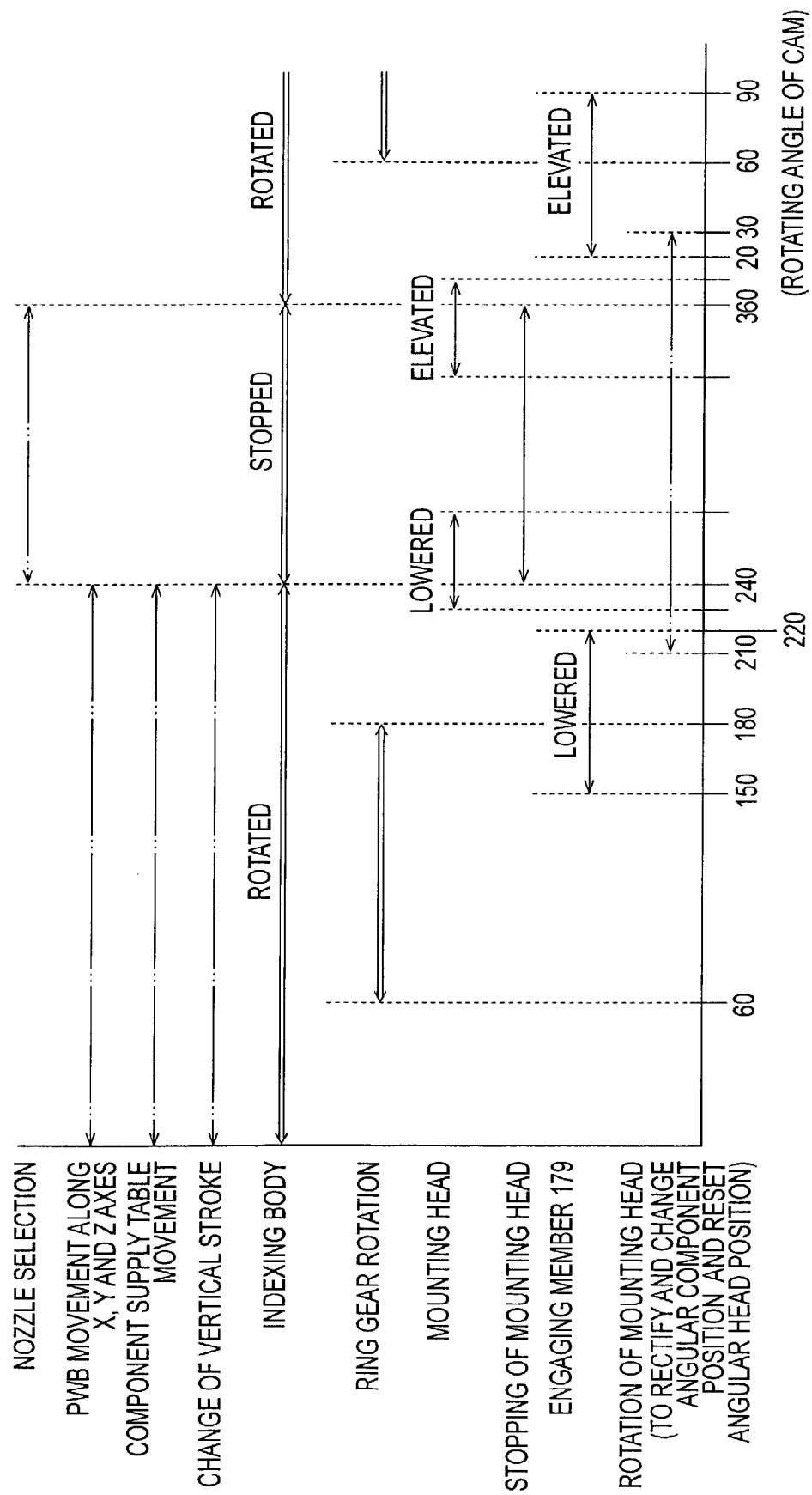

FIG. 13

| WORKING DEVICES | | ACCELERATION AND DECELERATION | | | |
|---|---|---|---|---|---|
| HEAD-TURNING DEVICE | | HIGH | MEDIUM | LOW | VERY LOW |
| TABLE-POSITIONING DEVICE | | HIGH | MEDIUM | LOW | |
| XY POSITIONING DEVICE | X AXIS | HIGH | MEDIUM | LOW | VERY LOW |
| | Y AXIS | HIGH | MEDIUM | LOW | VERY LOW |
| Z-AXIS POSITIONING DEVICE | | HIGH | MEDIUM | LOW | VERY LOW |
| STROKE CHANGING DEVICE | | CONSTANT | | | |
| COMPONENT-HOLD-POSITION RECTIFYING DEVICE | | HIGH | | LOW | |
| ANGULAR-COMPONENT-POSITION CHANGING DEVICE | | HIGH | MEDIUM | LOW | VERY LOW |
| ANGULAR-HEAD-POSITION RESETTING DEVICE | | HIGH | MEDIUM | LOW | VERY LOW |
| NOZZLE-HOLDER SELECTING DEVICE | | HIGH | MEDIUM | LOW | |
| NON-RELATIVE-MOVEMENT ESTABLISHING DEVICE | | HIGH | MEDIUM | LOW | VERY LOW |

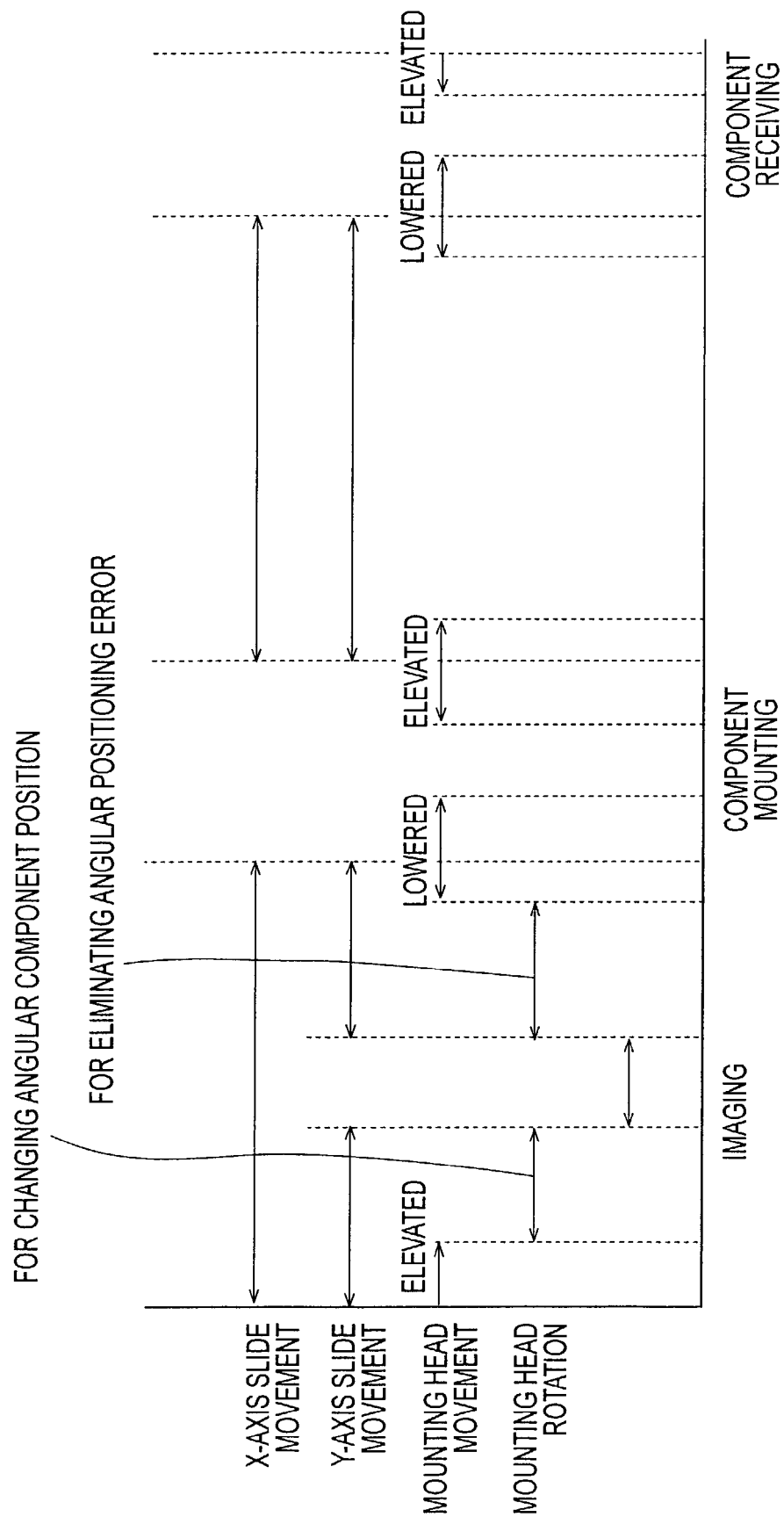

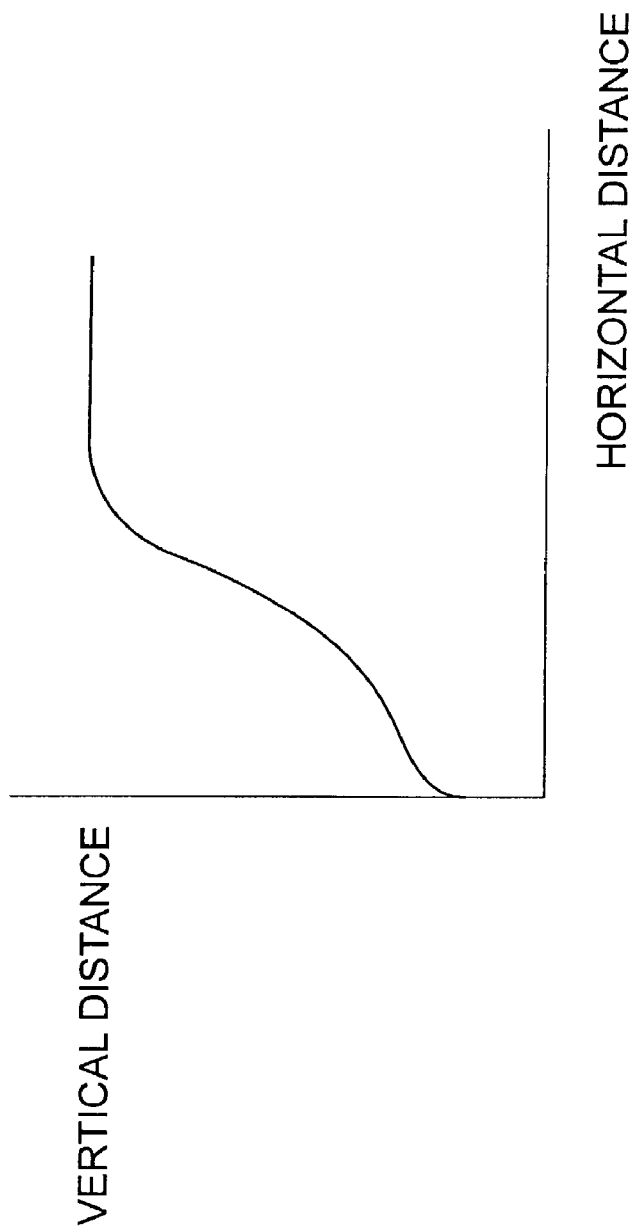

ELECTRIC-COMPONENT MOUNTING SYSTEM

The present application is based on Japanese Patent Application No. 2001-143553 filed May 14, 2001, the content of which is incorporated herein by reference.

BACKGROUND OF THE INVENTION

1. Field of the Invention

The present invention relates to an electric-component mounting system arranged to mount electric components (typically, electronic components), and more particularly to techniques for reducing vibrations in the system.

2. Discussion of Related Art

JP-A-11-11446 discloses an example of an electric-component mounting system wherein various working devices necessary to mount electric components on a circuit substrate are disposed on a common main body of the system. In the electric-component mounting system disclosed in the above-identified publication, the working devices disposed on the common main body of the system include: a component-supplying device operable to supply electric components; a printed-wiring-board holding device operable to hold the circuit substrate in the form of a printed-wiring board; a holding-device positioning device operable to move or position the printed-wiring-board holding device; and a component-mounting device operable to mount the electric components on the printed-wiring board.

The component mounting device includes a plurality of mounting head, and a head turning device operable to turn the mounting heads about a common axis of turning such that the plurality of mounting heads are sequentially moved to and stopped at a plurality of working stations or positions such as: a component-receiving position at which each mounting head receives the electric component from the component supply device; and a component-mounting position at which the mounting head mounts the electric component on the printed-wiring board.

While each mounting head is moved from the component-receiving position to the component-mounting position, the position of the electric component as held by the mounting head is detected by a component-hold-position detecting device disposed at a component-hold-position detecting position, and the mounting head is rotated about its axis by a head-rotating device disposed at a component-hold-position rectifying device, to eliminate an angular positioning error of the electric component. While the mounting head is then moved from the component-mounting position to the component-receiving position, the mounting head is rotated about its axis by another head-rotating device disposed at an angular-head-position resetting device, so that the mounting head is returned to its original angular position in which the mounting head receives the electric component.

The component-supplying device includes a component supply table and a table-positioning device for moving and positioning the component supply table. The component supply table includes a feeder carriage and a plurality of component feeders mounted on the feeder carriage. In operation of the component-supplying device, the component supply table is moved such that component-supply portions of the component feeders are successively aligned with a predetermined component-supply position of the component-supplying device, so that the electric components are supplied from the respective component feeders. The printed-wiring board is positioned by the holding-device positioning device which is operable to move the printed-wiring-board holding device, so that a component-mounting position at which the electric component is to be mounted on the printed-wiring board is located right under the mounting head located at the component-mounting position.

As described above, the plurality of working devices such as the head turning device disposed on the main body of the system are operated to mount the electric components on the printed-wiring board. In one cycle of operation of the system to mount one electric component on the printed-wiring board, the two or more working devices are operated simultaneously. This one cycle of operation includes simultaneous operations of the working devices performed between two moments at which two adjacent mounting heads have reached the component-mounting position. For instance, those simultaneous operations include: a movement of the electric component by each mounting head, which movement takes place due to turning of the mounting heads about the common axis of turning; a positioning movement of the printed-wiring board by the holding-device positioning device; and a positioning movement of the component supply table by the table-positioning device. The simultaneous operations cause different kinds of vibrations of various operating members of the working devices due to acceleration and deceleration upon starting and stopping of linear, rotary and turning movements of the operating members. Those different kinds of vibrations are superimposed on each other, resulting in a relatively large magnitude of vibration of the electric-component mounting system as a whole, which undesirably lowers the accuracy of mounting of the electric components.

In addition, the known electric-component mounting system described above is not arranged in an effort to reduce the magnitude of the overall vibration of the system. Described in detail, if all of the working devices are operated with maximum permissible acceleration and deceleration values, the operating cycle times of the working devices are determined by the maximum permissible acceleration and deceleration values. If any one of the thus determined operating cycle times of the working devices except the head turning device is longer than the cycle time of the head turning device, the head turning device is operated with a cycle time longer than that corresponding to its maximum permissible acceleration and deceleration values. If none of the operating cycle times of the working devices except the head turning device are longer than the cycle time of the head turning device, the electric-component mounting system is operated with the cycle time of the head turning device, and all of the working devices are operated at their maximum permissible acceleration and deceleration values, except where the cycle time of the head turning device is required to be prolonged for some reason or other associated with any other working device. For example, each working device which is operable at one or a plurality of acceleration and deceleration values is operated at its maximum acceleration and deceleration values. In this case, some of the working devices may be operated at unnecessarily high acceleration and deceleration values, causing a relatively large magnitude of vibration. Where the different working devices are simultaneously operated at their maximum permissible acceleration and deceleration values, the required operating times of the working devices are generally different from each other. For instance, the required operating time of one of the working devices is shorter than those of the other working devices where the required amount of operation of the above-indicated one working device is smaller than those of the other working devices. In this instance, the operation of the above-indicated one working device at its maximum permissible acceleration and deceleration values in the known system is unnecessary and undesirable since it merely causes an increase in the magnitude of vibration of the known electric-component mounting system.

The problem described above is encountered not only in the electric-component mounting system of the type wherein the plurality of mounting heads are turned about the common axis of turning by the head turning device, but also in electric-component mounting systems of other types in which electric components are mounted on a circuit substrate by operations of a plurality of working devices, such as a system of a type wherein the electric component is mounted on the circuit substrate by a movement of a mounting head along at least one of two mutually perpendicular axes in a plane parallel to the plane of the circuit substrate.

SUMMARY OF THE INVENTION

The present invention was made in view of the problems encountered in the prior art described above. It is therefore an object of the present invention to provide an electric-component mounting system that has a reduced magnitude of vibration. This object may be achieved according to any one of the following modes of the present invention, each of which is numbered like the appended claims and depends from the other mode or modes, where appropriate, for easier understanding of technical features disclosed in the present application and possible combinations of those features. However, it is to be understood that the invention is not limited to those technical features or combinations thereof, and that any one of a plurality of technical features described below with respect to any one mode of the invention may be a subject of the present invention, without the other technical feature or features being combined with that one feature.

(1) An electric-component mounting system operable to mount electric components on a circuit substrate and including a common main body, and a plurality of working devices which are disposed on the common main body and each of which has an actuator that is variable in acceleration and deceleration values and/or an operating speed thereof, comprising:

determinant-device determining means operable with respect to presently required operations of a plurality of selected working devices selected from the plurality of working devices, the determinant-device determining means determining, as a cycle-time-determinant working device, each of at least one of the selected working devices which determines a cycle time of the electric-component mounting system such that the cycle time is determined on the basis of a required operating time of each cycle-time-determinant working device as calculated when the presently required operation of the cycle-time-determinant working device is performed at predetermined maximum acceleration and deceleration values or a predetermined maximum operating speed thereof, and slowdown means for determining actual acceleration and deceleration values or an actual operating speed of each of at least one of non-cycle-time-determinant working devices which are the plurality of selected working devices except each cycle-time-determinant working device, the slowdown means determining the actual acceleration and deceleration values or the actual operating speed of each non-cycle-time-determinant working device, so as to be lower than predetermined maximum acceleration and deceleration values or a predetermined maximum operating speed thereof, such that the presently required operation of each non-cycle-time-determinant working device can be completed within a corresponding period of the cycle time determined by each cycle-time-determinant working device.

The electric-component mounting system includes working devices which are variable in their acceleration and deceleration values and/or their operating speed, and working devices which are not variable in the acceleration and deceleration values and the operating speed. Further, the electric-component mounting system includes working devices whose operating amounts are variable from time to time, and working devices whose operating amounts are constant. Therefore, the required operating times of some of the working devices vary from time to time, while those of the other working devices are kept constant.

The acceleration and deceleration values of some working devices are changed depending upon the kind of the electric component. Where the electric component held by suction by a suction nozzle under a negative pressure is moved or rotated about its axis, the electric component may be displaced or dislocated relative to the suction nozzle due to an inertia mass of the electric component, and may even fall from the suction nozzle in some condition, if the suction nozzle is moved or rotated at excessively high acceleration and deceleration values. Whether the electric component is displaced relative to or fall from the suction nozzle depends upon the configuration, dimensions and mass of the electric component. Similarly, the electric components already mounted on a circuit substrate may be displaced or dislocated relative to the circuit substrate or turned over on the circuit substrate, due to the inertia asses of the electric components, if the circuit substrate is moved at excessively high acceleration and deceleration values. Whether the electric components are displaced relative to or turned over on the circuit substrate also depends upon the configuration, dimensions and masses of the electric components. In addition, when the speed of abutting contact of the suction nozzle with the electric component when the suction nozzle holds the electric component by suction is excessively high, the electric component may be broken or damaged by the suction nozzle. Whether the electric component is damaged by the suction nozzle depends upon the strength or rigidity (brittleness and hardness) of the electric component. Thus, the maximum permissible acceleration and deceleration values of the presently required operations of various working devices vary depending upon the configurations, dimensions, mass and strength of the electric component to be mounted on the circuit substrate or those of the electric components already mounted on the circuit substrate. In view of the above, the acceleration and deceleration values of some of the working devices are suitably controlled.

In the electric-component mounting system according to the above mode (1) of this invention, the acceleration and deceleration values of each non-cycle-time determinant working device are suitably lowered so as to reduce the magnitude of the overall vibration of the electric-component mounting system. Even if it is not necessary to lower the acceleration and deceleration values of a given working device in relation to the kind of the electronic component or components, it is desirable to lower the acceleration and deceleration values of that working device, if possible, in relation to the required operating time of the other working device, since the lowering of the acceleration and deceleration values of the working device in question makes it possible to reduce the magnitude of the overall vibration of the system.

In the electric-component mounting system of a type wherein a plurality of mounting heads are turned about a common axis of turning, typical examples of the working devices whose operating amounts are variable as described above include an XY positioning device arranged to move a substrate holding device for holding the circuit substrate, in an XY plane parallel to the circuit substrate. In the electric-component mounting system of a type wherein a mounting head is moved in an XY plane parallel to the circuit substrate, the typical examples of the above-indicated working devices include an XY positioning device arranged to move the mounting head in the XY plane. These XY positioning devices are working devices whose acceleration and deceleration values are also variable.

The required operating time of the working device whose acceleration and deceleration values and/or operating amount is/are variable may vary depending upon the specific operation which is presently required to be performed by that working device. In the electric-component mounting system according to the present invention, most of the selected working devices are working devices of this type. However, the selected working devices may include, for example, a working device whose acceleration and deceleration values and operating amount are not variable but whose required operating time limits the lower limits of the acceleration and deceleration values of the other working devices. Where the acceleration and deceleration values of these other working devices are selected within a range which is determined by the required operating time of the working device whose acceleration and deceleration values and operating amount are not variable, this latter working device does not have a possibility of being determined as the cycle-time-determinant working device, and need not be selected as one of the selected working devices. This latter working device is required to be selected as one of the selected working devices, where the acceleration and deceleration values of each working device are selected within a range which is determined regardless of the required operating times of the other working devices.

Some of the working devices are not required to be the selected working devices. An example of these working devices is a working device the required operating amount and time of which are small and short enough to permit the required operation to be completed within a predetermined period of time, even if the operation is performed at considerably low acceleration and deceleration values. These working devices may be always operated at predetermined constant acceleration and deceleration values that are relatively low, and do not limit the lower limit of the acceleration and deceleration values of the other working devices, so that those working devices need not be included in the selected working devices. The selected working devices do not include working devices which are operated to move a relatively small mass and whose operation does not cause a substantial degree of vibration and whose maximum acceleration and deceleration values are not limited by the specific characteristic or kind of the electric component to be mounted. The acceleration and deceleration values of these working devices need not be controlled and may be held at predetermined low values, so that the these working devices need not be handled as the selected working devices.

Thus, those ones of the plurality of working devices whose acceleration and deceleration values are required to be controlled to reduce the magnitude of the overall vibration of the system are selected as the selected working devices. The selected working devices are working devices which may cause substantial vibrations of the system, and working devices which influence the acceleration and deceleration values or operating speed of those working devices which may cause the substantial vibrations of the system. All of the working devices need not be variable in their acceleration and deceleration values and/or their operating speed. Where the predetermined maximum acceleration and deceleration values or operating speed of the working devices whose acceleration and deceleration values and operating speed are variable are determined so that the presently required operations of the working devices whose operating times are constant can be completed within predetermined periods of time, it is possible to select as the working devices only the working devices which should be controlled to reduce the overall vibration of the system and whose acceleration and deceleration values and operating speed are variable. In this case, the actual acceleration and deceleration values or actual operating speed of each non-cycle-time-determinant working device are determined to be lower than their predetermined maximum values, provided the presently required operation of the non-cycle-time-determinant working device can be completed within the corresponding period of the cycle time determined by the cycle-time-determinant working device. However, the actual acceleration and deceleration values or operating speed of each non-cycle-time-determinant working device are not lowered, if the lowering of the actual acceleration and deceleration values or operating speed (e.g., the selection of acceleration and deceleration values one step lower than the present values) does not permit the presently required operation of the non-cycle-time-determinant working device to be completed within the corresponding period of the cycle time. Where the maximum acceleration and deceleration values or operating speed of the working devices are determined regardless of the required operating times of the other working devices, all of the working devices that should be controlled to reduce the magnitude of the overall vibration of the system are desirably selected as the selected working devices. In this case, the actual acceleration and deceleration values or operating speed of the working devices whose acceleration and deceleration values or operating speed are variable are lowered, provided the presently required operations can be completed within the respective periods of the cycle time determined by the cycle-time-determinant working device. The constant acceleration and deceleration values or operating speed is/are used as the predetermined maximum acceleration and deceleration values or the maximum operating speed.

The "predetermined maximum acceleration and deceleration values or operating speed" used by the determinant-device determining means to calculate the required operating time of each cycle-time-determinant working device or by the slowdown means to determine the actual acceleration and deceleration values or operating speed of each non-cycle-time-determinant working device may be either constant or variable. For some working devices, the permissible maximum acceleration and deceleration values vary depending upon the characteristic or kind (configuration, dimensions, mass, strength, etc.) of the electric component to be mounted or the electric components already mounted on the circuit substrate. The predetermined maximum acceleration and deceleration values or operating speeds of these working devices are variable. Those of the other working devices are constant. Where the permissible maximum acceleration and deceleration values or operating speed is/are variable, the predetermined maximum acceleration and deceleration values or operating speed is/are determined immediately before the moment of initiation of the series of operations to mount the electric component, or during preparation of the component-mounting control program. In the former case, the electric-component mounting system further includes maximum-value determining means for determining the predetermined maximum acceleration and deceleration values or predetermined maximum operating speed of each selected working device.

All of the selected working devices whose operating conditions are variable may be variable in their acceleration and deceleration values or their operating speed. Alternatively, some of those selected working devices are variable in their acceleration and deceleration values, while the other of those working devices are variable in their operating speed. At least one of the selected working devices may be variable in both the acceleration and deceleration values and the operating speed.

The slowdown means is desirably arranged to lower the actual acceleration and deceleration values or operating speed of each non-cycle-time-determinant working device to be the lowest such that the presently required operation of the non-cycle-time-determinant working device can be completed within the corresponding period of the cycle time determined by the cycle-time-determinant working device. However, this arrangement is not essential. That is, the magnitude of the overall vibration of the electric-component mounting system can be reduced by lowering the actual acceleration and deceleration values or operating speed of each non-cycle-time-determinant working device, so as to be lower than the predetermined maximum acceleration and deceleration values or maximum operating speed.

The cycle time of the electric-component mounting system may be determined by only one cycle-time-determinant working device, or by a plurality of cycle-time-determinant working devices. The cycle time is a time required to perform one cycle of operation of the system to mount one electric component on the circuit substrate. All of the selected working devices are not necessarily held operated continuously throughout the cycle time, but are operated for predetermined periods of the cycle time. Some of the selected working devices are operated concurrently with each other, or portions of the operations of some of the selected working devices take place concurrently. Some of the selected working devices are operated while the other selected working devices are not in operation. Where the electric-component mounting system is provided with a head-turning device having a rotary shaft which is continuously rotated to intermittently turn a plurality of mounting heads about a common axis, the rotating speed of the rotary shaft while the mounting heads are turned may be different from that while the mounting heads are held stationary at respective working positions. In this case, the cycle time of the electric-component mounting system may be determined by two cycle-time-determinant working devices, that is, by one of the selected working devices that are operated while the mounting heads are turned, and another of the selected working devices that are operated while the mounting heads are held stationary. Where the electric-component mounting system is provided with a mounting head which is moved in a plane parallel to the component-mounting surface of the circuit substrate, to mount the electric component on the circuit substrate, the mounting system usually includes a plurality of working devices that are operated by respective drive sources, independently of each other. In this case, there is a high possibility that the cycle time of the system is determined by two or more cycle-time-determinant working devices.

The magnitude of the overall vibration of the electric-component mounting system tends to increase with an increase in the acceleration and deceleration values of the working devices, provided the masses of movable members of the working devices and the masses of movable members to be moved by the working devices are constant. Under some conditions, the vibrations generated due to inertial forces of the two or more movable members may be offset by each other, and an increase in the acceleration and deceleration values of the working devices does not necessarily result in an increase in the overall vibration of the system. Usually, however, the overall vibration tends to increase with the acceleration and deceleration values of the working devices. In this respect, the magnitude of the overall vibration of the electric-component mounting system can be effectively reduced by lowering the acceleration and deceleration values of the working devices. On the other hand, an increase in the operating speed of the working devices does not necessarily increase the overall vibration of the system, but tends to increase the overall vibration. This increase of the overall vibration with the operating speed is considered to be derived from a vibration generated due to deterioration of dynamic balance of rotary members, flatness of guide surfaces of linearly movable members and cylindricity of the rotary members when the operating speed of the working devices is relatively high. Accordingly, the magnitude of the overall vibration of the system can be more or less reduced by lowering the operating speed.

A rotary electric motor such as a servomotor or stepping motor is a typical example of the actuator of the working device. However, the actuator may be a linear electric motor, or an air cylinder or other fluid-operated actuator. The linear electric motor may be controlled in the same manner as the rotary electric motor. The fluid-operated actuator such as the air cylinder may be controlled by a control valve device including a solenoid-operated control valve or valves operable to control the fluid flows into and from the actuator.

The required operating time of each selected working device when the presently required operation is performed at the predetermined maximum acceleration and deceleration values or predetermined maximum operating speed may be calculated after the initiation of the component-mounting operation of the system. However, the required operating time may be obtained, if possible, at an appropriate opportunity before the initiation of the component-mounting operation, for instance, during the preparation of the component-mounting control program, or upon setup changeover of the system according to a change in the kind of the circuit substrate. In the electric-component mounting system provided with a head-turning device having a rotary shaft rotated to turn a plurality of mounting heads about a common axis, for instance, the predetermined maximum operating speed of the rotary shaft (or the predetermined maximum acceleration and deceleration values of the turning movement of each mounting head by the head-turning device) is determined by the configuration, dimensions and mass of the electric component to be held by each mounting head, and the predetermined maximum linear acceleration and deceleration values of a circuit-substrate positioning device to move the circuit substrate are determined by the configuration, dimensions and mass of the electric components already mounted on the circuit substrate. Therefore, it is possible to calculate the required operating times of the head-turning device and the circuit-substrate positioning device, on the basis of the predetermined maximum operating speed or predetermined maximum acceleration and deceleration values of the presently required operation.

Examples of the circuit board include: a printed-wiring board having a wiring printed on an electrically insulating substrate on which no electric components have been mounted; a printed-wiring board having a wiring printed on an electrically insulating substrate on which electric components have been mounted at some of predetermined mounting spots; a printed-circuit board wherein electric components have been mounted on and soldered to one of opposite surfaces of a printed-wiring board and electric components are to be mounted on the other surface of the printed-wiring board.

In the electric component mounting system according to the mode (1) of this invention described above, the actual acceleration and deceleration values or the actual operating speed of each non-cycle-time-determinant working device which is not the cycle-time-determinant working device is/are determined to be lower than the predetermined maximum acceleration and deceleration values or predetermined maximum operating speed, so that the magnitude of the vibration of the non-cycle-time-determinant working device upon initiation and termination of the presently required operation can be reduced, making it possible to improve the accuracies with which the mounting head receives the electric component and mounts the electric component on the circuit substrate. Where a plurality of working devices are operated concurrently with each other, and one of the working devices is the cycle-time-determinant working device that determines the cycle time of the system, the actual acceleration and deceleration values or actual operating speed of each non-cycle-time determinant working device is/are determined to be lower than the predetermined maximum acceleration and deceleration values or predetermined maximum operating speed. This arrangement makes it possible to reduce the magnitude of the overall vibration of the system generated by vibrations of the working devices superimposed on each other during the concurrent operations of the working devices. Since the magnitude of vibration of each non-cycle-time-determinant working device is reduced, the total amount of vibration of the system generated within the cycle time can be significantly reduced, even where the operations of some of the non-cycle-time-determinant working devices are operated for respective different periods of the cycle time. Thus, the present electric-component mounting system is arranged to reduce the magnitude of the overall vibration of the system generated during the operations of the individual working devices which are located at different positions and controlled in different manners. Accordingly, the electric components can be mounted on the circuit substrate with significant increased accuracy.

Where the predetermined maximum acceleration and deceleration values or predetermined operating speed of each working device is/are determined depending upon the configuration, dimensions, mass and strength of the electric component to be mounted, the electric-component mounting system can be operated with a reduced magnitude of overall vibration, while effectively preventing the electric component from being displaced or dislocated relative to the mounting head or circuit substrate due to an inertial force, and from being damaged due to an abutting contact of the mounting head (more precisely, a component holder such as a suction nozzle held by the mounting head) with the electric component.

While the object of the present invention is to reduce the magnitude of vibration of the electric-component mounting system, the present electric-component mounting system is also advantageous in that its operating noise is reduced, and in that the required amount of electric energy is generally equalized throughout the cycle time. Further, the present system is significantly improved in its durability. In addition, the reduction of the acceleration and deceleration values of the working devices permits a reduced amount of consumption of electric energy upon acceleration and deceleration of the linear or rotary movement of each non-cycle-time-determinant working device. In this respect, the electric-component mounting system may be arranged primarily to provide the above-indicated advantages rather than to reduce the vibration of the system.

(2) An electric-component mounting system according to the above mode (1), wherein each of at least one of the plurality of selected working devices is operable at a selected one of a plurality of pairs of predetermined acceleration and deceleration values, or at a selected one of a plurality of predetermined operating speeds, and the determinant-device determining means calculates the required operating time of each of the plurality of selected working devices, on the basis of one of the plurality of pairs of predetermined acceleration and deceleration values which is selected as the predetermined maximum acceleration and deceleration values of each selected working device, or one of the plurality of predetermined operating speeds which is selected as the predetermined maximum operating speed of each working device.

The acceleration and deceleration values and/or the operating speed of each selected working devices may be variable continuously, or in a plurality of steps. Generally, the determinant-device determining means is operable with a high degree of accuracy in the former case than in the latter case, but is easily controllable in the latter case than in the former case. The above mode (2) is an example of the latter case.

(3) An electric-component mounting system according to the above mode (1) or (2), wherein each of at least one of the plurality of selected working devices is operable at a selected one of a plurality of pairs of acceleration and deceleration values, or at a selected one of a plurality of operating speeds, and the slowdown means determines the actual acceleration and deceleration values or the actual operating speed of each non-cycle-time-determinant working device, by selecting one of the plurality of pairs of acceleration and deceleration values or one of the plurality of operating speeds.

(4) An electric-component mounting system according to any one of the above modes (1)–(3), further comprising:
  a component-supplying device operable to supply the electric components;
  a circuit-substrate holding device operable to hold the circuit substrate on which the electric components are to be mounted;
  a mounting head operable to receive the electric component from the component-supplying device, and mount the electric component onto the circuit substrate held by the circuit-substrate holding device;
  a head-moving device operable to move the mounting head in a plane intersecting an axis of rotation of the mounting head; and
  a head-rotating device operable to rotate the mounting head about the axis of rotation,
  and wherein the plurality of selected working devices include at least the head-moving device.

For instance, a head-turning device is provided to turn the mounting head about an axis of turning thereof. In this case, the head-turning device may be arranged to turn an indexing body which carries a plurality of mounting heads such that the mounting heads are equiangular spaced from each other along a circle having its center on the axis of rotation of the indexing body. The head-turning device may be arranged to intermittently rotate the indexing body, or rotate the indexing body in opposite directions by desired angles. Where the indexing body is intermittently rotated, the head-turning device includes an intermittently rotating device operable to intermittently rotate the indexing body, for thereby sequentially moving the plurality of mounting heads to a plurality of predetermined working stations or positions which are arranged along a circular path of turning of the mounting heads. The above-indicated component-supplying device and circuit-substrate holding device are provided at respective ones of the working positions. Where the indexing body is relatable in a selected one of the opposite directions by a desired angle, the plurality of mounting heads are moved to a plurality of predetermined working positions by rotary movements of the indexing body by a suitable rotating device. In the two cases described above, the head-moving device is constituted by the head-turning device which is constituted by the indexing body and the rotating device to rotate the indexing body.

The mounting heads may be disposed on respective turnable members which are turnable independently of each other about a common axis of turning. In each cycle of operation of the electric-component mounting system, each turnable member is turned 360° about the common axis of turning by a circular-motion applying device such that the turnable members are successively stopped at each of at least one working position, at a predetermined time interval. Each mounting head is held by the corresponding turnable member such that all of the mounting heads are spaced from the common axis of turning by a predetermined radial distance. In this case, the head-turning device is constituted by the turnable members and the circular-motion applying device.

At least one mounting head may be carried by a movable member which is linearly movable in at least one of two mutually perpendicular directions in a plane, by a suitable moving device. Where the movable member is movable in the two mutually perpendicular directions, each mounting head is movable to any desired position in the above-indicted plane. In this case, the head-moving device is constituted by the movable member and the moving device to move the movable member.

The above-indicated indexing body and the rotating device, or the above-indicated turnable members and the circular-motion applying device may be carried by a movable structure, which is movable along two mutually perpendicular axes in a plane by a movable-structure moving device, as disclosed in JP-A-10-163677. The axis of rotation of the indexing body or the common axis of turning of the turnable members may be either perpendicular to the surface of the circuit substrate held by the circuit-substrate holding device, for instance, may extend in the vertical direction, or inclined with respect to the surface of the circuit substrate, for instance, may be inclined with respect to the vertical direction. In this case, a component-mounting device operable to mount the electric components on the circuit substrate is constituted by the mounting heads, indexing body, rotating device, movable structure and movable-structure moving device, or by the mounting heads, turnable members, circular-motion applying device, movable structure and movable-structure moving device.

The mounting head is considered to include a component holder for directly holding the electric component, or not to include the component holder. In the latter case, the component holder is considered to be attached to a suitable member which is provided on the mounting head to hold the component holder.

Where the head-moving device is constituted by the head-turning device, the circuit-substrate holding device may be moved by an XY positioning device, in an XY plane parallel to the surface of the circuit substrate held by the circuit-substrate holding device, as in the electric-component mounting system according to a mode (12) of this invention described below. In this case, the circuit substrate is movable in mutually perpendicular X-axis and Y-axis directions in the XY plane. The component-supplying device may include a component supply table which is moved by a table-positioning device, as in the electric-component mounting system according to a mode (10) of this invention described below.

Where the head-moving device includes the above-indicated movable structure and movable-structure moving device and the mounting head is movable along the two mutually perpendicular axes in a plane, the circuit-substrate holding device and the component-supplying device are fixedly disposed. Where the mounting head is movable along one of the two mutually perpendicular axes, the circuit-substrate holding device is movable along the other axis, that is, in a direction perpendicular to the direction of movement of the mounting head. Like the circuit-substrate holding device, the component-supplying device is either movable to supply the electric components, or stationary at a fixed position at which the mounting head is supplied with the electric components.

Where the head-moving device includes the above-indicated indexing body, rotating device, movable structure and movable-structure moving device, or the above-indicated turnable members, circular-motion applying device, movable structure and movable-structure moving device, the circuit-substrate holding device and the component-supplying device are fixedly disposed.

The component-supplying device may include, for instance, a component supply table including a plurality of component feeders and a feeder carriage on which the component feeders are mounted such that component-supply portions of the component feeders are arranged along a line. The component feeders accommodate respective groups of electric components of different kinds. Each component feeder may include a tape feeding device operable to feed a carrier tape which accommodates a succession of electric components such that the electric components are fed to the component-supply portion one after another. Alternatively, each component feeder may be arranged to feed a succession of the electric components by oscillation, a ramp way, an air stream or a belt conveyor, or a combination thereof, such that the electric components are fed to the component-supply portion one after another. In either of the two cases described above, each component feeder includes a feeding device for feeding the electric components to the component-supply portion, and a container accommodating the electric components.

Where the component supply table of the component-supplying device is movable to supply the electric components, the component supply table is moved by a suitable table-positioning device in a direction of arrangement of the component-supply portions of the component feeders, so that a selected one of the component feeders is located at a predetermined component-supplying position. In this case, the table-positioning device is considered to also function as a device for moving the component-supplying device. The line along which the component-supply portions of the component feeders are arranged may be a straight line or a line other than the straight line, such as a circle, a circular arc (a part of a circle), a curve other than the circular arc, and a line which is a combination of those non-straight lines. Where the component supply table is movable, the feeding devices and containers of the component feeders may be disposed on a common feeder carriage so that the feeding devices and the containers are moved together when the common feeder carriage is moved. Alternatively, the sets of feeding devices and containers of the component feeders may be disposed on respective feeder carriages. In the latter case, the feeding device and container of each component feeder may be disposed on respective separate feeder carriages and moved independently of each other, or the container may be fixedly disposed.

The component-supplying device may be of a tray type arranged to supply the electric components from a storage tray. The tray has a multiplicity of component-accommodating recesses for accommodating the respective electric components.

The head-rotating device is arranged to rotate the mounting head about its axis, for achieving a specific purpose, for instance, for rectifying an angular positioning error of the electric component as held by the mounting head, or for changing the angular position of the electric component from a component-receiving angular position to a component-mounting angular position, as described below with respect to the following mode (5).

The mounting head tends to have a comparatively large mass, and is relatively frequently required to be moved by a comparatively large distance. In this respect, the head-moving device is desirably selected as one of the selected working devices.

(5) An electric-component mounting system according to the above mode (4), wherein the plurality of selected working devices include the head-rotating device.

The slowdown means is effective to reduce the magnitude of the overall vibration of the system, even where the slowdown means lowers the actual acceleration and deceleration values or operating speed of the head-rotating device when the mounting head is rotated by the head-rotating device to rectify the angular positioning error of the electric component relative to the mounting head. However, the slow down means is effective to reduce the magnitude of the overall vibration, particularly when the mounting head is rotated by the head-rotating device to change the angular position of the electric component from the component-receiving angular position (in which the electric component is held by the mounting head) to the component-mounting angular position (in which the electric component is transferred from the mounting head onto the circuit substrate), since the angle of rotation of the mounting head from the component-receiving angular position to the component-mounting angular position is usually considerably large.

(6) An electric-component mounting system according to the above mode (4) or (5), wherein the plurality of selected working devices include an axially moving device operable to axially move the mounting head.

The mounting head receives the electric component during a terminal portion of its axial movement toward the component-supplying device, and mounts the electric component on the circuit substrate during a terminal portion of its axial movement toward the component-mounting surface of the circuit substrate. To prevent damaging of the electric component or the component holder, and a failure to receive or mount the electric component, and to improve the positioning accuracy of the electric component as mounted on the circuit substrate, it is effective to select the axially moving device for the mounting head, as one of the selected working devices.

(7) An electric-component mounting system according to any one of the above modes (4)–(6), wherein the component-supplying device includes a component supply table including a plurality of component feeders, and a feeder carriage on which the plurality of component feeders are mounted such that component-supply portions of the component feeders are arranged along a line, the component feeders accommodating respective groups of electric components of different kinds and operable to supply the electric components of different kinds from the component-supply portions thereof.

(8) An electric-component mounting system according to any one of the above modes (4)–(7), wherein the head-moving device includes a head-turning device operable to turn the mounting head about an axis of turning, to sequentially move the mounting head to a plurality of working positions including a component-receiving position at which the mounting head receives the electric component from the component-supplying device, and a component-mounting position at which the mounting head transfers the electric component onto the circuit substrate held by the circuit-substrate holding, device.

The electric-component mounting system according to the above mode (8) is generally capable of mounting the electric components with comparatively high efficiency. In this case, a plurality of mounting heads are usually provided such that these mounting heads are concurrently and intermittently turned about a common axis of turning by the head-turning device, in an intermittent at predetermined acceleration and deceleration values. In this respect, the selection of the head-turning device as one of the selected working devices is desirable to reduce the overall vibration of the system. The head-turning device usually include a motion-converting device operable to change a rotary motion of a rotary shaft at a constant speed into an intermittent rotary motion to turn the mounting heads about the common axis of turning. The converting device may be a roller-gear cam device or other cam device, or a Geneva gear device. Further, the rotary motion of the rotary shaft which is driven by a suitable drive source is usually utilized by the other working devices, that is, converted by other motion-converting devices such as cam devices into motions of the other working devices, in view of a difficulty of electrically controlling the working devices so as to be operated in synchronization with each other, and in view of desirability to mechanically synchronize the operations of the working devices with each other, where the electric-component mounting system is operated at a comparatively high speed. Accordingly, the required operating time of the electric-component mounting system, that is, the cycle time of the system is determined by the required operating speed of the head-turning device in most cases. In this sense, the following mode (19) is one of particularly practical embodiments of the present invention.

(9) An electric-component mounting system according to the above mode (8), wherein the determinant-device determining means determines, as the cycle-time-determinant working device, each of the plurality of selected working devices except the head-turning device, the required operating time of which is longer than a corresponding portion of the required operating time of the head-turning device.

The head-turning device usually include a motion-converting device operable to change a rotary motion of a rotary shaft at a constant speed into an intermittent rotary motion to turn the mounting heads about the common axis of turning. In this arrangement, the rotary shaft is kept rotated even while the mounting heads are stopped at the respective working positions. In other words, the head-turning device is considered to be continuously operated even while the mounting heads are stationary. Accordingly, all of the selected working devices except the head-turning device are considered to be operated concurrently with any portions of the continuous operation of the head-turning device. The presently required operation of each of those selected working devices must be completed within a time period during which the rotary shaft is rotated from a first angular position $\theta 1$ to a second angular position $\theta 2$, for example. Thus, the presently required operation of each of those selected working devices has specific restrictions in its operating period and speed. If the presently required operation of a given selected working device cannot be completed while the rotary shaft is rotated from the first angular position $\theta 1$ to the second angular position $\theta 2$, this selected working device determines the cycle time of the system, and is therefore determined as the cycle-time-determinant working device. Where the presently required operations of two or more of the selected working devices except the head-turning device cannot be completed while the rotary shaft is rotated from the first angular position $\theta 1$ to the second angular position $\theta 2$, the determinant-device determining means determines as the cycle-time-determinant working device one of those two or more selected working devices, the required operating time of which is longer than the corresponding portion of the required operating time of the head-turning device by the largest time difference.

While the rotary shaft of the head-turning device is supposed to be rotated at a constant speed, for simplification of the explanation, the rotating speed of the rotary shaft may be actually changed during the 360°-turning of the mounting head about the axis of turning. For instance, the rotary shaft is rotated at different speeds when the mounting head is turning and when the mounting head is stationary, as disclosed in copending U.S. patent application Ser. No. 10/025802. In this case, the required operating time of each selected working device when the rotating speed of the rotary shaft is relatively high or low can be calculated on the basis of the rotating speed of the rotary shaft, and the calculated required operating time is compared with the corresponding portion of the required rotating time of the rotary shaft as calculated when the rotary shaft is rotated at the corresponding high or low rotating speed.

(10) An electric-component mounting system according to any one of the above modes (7)–(9), wherein the plurality of selected working devices include a table-positioning device operable to move the component supply table along a line.

The component supply table usually has a relatively large mass. In this respect, the slowdown means is effective to reduce the overall vibration of the system, in the electric-component mounting device according to the above mode (9) wherein the selected working devices include the table-positioning device for moving the component supply table.

(11) An electric-component mounting system according to any one of the above modes (4)–(7), wherein the head-moving device includes an XY positioning device operable to move the mounting head in mutually perpendicular X-axis and Y-axis directions in an XY plane parallel to a surface of the circuit substrate as held by the circuit-substrate holding device.

In the electric-component mounting system according to the above mode (11) wherein the head-moving device includes the XY positioning device, the mounting head tends to have a relatively large distance of movement in the XY plane. In this respect, the slowdown means is effective to reduce the overall vibration of the system in this mounting system wherein the selected working devices includes the head-moving device which includes the XY positioning device.

(12) An electric-component mounting system according to any one of the above modes (4)–(10), wherein the plurality of selected working devices include an XY positioning device operable to move the circuit-substrate holding device in mutually perpendicular X-axis and Y-axis directions in an XY plane parallel to a surface of the circuit substrate as held by the circuit-substrate holding device.

The circuit-substrate holding device and movable members of the XY positioning device for the circuit-substrate holding device tend to have relatively large masses. In this respect, the slowdown means is effective to reduce the overall vibration in the mounting system according to the above mode (12) wherein the selected working devices includes the XY positioning device for moving the circuit-substrate holding device.

(13) An electric-component mounting system according to any one of the above modes (4)–(12), wherein the mounting head has a plurality of component holders for holding the respective electric components, and the plurality of selected working devices include a component-holder selecting device operable to place a selected one of the component holders in an operating position thereof.

Where the mounting head has a relatively large number of component holders, the component-holder selecting device tends to have a relatively large amount of operation. In this respect, the slowdown means is effective to reduce the overall vibration in the system according to the above mode (13) wherein the selected working devices include the component-holder selecting device.

(14) An electric-component mounting system according to any one of the above modes (4)–(13), wherein the plurality of selected working devices include a Z-axis positioning device operable to move the circuit-substrate holding device in a Z-axis direction substantially perpendicular to a surface of the circuit substrate as held by the circuit-substrate holding device.

(15) An electric-component mounting system according to any one of the above modes (4)–(14), wherein the plurality of selected working devices include at least one of a first stroke-end changing device operable to change one of opposite ends of an axial operating stroke of the mounting head at a component-receiving position at which the mounting head receives the electric component, the above-indicated one of the opposite ends being located on the side of the component-supplying device; and a second stroke-end changing device operable to change one of opposite ends of an axial operating stroke of the mounting head at a component-mounting position at which the mounting head mounts the electric component on the circuit substrate, the above-indicated one of the opposite ends of the axial operating stroke at the component-mounting position being located on the side of the circuit substrate.

(16) An electric-component mounting system operable to mount electric components on a circuit substrate and including a common main body, and a plurality of working devices which are disposed on the common main body and each of which has an actuator that is variable in acceleration and deceleration values and/or an operating speed thereof, comprising:

determinant-device determining means operable with respect to presently required operations of a plurality of selected working devices selected from the plurality of working devices, the determinant-device determining means determining, as a cycle-time-determinant working device, each of at least one of the selected working devices which determines a cycle time of the electric-component mounting system such that the cycle time is determined on the basis of a required operating time of each cycle-time-determinant working device as calculated when the presently required operation of the cycle-time-determinant working device is performed a predetermined maximum acceleration and deceleration values or a predetermined maximum operating speed; and at least one of (a) slowdown means for determining actual acceleration and deceleration values or an actual operating speed of each of at least one of non-cycle-time-determinant working devices which are the plurality of selected working devices except each cycle-time-determinant working device, the slowdown means determining the actual acceleration and deceleration values or the actual operating speed of each non-cycle-time-determinant working device, so as to be lower than predetermined maximum acceleration and deceleration values or a predetermined maximum operating speed thereof, such that the presently required operation of each non-cycle-time-determinant working device can be completed within a corresponding period of the cycle time determined by each cycle-time-determinant working device, and (b) operation-delaying means for delaying a moment of initiation of a presently required operation of each of at least one of the non-cycle-time-determinant working devices, the operation-delaying means delaying the moment of initiation of the presently required operation of said each of at least one of non-cycle-time-determinant working devices such that the presently required operation of each non-cycle-time-determinant working device can be completed within a corresponding period of the cycle time determined by each cycle-time-determinant working device.

The operation of the operation-delaying means of "delaying a moment of initiation of a presently required operation of each of at least one of non-cycle-time-determinant working devices" is interpreted to mean that the moment of initiation of the presently required operation is delayed with respect to a nominal moment of initiation of the presently required operation, that is, with respect to the moment at which the presently required operation can be initiated. Although each non-cycle-time-determinant working device whose moment of initiation of operation is delayed by the operation-delaying means is usually operated at the predetermined maximum acceleration and deceleration values or the predetermined maximum operating speed, the acceleration and deceleration values or the operating speed of this non-cycle-time-determinant working device may be lowered by the slowdown means to be lower than its predetermined maximum acceleration and deceleration values or its predetermined maximum operating speed. Where the moment of initiation of the presently required operation of the non-cycle-time-determinant working device is delayed, the presently required operation must be completed within the corresponding period of the cycle time determined by each cycle-time-determinant working device.

The magnitude of the overall vibration of the electric-component mounting system can be generally reduced by delaying the moment of initiation of the presently required operation of at least one non-cycle-time-determinant working device. Like the slowdown means, the operation-delaying means is effective also to reduce the operating noise and equalize the required amount of consumption of electric energy throughout the cycle time.

(17) An electric-component mounting system operable to mount electric components on a circuit substrate and including a common main body, and a plurality of working devices which are disposed on the common main body and each of which has an actuator that is variable in acceleration and deceleration values and/or an operating speed thereof, comprising:

determinant-device determining means operable with respect to presently required operations of a plurality of selected working devices selected from the plurality of working devices, the determinant-device determining means determining, as a cycle-time-determinant working device, each of at least one of the selected working devices which determines a cycle time of the electric-component mounting system such that the cycle time is determined on the basis of a required operating time of the cycle-time-determinant working device where the presently required operation of each cycle-time-determinant working device is performed at predetermined maximum acceleration and deceleration values or a predetermined maximum operating speed thereof; and operation-delaying means for delaying a moment of initiation of a presently required operation of each of at least one of non-cycle-time-determinant working devices which are the plurality of selected working devices except each cycle-time-determinant working device, the operation-delaying means delaying said moment of initiation of the presently required operation of each of at least one of the non-cycle-time-determinant working devices with respect to a moment of initiation of each cycle-time-determinant working device such that the presently required operation of each non-cycle-time-determinant working device can be completed within a corresponding period of the cycle time determined by each cycle-time-determinant working device.

(18) An electric-component mounting system according to the above mode (16) or (17), wherein the operating-delaying means delays the moments of initiation of the presently required operations of at least two of the non-cycle-time-determinant working devices with respect to the moment of initiation of each cycle-time-determinant working device such that the presently required operations of the above-indicated at least two non-cycle-time-determinant working devices are initiated at different times.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 9 is a plan view schematically showing two imaging-taking systems respectively disposed at a component-hold-position detecting position and a mounting-surface detecting position, which are further ones of the working positions;

FIG. 10 is a block diagram showing elements of a control device of the electronic-component mounting system, which elements relate to the present invention;

FIG. 11 is a view schematically illustrating an arrangement of motors used as drive sources of a plurality of working devices provided in the electronic-component mounting system;

FIG. 12 is a time chart for explaining operating timings of the plurality of working devices;

FIG. 13 is a view for explaining acceleration and deceleration values set for the respective working devices;

FIG. 23 is a time chart for explaining operating timings of a plurality of working devices provided in the electronic-component mounting system of FIG. 17; and FIG. 24 is a graph for explaining a manner in which the acceleration and deceleration values of a head elevating and lower device, and X-axis and Y-axis positioning devices, which are provided in the electronic-component mounting system of FIG. 17.

DETAILED DESCRIPTION OF THE PREFERRED EMBODIMENTS

Figure 1:
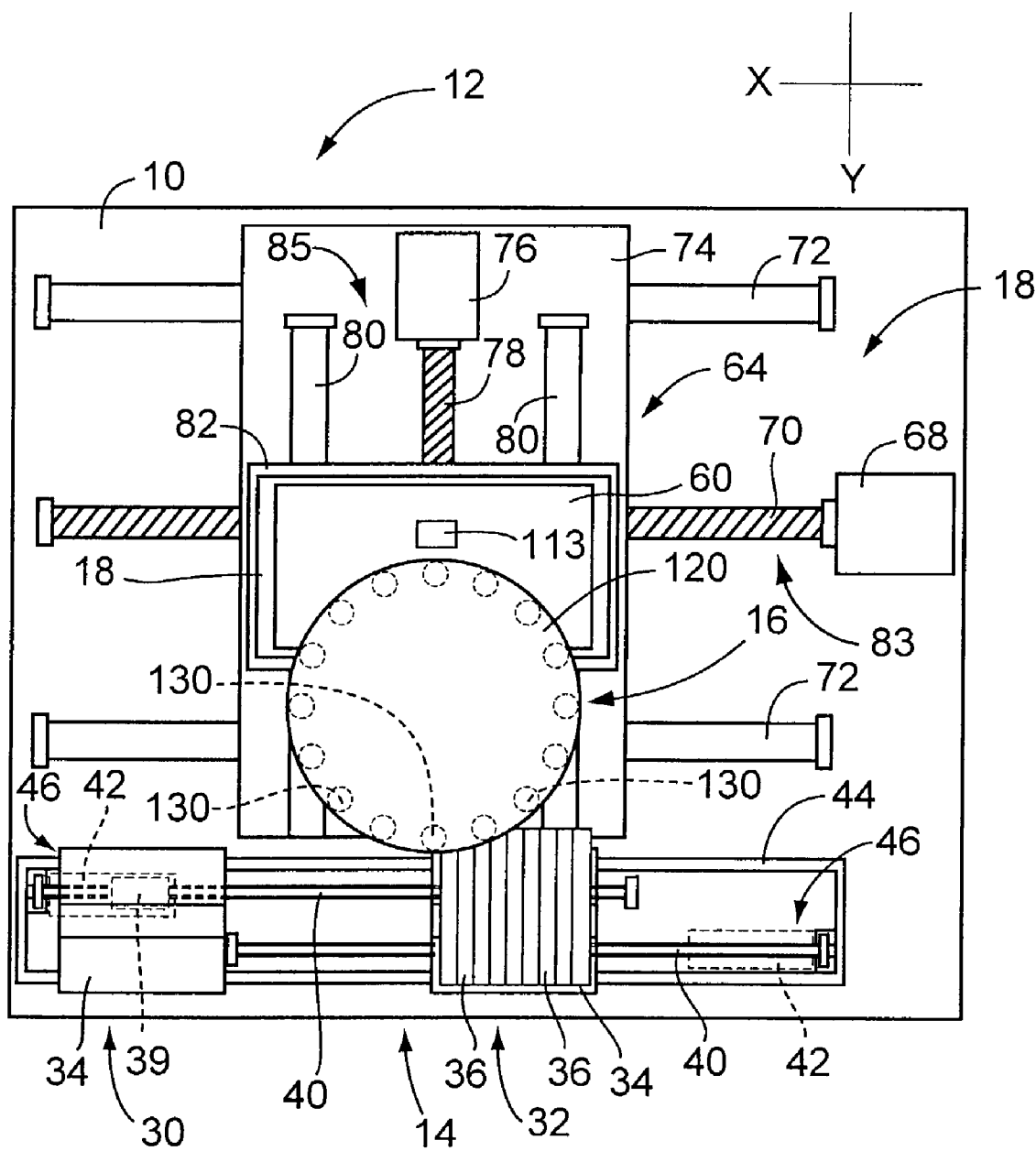
FIG. 1 is a plan view schematically showing an electronic-component mounting system constructed according to one embodiment of this invention.

Referring first to FIG. 1, there is shown an electric-component mounting system in the form of an electronic-component mounting system 12, which has a main body in the form of a machine base 10. On this machine base 10, there are disposed a component-supplying device 14, a component-mounting device 16 and a substrate-holding device in the form of a printed-wiring-board holding device 18. These devices 14, 16, 18 are provided on the common machine base 10. The present electronic-component mounting system 12 is constructed as disclosed in JP-A-6-342998 and co-pending U.S. patent application Ser. No. 08/863,431.

Figure 2:
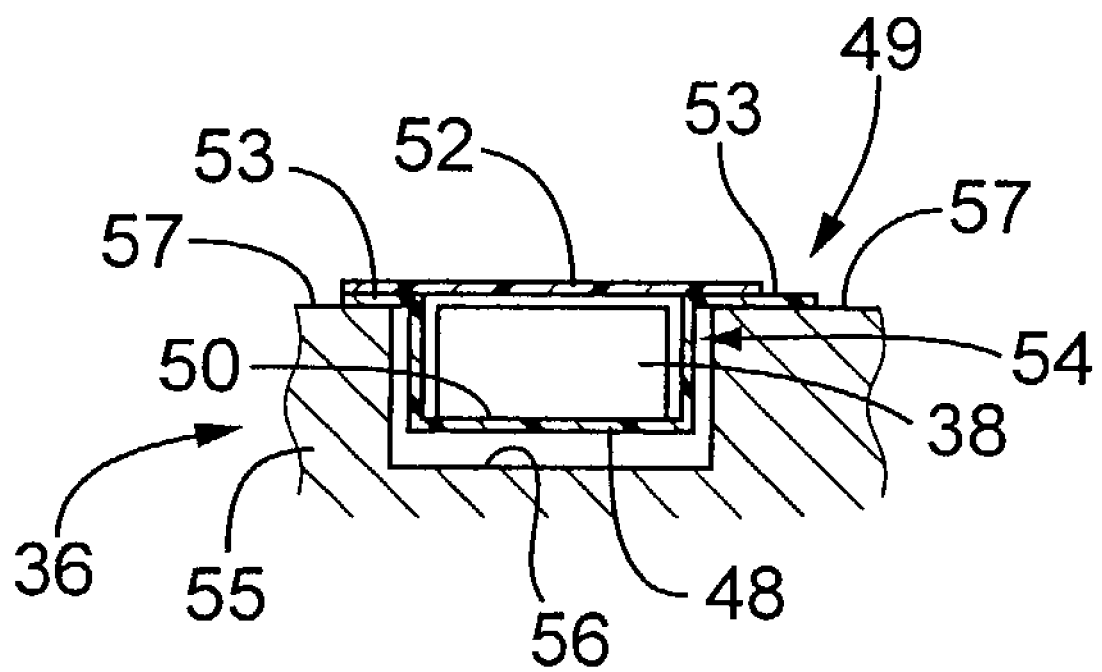
FIG. 2 is a front elevational view of a tape feeder of a component-supplying device of the electronic-component mounting system of FIG. 1, which tape feeder is arranged to feed a carrier tape carrying electronic components.

The component-supplying device 14 has two component supply tables 30, 32. However, the component-supplying device 14 may include at least one component supply table. Each of the two component supply tables 30, 32 has a feeder carriage 34 and a plurality of component feeders in the form of tape feeders 36 mounted on the feeder carriage 34. The tape feeders 36 are arranged to feed respective carrier tapes 49, one of which is shown in FIG. 2. The carrier tapes 49 to be fed by the respective tape feeders 36 accommodate respective batches of electronic components 38 of different kinds.

Each carrier tape 49 includes a substrate 48 having a multiplicity of component-accommodating recesses 50, one of which is shown in FIG. 2. The recesses 50 are formed in the substrate 48 such that the recesses 50 are spaced apart from each other in the longitudinal direction of the substrate 48. The recesses 50 accommodate the respective electronic components 38, and the openings of the recesses 50 are closed by a covering tape 52 bonded to the substrate 48.

The substrate 48 of the carrier tape 49 used in the present embodiment has a component-accommodating portion 54 extending in its longitudinal direction, and a pair of parallel sliding portions 53 formed at respective opposite lateral ends of the component-accommodating portion 54 such that the parallel sliding portions 53 extend in the longitudinal direction of the component-accommodating portion 54. The plurality of component-accommodating recesses 50 are formed in the component-accommodating portion 54 such that the recesses 50 are equally spaced apart from each other in the longitudinal direction of the portion 54. The carrier tape 49 is of a so-called "embossed type" in which the recesses 50 are formed by embossing and the component-accommodating portion 54 is fitted in a groove 56 formed in a feeder body 55 of the feeder carriage 34 such that the carrier tape 49 is supported at its sliding portions 53 by the upper surface of the feeder body 55 in which the groove 56 is open. Described more specifically, the upper surface of the feeder body 55 has a pair of tape-supporting areas 57 provided adjacent to the respective opposite widthwise ends of the groove 56, so that the sliding portions 53 slide on the respective tape-supporting areas 57 while the bottom wall of the component-accommodating portion 54 which accommodates the electronic components 38 is spaced apart from the bottom surface of the groove 56. The groove 56 is formed so as to receive different carrier tapes 49 which accommodate respective batches of electronic components 38 of different kinds having respective different height dimensions. The covering tape 52 and the upper surfaces of the electronic components 38 accommodated in the recesses 50 are substantially flush with the tape-supporting areas 57 (upper surface of the feeder body 56), irrespective of the height dimension of the electronic components 38 accommodated in the recesses 50.

The substrate 48 is fed by a tape feeding device (not shown), while the covering tape 52 is removed from the substrate 48, so that the electronic components 38 are successively moved to the component-supply portion of the tape feeder 36, from which the electronic components 38 are picked up one after another by a suction nozzle 190 (which will be described). The plurality of tape feeders 36 are removably mounted on the feeder carriage 34 such that the component-supply portions of the tape feeders 36 are arranged along a horizontally extending straight line, that is, in an X-axis direction (right and left direction as seen in FIG. 1).

To the feeder carriage 34 of each component supply table 30, 32, there is fixed a ballnut 39 which engages a ballscrew 40. The ballscrews 40 of the component supply tables 30, 32 are rotated by respective table drive motors 42. Each component supply table 30, 32 is moved in the X-axis direction while being guided by a guiding device including a guide rail 44, when the ballscrew 40 is rotated by the table drive motor 42. Thus, the selected tape feeders 36 can be moved to a predetermined component-supplying position of the component-supplying device 14. The ballscrew 40 and the table drive motor 42 constitute a major part of a table-positioning device 46 operable to position each component supply table 30, 32. Thus, the two component supply tables 30, 32 can be moved by the respective table-positioning devices 46, independently of each other, and are guided by the common guide rail 44. The two component supply tables 30, 32 are operated in a known manner as disclosed in JP-A-8-21791, to supply the electronic components 38. In FIG. 1, the tape feeders 36 of the component supply table 30 are not shown, while the ballnut 39 of the component supply table 32 is not shown.

The printed-wiring-board holding device 18 (hereinafter referred to as "PWB holding device") is provided to hold the circuit substrate in the form of the printed-wiring board 60, and is moved or positioned by an XY positioning device 64. The XY positioning device 64 includes an X-axis slide 74 and a Y-axis slide 82. The X-axis slide 74 is moved in the X-axis direction by an X-axis drive motor 68 through a feedscrew in the form of a ballscrew 70 while being guided by two guide rails 72, while the Y-axis slide 82 is moved in a Y-axis direction by a Y-axis drive motor 76 through a feedscrew in the form of a ballscrew 78 while being guided by two guide rails 80. It will be understood that the X-axis drive motor 68 and the ballscrew 70 constitute an X-axis positioning device 83, while the Y-axis drive motor 76 and the ballscrew 78 constitute a Y-axis positioning device 85.

The Y-axis slide 82 supports the PWB holding device 18, which holds the printed-wiring board 60 such that a component-mounting surface 84 (shown in FIG. 3) of the board 60 is held parallel to a horizontal plane, which is an XY plane defined by the mutually perpendicular X-axis and Y-axis directions as indicated by in FIG. 1.

Figure 3:
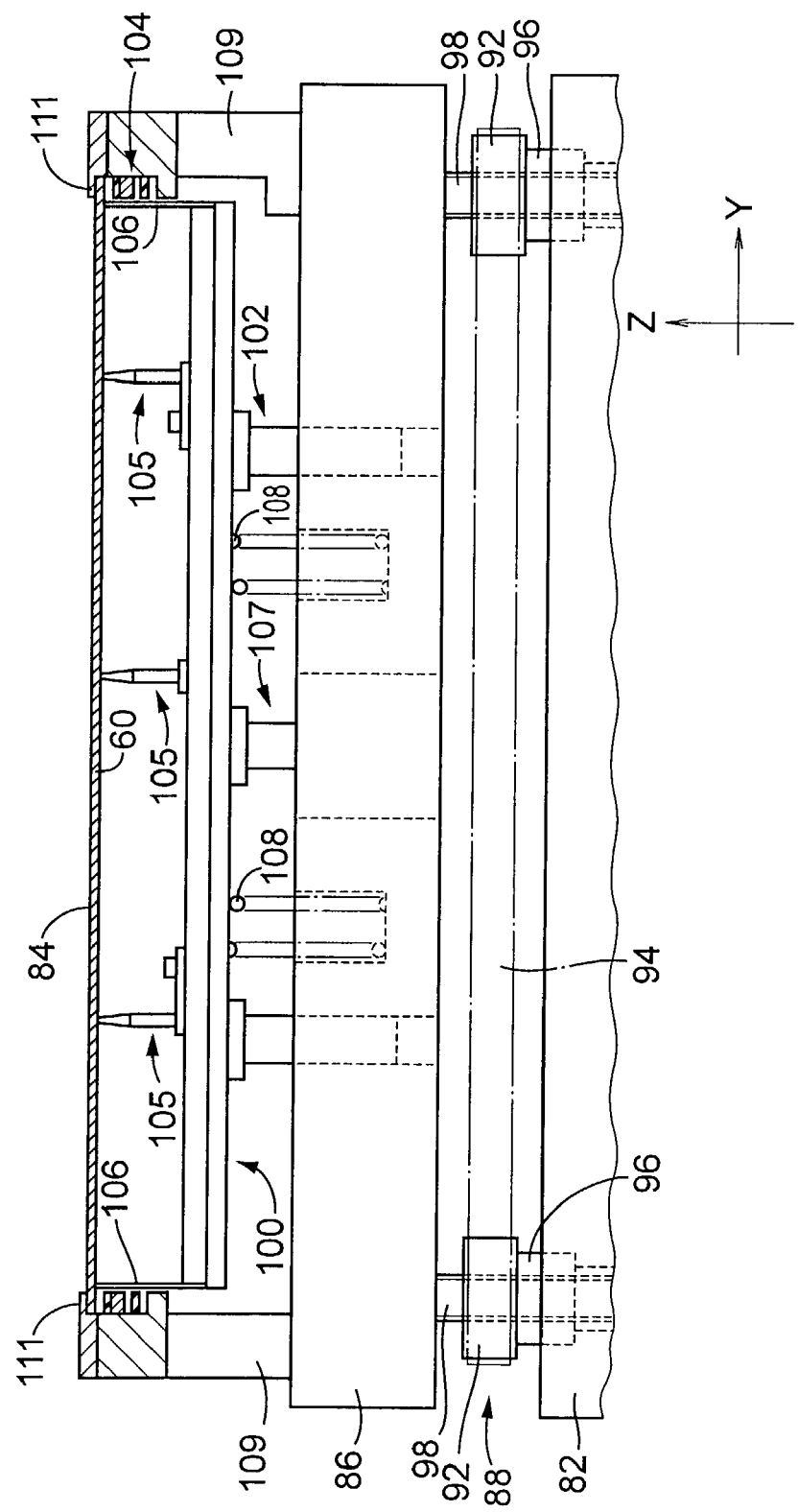
FIG. 3 is a side elevational view partly in cross section showing a printed-wiring-board holding device of the electric-component mounting system.

As shown in FIG. 3, a Z-axis slide 86 is mounted on the Y-axis slide 82, such that the Z-axis slide 86 is movable in a Z-axis direction or vertical direction perpendicular to the component-mounting surface 84 of the printed-wiring board 60 as held by the PWB holding device 18. The Z-axis slide 86 is elevated and lowered by a Z-axis positioning device 88, which includes a Z-axis drive motor 90 (shown in FIG. 10) as a drive source. A plurality of ballnuts 96 are supported by the Y-axis slide 82 such that the ballnuts 96 are rotatable about their vertical axes relative to the Y-axis slide 82 but are not axially movable relative to the Y-axis slide 82. A rotary motion of the Z-axis drive motor 90 is transmitted to the ballnuts 96 through a plurality of timing pulleys 92 and a timing belt 94. The ballnuts 96 are held in engagement with respective feedscrews in the form of ballscrews 98 fixed to the Z-axis slide 86 so as to extend in the vertical direction. The Z-axis slide 86 is movable in the Z-axis direction when the ballnuts 86 are simultaneously rotated by the Z-axis drive motor 90.

On the Z-axis slide 86, there are mounted a circuit-substrate supporting device in the form of printed-wiring-board supporting device (PWB supporting device) 100, an elevating and lowering device 102 operable to vertically the PWB supporting device 100, and a printed-wiring-board conveyor (PWB conveyor) 104 operable to feed the printed-wiring board 60. The PWB supporting device 100 is constructed as disclosed in JP-A-11-195899, and has a plurality of support members 105 and a pair of clamping members 106.

As shown in FIG. 3, the elevating and lowering device 102 includes an air cylinder 107, and elastic members in the form of springs 108 serving as a biasing device. In the present embodiment, the Z-axis slide 86 functions as a main body of the PWB holding device 18, and cooperates with the PWB supporting device 100 to constitute the PWB holding device 18, while the Z-axis positioning device 88 functions as a substrate-Z-axis positioning device in the form of a printed-wiring-board elevating and lowering device operable to position the printed-wiring board 60 in the Z-axis or vertical direction.

With a vertical movement of the Z-axis slide 86, the PWB supporting device 100 and the PWB conveyor 104 are moved in the Z-axis direction to a predetermined board-loading/unloading position at which the printed-wiring board 60 is moved by a board loading device (not shown) onto the PWB conveyor 104, and moved from the PWB conveyor 104 onto a board unloading device (not shown). The PWB supporting device 100 is elevated by the elevating and lowering device 102 so that the printed-wiring board 60 placed on the PWB conveyor 104 is supported by the support members 105 of the PWB supporting device 100. The PWB conveyor 104 is provided with a pair of guide rails 109 which have respective retainer portions 111. The clamping members 106 cooperate with the retainer portions 111 to clamp the printed-wiring board 60.

When the electronic components 38 are mounted on the printed-wiring board 60, the Z-axis slide 86 is lowered to lower the printed-wiring board 60 from the above-indicated board-loading/unloading position down to a predetermined component-mounting position at which the PWB holding device 18 is positioned by the XY positioning device 64 in the XY plane, that is, in the horizontal plane parallel to the component-mounting surface 84 of the board 60, when each electronic component 38 is mounted at a predetermined spot on the component-mounting surface 84. Namely, the component-mounting surface 84 has a plurality of component-mounting spots at which the respective electronic components 38 are mounted, such that the component-mounting spots are sequentially located at a predetermined component-mounting position of the component-mounting device 16, by horizontal movements of the PWB holding device 18.

While an operation to mount each electronic component 38 on the printed-wiring board 60 is performed with the board 60 located at the component-mounting position, the height of the board 60 (height of the component-mounting surface 84) is adjusted by a movement of the Z-axis slide 86 in the Z-axis direction, depending upon the height dimension of the electronic component 38.

Two fiducial marks (not shown) are provided on the component-mounting surface 84 of the printed-wiring board 60. Images of these fiducial marks on the board 60 as held by the PWB holding device 18 are taken by a fiducial-mark camera 113, which is held stationary, as shown in FIG. 1. In the present embodiment, the fiducial-mark camera 113 is a CCD camera including a matrix of CCDs (charge-coupled devices or elements) and a lens system. The CCD camera is capable of taking a two-dimensional image of an object at one time. An illuminating device is provided to illuminate the object (fiducial marks) and its vicinity when the image of the object is taken by the fiducial-mark camera 113.

Figure 4:
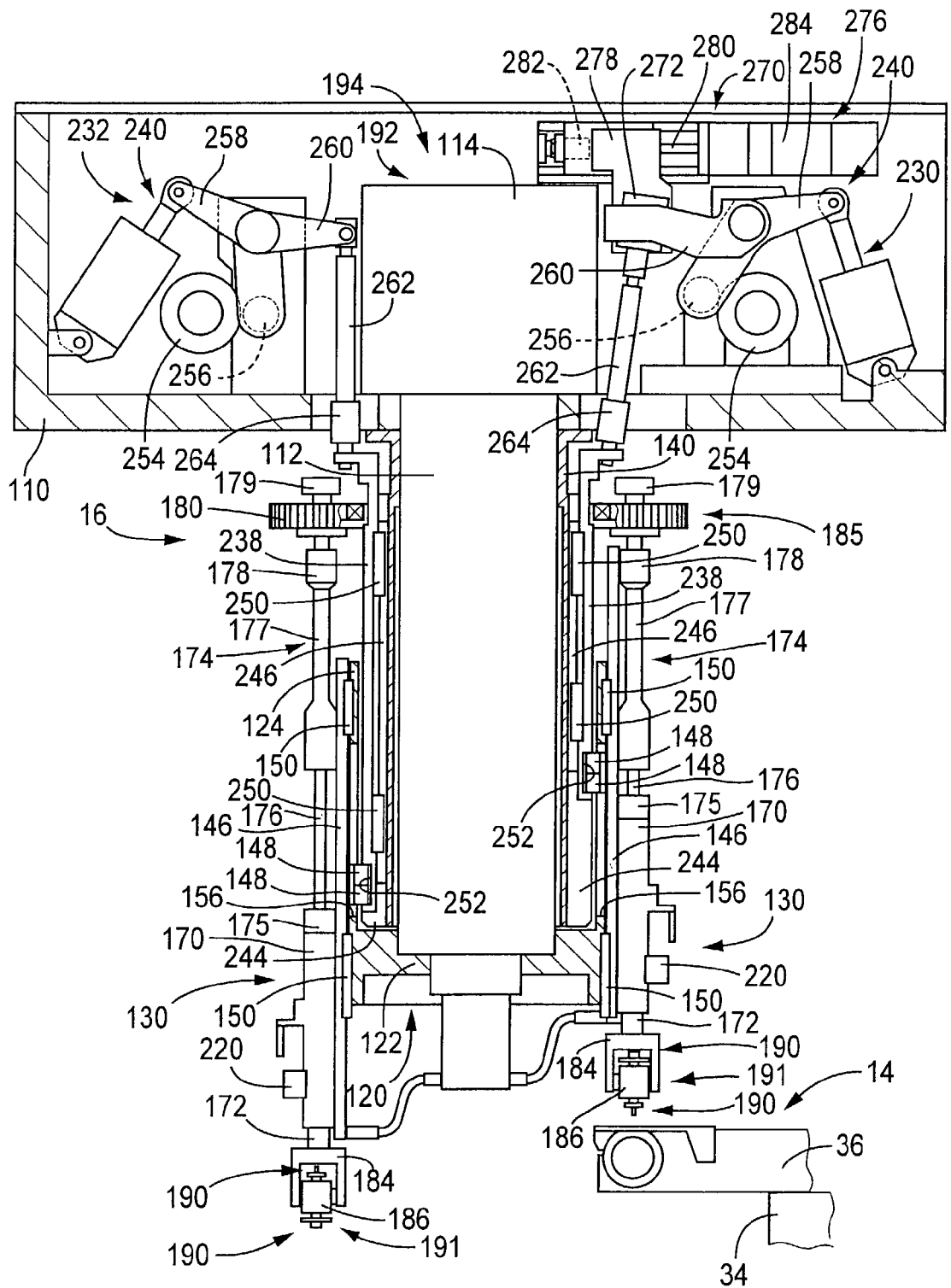
FIG. 4 is a side elevational view partly in cross section showing a component-mounting device of the electronic-component mounting system.

Referring next to FIGS. 4–9, there will be described the component-mounting device 16. In FIG. 4, reference sign 110 denotes a frame provided on the machine base 10. The frame 110 supports a rotary shaft 112 such that the rotary shaft 112 is rotatable about a vertical axis by a rotary drive device 114, which includes a roller gear and a roller-gear cam. When the roller-gear cam is rotated in one direction by a rotary drive motor 116 (shown in FIG. 10) at a predetermined constant speed, a plurality of rollers of the roller gear are sequentially brought into rolling engagement with a cam rib of the roller-gear cam, so that the rotary shaft 112 is intermittently rotated about the vertical axis, by a predetermined angle for each intermittent rotary motion.

A rotating member in the form of an indexing body 120 is fixed to the lower end portion of the rotary shaft 112 which extends downwardly from the frame 110. The indexing body 120 is a generally cylindrical member which is closed at one of its opposite axial ends and open at the other axial end. The indexing body 120 includes a bottom portion 122 at which the indexing body 120 is fixed to the rotary shaft 112, and a cylindrical portion 124 which extends from the bottom portion 122 toward the frame 110. The cylindrical portion 124 carries sixteen mounting heads 130 equiangularly arranged in its circumferential direction.

Figure 5:
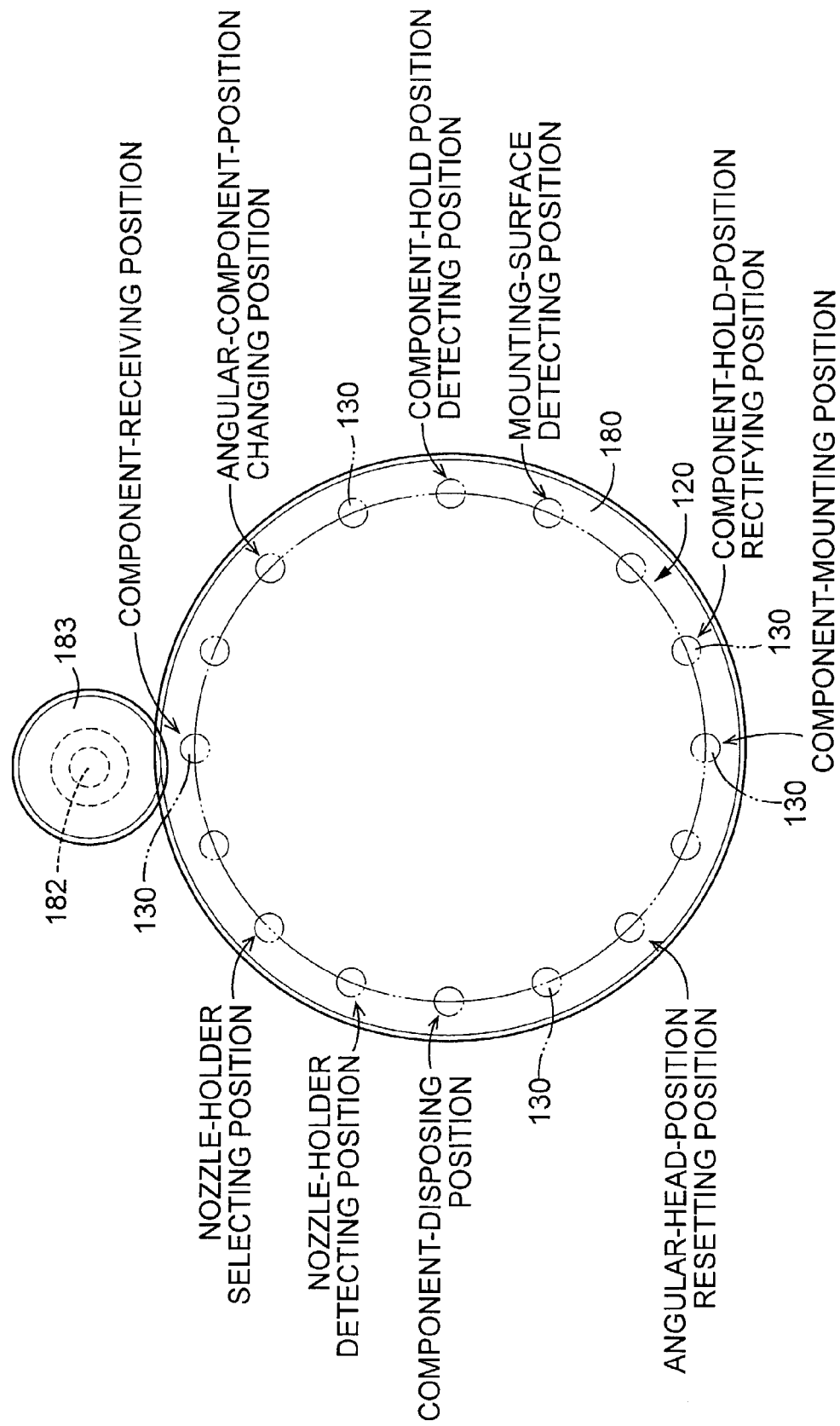
FIG. 5 is a view for explaining working positions of each mounting head of the component-mounting device.

When the rotary shaft is intermittently rotated by the rotary drive device 114, the indexing body 120 is intermittently rotated, by a predetermined angle equal to the angular spacing interval of the mounting heads 130, for each intermittent rotary motion. Thus, the sixteen mounting heads 130 are turned about a common vertical axis of turning, that is, about the axis of the indexing body 120, so that each mounting head 130 is moved in the XY plane perpendicular to the common vertical axis of turning. The intermittent rotation of the indexing body 120 causes the sixteen mounting heads 130 to be sequentially moved to and stopped at sixteen working stations or positions, which are arranged along a circular path of turning movement of each mounting head 130, as indicated in FIG. 5. The sixteen working positions include: a component-receiving position (component-holding or -sucking position); an angular-component-position changing position; a component-hold-position detecting position (image-taking position); a mounting-surface detecting position; a component-hold-position rectifying position; a component-mounting position; an angular-head-position resetting position; a component-disposing position; a nozzle-holder detecting position; and a nozzle-holder selecting position. In the present embodiment, the rotary shaft 112 and the rotary drive device 114 constitute a rotary drive device 192, which cooperates with the indexing body 120 to constitute a head-turning device 194, which serves as a head-moving device.

As shown in FIG. 4, a cylindrical cam 140 is fixed to the lower surface of the frame 110, such that the rotary shaft 112 extends through the cylindrical cam 140, with a suitable radial gap therebetween, and such that a lower portion of the cylindrical cam 140 is interposed between the cylindrical portion 124 of the indexing body 120 and the lower portion of the rotary shaft 112. The lower portion of the cylindrical cam 140 has a cam groove (not shown) open in its outer circumferential surface, and a pair of rollers 148 attached to a guide rail 146 of each mounting head 130 are rotatably fitted in the cam groove.

The indexing body 120 has sixteen pairs of guide blocks 150 attached to its outer circumferential surface such that the pairs of guide blocks 150 are equiangularly spaced from each other in the circumferential direction of the indexing body 120. The sixteen guide rails 146 are vertically movably held in engagement with the respective pairs of guide blocks 150. These guide rails 146 and guide blocks 150 cooperate to constitute a guiding device for guiding the vertical movement of each mounting head 130.

The two rollers 148 are attached to a longitudinally intermediate portion of the corresponding guide rail 146 such that each of the rollers 148 is rotatable about a horizontal axis perpendicular to the axis of rotation of the indexing body 120. The two rollers 148 extend through an elongate hole 156 formed through the cylindrical portion 124 of the indexing body 120, and are rotatably held in engagement with the cam groove of the cylindrical cam 140. The cam groove is formed such that its vertical position gradually changes in the circumferential direction of the cylindrical cam 140, so that each mounting head 130 is vertically moved with the corresponding pair of rollers 148 in rolling contact with the upper end lower surfaces of the cam groove when each mounting head 130 is turned with the intermittent rotary motion of the indexing body 120. In the present embodiment, the cam groove is formed so that the mounting head 130 at the component-receiving position is located at its fully elevated position while the mounting head 130 at the component-mounting position is located at its fully lowered position, and so that the mounting heads 130 are moved (turned) in the horizontal direction between the component-receiving and component-mounting positions.

Figure 8:
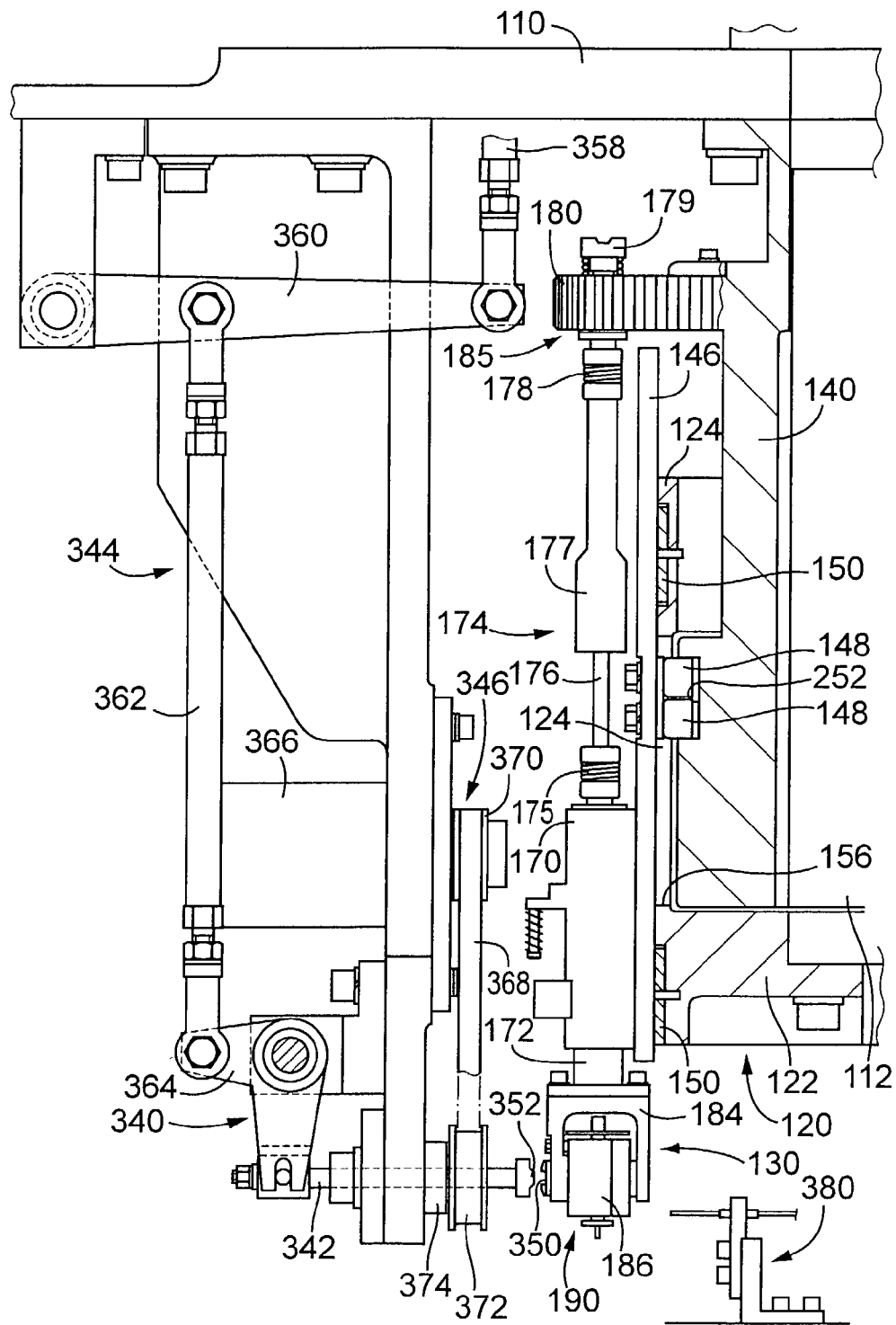
FIG. 8 is a front elevational view showing a nozzle-holder selecting device disposed at a nozzle-holder selecting position, which is another of the working positions.

To each of the guide rails 146, there is fixed a sleeve 170 through which a rod 172 having a circular shape in transverse cross section extends, as shown in FIGS. 4 and 8, such that the rod 172 is rotatable about its vertical axis (axis of rotation of the suction nozzle 190) and such that the rod 172 is not axially movable relative to the sleeve 170.

The rod 172 is connected to a rotation transmitting shaft 174. As shown in FIGS. 4 and 8, the rotation transmitting shaft 174 includes a spline shaft 176, a sleeve 177 and an engaging member 179. The spline shaft 176 is connected to the rod 172 through a universal joint 175, and the sleeve 177 is splined to the spline shaft 176 such that the sleeve 177 is axially movable relative to the spline shaft 176 but is not rotatable relative to the spline shaft 176. The engaging member 179 is connected to the sleeve 177 through a universal joint 178. Thus, the rotation transmitting shaft 174 is an axially telescopic member including the spline shaft 176 and sleeve 177 which are axially movable relative to each other.

As shown in FIG. 8, the engaging member 179 is held in engagement with an externally toothed ring gear 180 such that the engaging member 179 is axially movable and rotatable relative to the ring gear 180. The ring gear 180 is mounted on the upper portion of the cylindrical cam 140 through a bearing such that the ring gear 180 is rotatable about the axis of rotation of the indexing body 120.

As shown in FIG. 5, the externally toothed ring gear 180 is held in meshing engagement with a drive gear 183 fixed to an output shaft 182 of a drive source in the form of a relative-movement motor 181 (shown in FIG. 10). The ring gear 180 is rotated by the relative-movement motor 181 about the axis of the indexing body 120, at a higher speed than the indexing body 120, so that the engaging member 179 engaging the ring gear 180 reaches each working position before the corresponding mounting head 130. Accordingly, the engaging member 179 corresponding to each mounting head 130 is held stationary in the rotating direction of the indexing body 120, relative to an engaging member 310 (shown in FIG. 7) provided at each of the selected working positions such as the component-hold-position rectifying position, during a terminal portion of the corresponding intermittent rotary motion of the indexing body 120. In the present embodiment, the ring gear 180 and the relative-movement motor 181 constitute a major part of a non-relative-movement establishing device 185 operable to establish a state in which the engaging members 179, 310 are held stationary relative to each other in the rotating direction of the indexing body 120. This non-relative-movement establishing device 185 is constructed as disclosed in JP-A-6-342998. It will be understood that the relative-movement motor 181 is operated to move the engaging member 179 relative to the corresponding mounting head 130 during the intermittent rotary motion of the indexing body 120.

The universal joints 175, 178 permits the relative movement of the above-indicated engaging member 179 and the corresponding mounting head 130. Further, the relative movement between the spline shaft 176 and sleeve 177 of the rotation transmitting shaft 174 permits the corresponding mounting head 130 to be elevated and lowered while the engaging member 176 is held in engagement with the ring gear 180.

The lower end portion of the rod 172 extends downwards from the lower end of the sleeve 170, and a holder-mounting member 184 is fixed to the lower end of the rod 172. The holder-mounting member 184 has a support shaft 188 which extends in the horizontal direction perpendicular to the axis of rotation of the rod 172. A rotary holder 186 is mounted on the support shaft 188 such that the rotary holder 186 is rotatable about the horizontal axis.

Figure 6:
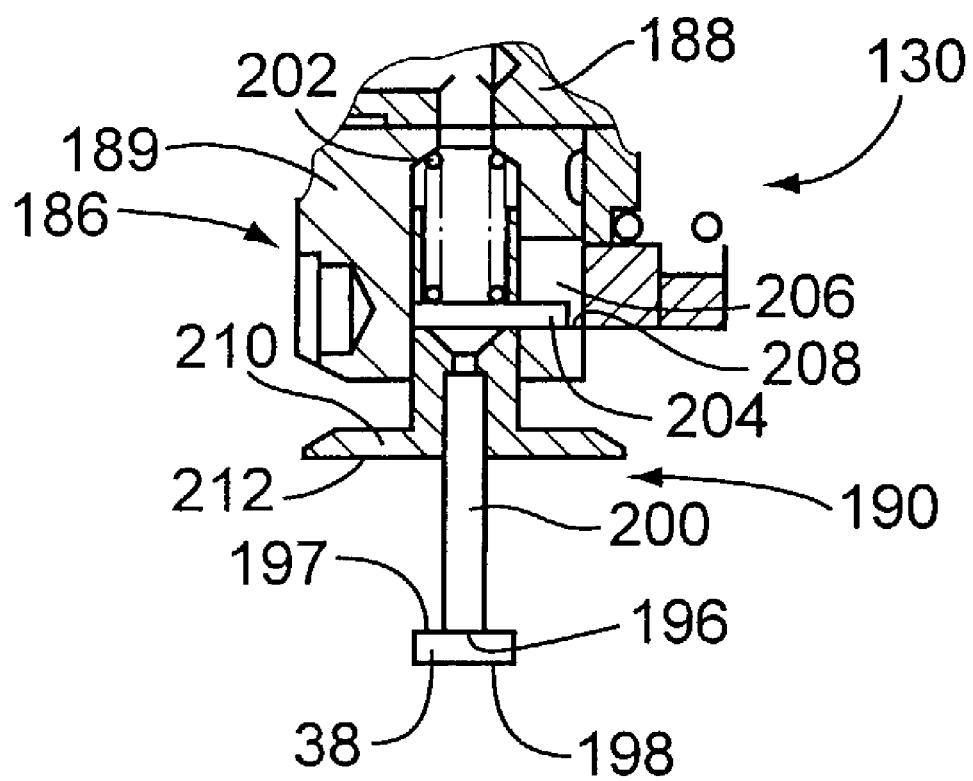
FIG. 6 is a front elevational view partly in cross section showing a suction nozzle held by the mounting head.

The rotary holder 186 has six nozzle holders 189 (one of which is shown in FIG. 6), which are equiangularly spaced apart from each other about the support shaft 188. The nozzle holders 189 support respective component holders in the form of suction nozzles 190. Thus, the plurality of suction nozzles 190 are held by the rotary holder 186 such that the suction nozzles 190 extend in the radial direction of the support shaft 188 and such that the suction nozzles 190 are equiangularly spaced apart from each other in the circumferential direction of the support shaft 188. To bring a selected one of the nozzle holders 189 into an operating position, the rotary holder 186 is rotated about the support shaft 188 by a nozzle-holder selecting device 340 disposed at the nozzle-holder selecting position as described below by reference to FIG. 8. The suction nozzle 190 held by the nozzle holder 189 placed in the operating position is coaxial with the vertically extending rod 172, and faces downwards, capable of holding the electronic component 38 by suction.

In the present embodiment, the rotary holder 186 carrying the plurality of nozzle holders 189 cooperates with the holder-mounting member 184 and the rod 172 to constitute each mounting head 130, which cooperates with the plurality of suction nozzles 190 to constitute a component-mounting unit 191. Each of the nozzle holders 189 may be considered to cooperate with the commonly used holder-mounting member 184 and rod 172 to constitute each mounting head. In this case, the indexing body 120 may be considered to have sixteen sets of mounting heads each set consisting of six mounting heads. In the following description, however, it is assumed that the indexing body 120 has sixteen mounting heads 130 each of which has six nozzle holders 189.

In FIG. 4, only two of the six suction nozzles 190 held by each mounting head 130 are shown, in the interest of simplification. The component-supply position of the component-supplying device 14 is located right below the suction nozzle 190 placed in the operating position of the mounting head 130 located at the component-receiving position. The component-supply portion of the tape feeder 36 from which the electronic component 38 is supplied is located at the component-supply position of the component-supplying device 14, that is, located right below the above-indicated suction nozzle 190.

Each of the suction nozzles 190 is arranged to hold the electronic component 38 by suction under a negative or reduced pressure. As shown in FIG. 6, each suction nozzle 190 has a suction tube 200 having a lower end face which serves as a sucking end face 196. The electronic component 38 has an upper surface serving as a suction surface 197 at which the electronic component 38 is sucked by the suction nozzle 190, and a bottom surface serving as a mounting surface 198 at which the electronic component 38 is mounted on the printed-wiring board 60.

Each suction nozzle 190 is held by the rotary holder 186 such that the suction nozzle 190 is not rotatable relative to the rotary holder 186 and is axially movable relative to the rotary holder 186. The suction nozzle 190 is biased by a spring 202 disposed between the rotary holder 186 and the suction nozzle 190, so that the suction nozzle 190 is normally held in its fully lowered or advanced position. To define the fully lowered position of the suction nozzle 190, a pin 204 is fixed to the suction nozzle 190 such that the pin 204 is perpendicular to the centerline of the suction nozzle 190, while an elongate hole 206 is formed in the rotary holder 186. The fully lowered position of the suction nozzle 190 is determined by the free end of the pin 204 in contact with a lower end 208 of the elongate hole 206. In the present embodiment, the suction nozzles 190 held by the rotary holder 186 have different configurations, but the suction tubes 200 of the suction nozzles 190 have the same length, so that the sucking end faces of all of the suction nozzles 190 lie on a circle concentric with the rotary holder 186. Each suction nozzle 190 is provided with a light-emitting body in the form of a light-emitting plate 210 the lower surface of which serves as a light-emitting surface 212 coated with a fluorescent material.

The suction nozzle 190 placed in the operating position is selectively communicated with a negative-pressure source (not shown), a positive-pressure source (not shown) and the atmosphere, through a directional control valve 220 (shown in FIG. 4), so that the electronic component 38 is held by suction and released. The directional control valve 220 is switched mechanically in response to the vertical movement of the corresponding mounting head 130.

As shown in FIG. 4, two head elevating and lowering devices 230, 232 are disposed at respective two portions of the frame 110 and cylindrical cam 140, which correspond to the component-receiving and component-mounting positions, respectively. These head elevating and lowering devices 230, 232 constitute an axially moving device operable to vertically move the corresponding mounting heads 130 located at the component-receiving and -mounting positions.

The head elevating and lowering device 230 disposed at the component-receiving position will be described by reference to FIG. 4. The head-elevating and lowering device 230 includes a movable member in the form of an elevator member 238, and an elevator elevating and lowering device 240 for vertically moving the elevator member 238. The cylindrical cam 140 has a guide groove 244 open in a circumferential portion of its outer circumferential surface, which portion corresponds to the component-receiving position. The guide groove 244 is formed so as to extend in the vertical direction. To the bottom surface of this guide groove 244, there is fixed a guide member in the form of an elongate guide rail 246 such that the guide rail 246 extends in the vertical direction, namely, in the axial directions of the corresponding suction nozzle 190 placed in the operating position and the indexing body 120. The elevator member 238 has two guide blocks 250 fixed thereto such that the guide blocks 250 are held in sliding engagement with the guide rail 246.

The elevator member 238 has a width almost equal to that of the guide groove 244 so that the elevator member 238 is closely fitted in the guide groove 244. The elevator member 238 has an engaging groove 252 formed in its lower end portion such that the engaging groove 252 extends in the horizontal direction and is open in the radially outward direction of the cylindrical cam 140. This engaging groove 252 has the same width (dimension in the vertical direction) as the cam groove of the cylindrical cam 140. When the elevator member 238 is located at its fully elevated position, the engaging groove 252 is located at the same vertical position as the horizontal portion of the cam groove of the cylindrical cam 140, so that the engaging groove 252 functions as a cam groove continuous with the cam groove of the cylindrical cam 140.

The elevator elevating and lowering device 240 uses the rotary drive motor 116 as its drive source, and includes a motion converting device which includes a cam in the form of a rotary cam 254, a cam follower in the form of a roller 256 and levers 258, 260. A rotary motion of the rotary drive motor 116 is converted by the motion converting device into a vertical movement of a connecting rod 262, which is transmitted to the elevator member 238 through a spherical joint 264, so that the mounting head 130 disposed at the component-receiving position is vertically moved, whereby the selected suction nozzle 190 is vertically moved. The vertical movement of the suction nozzle 190 and the turning movement of the mounting head 130 take place in a predetermined timed relationship with each other, which is determined by the configuration of the rotary cam 254 and the cam used in the rotary drive device 114 for the rotary shaft 112.

The vertical operating stroke of the elevator member 238 is adjustable by a stroke changing device 270, so that the fully lowered position of the selected suction nozzle 190 located at the component-receiving position is adjustable. In the present embodiment, the stroke changing device 270 functions as a lowered-position changing device operable to change the fully lowered position of each mounting head 130, or as a stroke-end changing device operable to change one of the opposite stroke ends of the mounting head 130 which is on the side of the component-supplying device 14.

The stroke changing device 270 is constructed as disclosed in co-pending patent application Ser. No. 09/863,431. The above-indicated lever 260 is provided with a guide rail (not shown). A first slide 272 slidably engages this guide rail. The guide rail extends along an arc of a circle which has a center on the pivoting center of the spherical joint 264 when the elevator member 238 is located at its fully elevated position. The first slide 272 is pivotally connected through a spherical joint (not shown) to the end of the connecting rod 262 which is opposite to the end connected to the elevator member 238 through the spherical joint 264. The first slide 272 is moved by a slide moving device 276. The connecting rod 262 is connected to the lever 260 through the first slide 272.

The slide moving device 276 includes a second slide 278, a feedscrew in the form of a ballscrew 280, a ballnut 282 and a second slide drive motor 284. The second slide 278 extends over a horizontal pivot axis of the lever 260, in a direction perpendicular to the pivot axis. The first slide 272 is connected to the second slide 278 such that the first slide 272 is not movable relative to the second slide 278 in the direction of movement of the second slide 278, but is movable relative to the second slide 278 in the vertical direction. When the ballscrew 280 is rotated to move the second slide 278, the first slide 272 is moved while being guided by the guide rail provided for the lever 260. A movement of the first slide 272 causes a change in a distance between a point of connection of the connecting rod 262 to the lever 260 and the pivot axis of the lever 260, so that the operating stroke of the elevator member 238 is changed. The operating stroke of the elevator member 238 is changed while the elevator member 238 is located at its fully elevated position. This means that the change of the operating stroke of the elevator member 238 does not result in a change of its fully elevated position, but results in a change of its fully lowered position, and accordingly a change of the fully lowered position of the selected suction nozzle 190.

The vertical operating stroke of the head elevating and lowering device 232 is not adjustable but is held constant. That is, the fully lowered and elevated positions of the mounting head 130 located at the component-mounting position are held constant. In the other aspects, the head elevating and lowering device 232 is identical with the head elevating and lowering device 230, and no further description of the head elevating and lowering device 232 will be provided, with the same reference signs as used for the device 230 being used for the device 232.

Three head rotating devices in the form of a component-hold-position rectifying device 300 (shown in FIG. 7), an angular-component-position changing device 302 (FIG. 11) and an angular-head-position resetting device 304 (shown in FIG. 11) are disposed at the component-hold-position rectifying position, the angular-component-position changing position and the angular-component-position resetting position. As these devices 300, 302, 304 have the same construction, the component-hold-position rectifying device 300 will be described by way of example.

Figure 7:
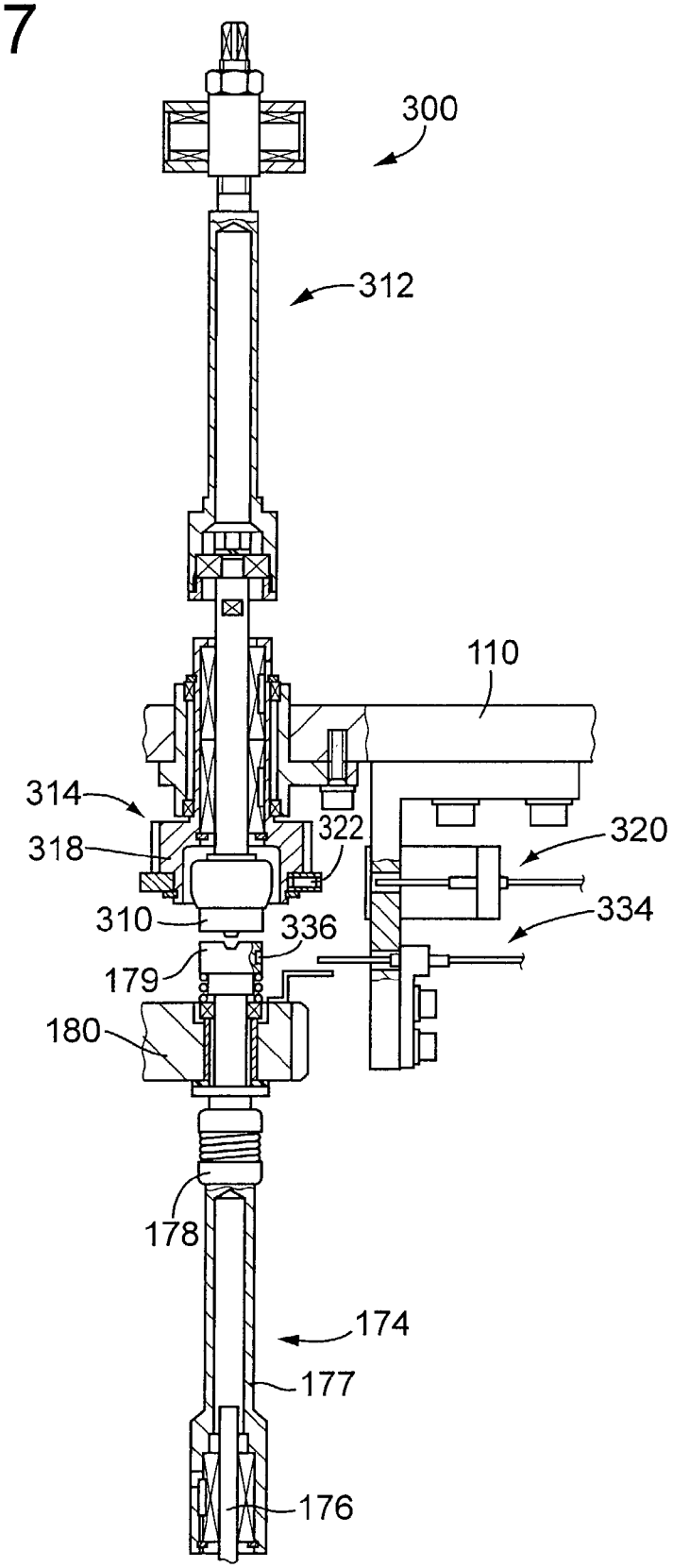
FIG. 7 is a front elevational view partly in cross section showing a component-hold-position rectifying device disposed at a component-hold-position rectifying position, which is one of the working positions.

As shown in FIG. 7, the component-hold-position rectifying device 300 includes an engaging member 310, a vertically moving device 312 and a rotating device 314. The engaging member 310 is supported by the frame 110 such that the engaging member 310 is axially movable and rotatable relative to the frame 110. The vertically moving device 312 is operable to move the engaging member 310 in its axial direction, namely, in the vertical direction (parallel to the axis of rotation of the indexing body 120), for selective engagement with or disengagement from the above-indicated engaging member 179. The rotating device 314 is operable to rotate the engaging member 310.

The vertically moving device 312 includes a motion converting device including a cam and a cam follower for converting the rotary motion of the intermittent rotary drive motor 116 into a vertical movement, and a motion transmitting mechanism for transmitting the vertical movement to the engaging member 310 for engagement and disengagement with and from the engaging member 179 of the mounting head 130. The rotating device 314 uses a component-hold-position rectifying motor 316 (shown in FIG. 10) as s drive source. A rotary motion of this motor 316 is transmitted to the engaging member 310 through a motion transmitting device including a timing pulley 318, so that the engaging member 310 is rotated about its vertically extending axis. The engaging member 310 in engagement with the engaging member 179 is rotated, so that a rotary motion of the engaging member 310 is transmitted to the rotation transmitting shaft 174, whereby the corresponding mounting head 130 and the selected suction nozzle 190 are rotated about their axes.

The component-hold-position rectifying device 300 is provided with an angular-zero-position detecting device 320 for detecting the angular zero position of the engaging member 310. The angular-zero-position detecting device 320, which is attached to the frame 110, consists of a sensor of optical fiber type arranged to detect the angular zero position of the engaging member 310, depending upon a light is reflected from a reflecting member 322 disposed on the timing pulley 318 provided to transmit the rotary motion of the component-hold-position rectifying device 316 to the engaging member 310.

The angular-component-position changing device 302 and the angular-head-position resetting device 304, which have the same construction as the component-hold-position rectifying device 300, respectively include an angular-component-position changing motor 328 and an angular-component-position resetting motor 330 (which are shown in FIG. 10), as respective drive motors thereof. The angular-zero-position detecting device 320 is also provided for each of those devices 302, 304.

The angular-head-position resetting device 304 is also provided with an angular-zero-position detecting device 334 for detecting the angular zero position of the engaging member 179, that is, the angular zero position of the mounting head 130. This detecting device 334 consists of a sensor of optical fiber type arranged to detect the angular zero position of the mounting head 130, depending upon whether a light reflected from a reflecting surface 336 disposed on the outer circumferential surface of the engaging member 179. The mounting head 130 is placed in its angular zero position when the mounting head 130 located at the component-receiving position receives the electronic component 38. When the mounting head 130 is located at the angular-head-position resetting position, the mounting head 130 is rotated by the angular-head-position resetting device 304 to its angular zero position, namely, to its component-receiving angular position in which the selected suction nozzle 190 receives the electronic component 38 at the component-receiving position. In the present embodiment, the two engaging members 310, 179 are engageable with each other at two angular positions which are spaced from each other by 180° and one of which is the angular zero position of the engaging members 310, 179.

The nozzle-holder selecting device 340 disposed at the nozzle-holder selecting position as shown in FIG. 8 includes a rotary drive member 342, a rotary-drive-member switching device 344 and a rotary-drive-member rotating device 346. The nozzle holder in the form of the rotary holder 186 has an engaging portion in the form of three engaging grooves 350 formed so as to intersect with each other at the axis of rotation of the rotary holder 186. On the other hand, the rotary drive member 342 has engaging teeth 352 which are engageable with the engaging grooves 350. When the rotary drive member 342 is rotated by the rotary-drive-member rotating device 346, with its engaging teeth 352 engaging the engaging grooves 350, the rotary holder 186 is rotated about the support shaft 188, to bring a selected one of the six nozzle holders 189 to its operating position, so that the suction nozzle 190 held by the selected nozzle holder 189 is placed in its operating position, for holding the electronic component 38 to be mounted next.

The rotary drive member 342 is selectively connected to and disconnected from the rotary holder 186 through the rotary-drive-member switching device 344, which is driven by the rotary drive motor 116. The switching device 344 includes an elevator rod 358 which is connected to the rotary drive motor 116 through a motion-converting mechanism which includes a cam, a cam follower, and a motion-transmitting mechanism (not shown) that supports the cam follower. The motion-converting mechanism is arranged to covert a rotary motion of the rotary drive motor 116 into a linear motion of the elevator rod 358. Since the rotary drive motor 116 is kept operated, the elevator rod 358 is lowered only when the rotary holder 196 is rotated to select one of the six suction nozzles 190. The motion-converting mechanism is constructed as disclosed in JP-B2-3050638. The elevator rod 358 is connected to the rotary drive member 342 through the lever 360 and connecting rod 362, and a lever 364. When the elevator rod 358 is vertically moved, the lever 360 is pivoted to vertically move the connecting rod 362, so that the lever 364 is pivoted to move the rotary drive member 342 between an operated position in which the engaging teeth 352 engage the engaging grooves 350 of the rotary holder 186, and a non-operated position in which the engaging teeth 352 are released from the engaging grooves 350.

The rotary-drive-member rotating device 346 includes a nozzle-holder selecting motor 366 as a drive source, as shown in FIG. 8. The rotary drive member 342 is supported by a casing 374 such that the rotary drive member 342 is axially movable relative to the casing 374 and is rotated with the casing 374. A rotary motion of the nozzle-holder selecting motor 366 is transmitted to the casing 374 through a timing belt 368 and two timing pulleys 370, 372, so that the rotary drive member 342 is rotated about its axis, to rotate the rotary holder 186. The casing 374 is supported by the frame 110 such that the casing 374 is rotatable about its axis perpendicular to the axis of rotation of the indexing body 120, and is not axially movable relative to the frame 110. When the casing 374 is rotated, the rotary drive member 342 held by the casing 374 such that the rotary drive member 342 is not rotatable but is axially movable relative to the casing 374 is rotated about its axis, so that the rotary holder 186 is rotated to bring a selected one of the six nozzle holders 189 into the operating position. The suction nozzles 190 have respective passages formed threrethrough. The passage of the suction nozzle 190 held by the selected nozzle holder 189 is communicated with the passage formed through the rotary holder 186, so that a negative pressure can be applied to the selected suction nozzle 190. The rotary holder 186 is positioned by a positioning device (not shown) such that the nozzle holder 189 holding the suction nozzle 190 selected for mounting the electronic component 38 is placed in the operating position.

The kind of the nozzle holder 189 placed in the operating position is detected by a nozzle-holder detecting device 380 (shown in FIG. 8) disposed at the nozzle-holder detecting position. The sixteen mounting heads 130 are given respective head identification codes, and each of the six nozzle holders 189 of each mounting head 130 is given a nozzle-holder identification code. The nozzle-holder identification codes representative of the nozzle holders 189 are stored, in relation to suction-nozzle data sets representative of the respective suction nozzles 190 held by the respective nozzle holders 189. The kind of the suction nozzle 190 of each mounting head 130 placed in the operating position is represented by the head identification code, the nozzle-holder identification code and the suction-nozzle data. The direction and angle of rotation of the rotary holder 186 are determined on the basis of the kind of the suction nozzle 190 presently placed in the operating position and the kind of the suction nozzle 190 to be used to hold the next electronic component 38.

As schematically shown in FIG. 9, an image-taking system 400 is disposed at the component-hold-position detecting position. The image-taking system 400 includes a component camera 402 (shown in FIG. 10), a light guiding device 404, and an illuminating device 406. Like the fiducial-mark camera 113 described above, the component camera 402 is a CCD camera capable of taking a two-dimensional image of the object. The component camera 402 is located radially outwardly of a circular path of turning of the mounting heads 130, and is oriented so as to face upwards. The light guiding device 404 is disposed so as to extend between the above-indicated circular path and the component camera 402. A light representative of an image of the object is guided by the light guiding device 404, so as to be incident upon the component camera 402. In the present embodiment, the component camera 402 and the light guiding device 404 may be considered to constitute an image-taking device.

The illuminating device 406 is arranged to irradiate the selected suction nozzle 190 with a selected one of a visible radiation and a ultraviolet radiation. When the illuminating device 406 is operated to emit the ultraviolet radiation, the ultraviolet radiation is absorbed by the light-emitting surface 212 of the light-emitting plate 210 of the suction nozzle 190, and a visible radiation is emitted from the light-emitting surface 212 to irradiate the electronic component 38, so that a projection image or a silhouette image of the electronic component 38 is taken by the component camera 402. When the illuminating device 406 is operated to emit the visible radiation for irradiating the suction nozzle 190, a normal front image of the electronic component 38 is taken by the component camera 402.

As shown in FIG. 9, an image-taking system 420 is disposed at the mounting-surface detecting position. This image-taking system 420 includes a component-camera 422 and an illuminating device 424, which cooperate to constitute an image-taking device. Like the component camera 402, the component camera 424 is a CCD camera capable of taking a two-dimensional image of the object. The illuminating device 424 is disposed in opposed relationship with the component camera 424.

The component camera 422 and the illuminating device 424 are disposed such that their optical axes are perpendicular to the axis of the suction nozzle 190 placed in the operating position, that is, such that the optical axes extend in the horizontal direction. The component camera 422 is located radially inwardly of the circular path of turning of the selected suction nozzle 190 placed in the operating position, which path is taken when the mounting heads 130 are turned by the head-turning device 194. The component camera 422 is oriented so as to face in the radially outward direction of the indexing body 120. On the other hand, the illuminating device 424 is disposed radially outwardly of the above-indicated circular path of turning of the selected suction nozzle 190, and is oriented so as to face in the radially inward direction, in opposed relationship with the component camera 422.

The component camera 422 and illuminating device 424 are positioned in the axial direction of the selected suction nozzle 190, so as to permit imaging of the lower end portion of the suction nozzle 190 and the electronic component 38 held by the suction nozzle 190, that is, so as to permit the illuminating device 424 to irradiate the lower end portion of the suction nozzle 190 and the electronic component 38, and permit the component camera 422 to take the images of the lower end portion of the suction nozzle 190 and electronic component 38, irrespective of the configuration and dimensions of the suction nozzle 190 and electronic component 38. Thus, the component camera 422 is provided to take the images of the suction nozzle 190 and electronic component 38 in the radial direction of the suction nozzle 190.

The present electronic-component mounting system 12 includes a control device 500 as shown in FIG. 10. The control device 500 is principally constituted by a computer 510 including a processing unit (PU) 502, a read-only memory (ROM) 504, a random-access memory (RAM) 506 and a bus interconnecting those elements 502, 504 and 506. To the bus, there is connected an input-output interface 512 to which are connected the angular-zero-position detecting device 320, an input device 530, encoders and various sensors. The input device 530 is provided with ten keys, alphabetic keys and function keys, and is used for entry of desired data and commands.

To the input-output interface 512, there are also connected various actuators such as the table drive motors 42 through respective driver circuits 516. The motors used as the drive sources are rotary electric motors in the form of servomotors the operating angle of which can be controlled with a comparatively high degree of accuracy. However, stepping motors may be used in place of the servomotors. The operating angles or amounts of those drive sources such as the table drive motors 42 are detected by respective operating-angle detecting devices in the form of rotary encoders. The drive sources such as the table drive motors 42 are controlled on the basis of the output signals of the rotary encoders.

To the input-output interface 512, there are also connected the fiducial-mark camera 113 and the two component cameras 402, 422 through respective control circuits 518. The driver circuits 516, control circuits 518 and computer 510 cooperate to constitute the control device 500. The RAM 506 stores various control programs and data, such as programs for executing a main control routine (not shown), a vibration damping routine illustrated in the flow chart of FIG. 14, a component-mounting control routine for mounting the electronic components 38 on the printed-wiring board 60, and a component-hold-position error detecting control routine for detecting component-hold-position errors of the electronic components 38 as held by the selected suction nozzles 190.

As schematically shown in FIG. 11, the present electric-component mounting system 12 includes a plurality of working devices using the respective servomotors as their drive sources, including the table positioning device 46, XY positioning device 64, Z-axis positioning device 88, non-relative-movement establishing device 185, head-turning device 194, head elevating and lowering devices 230, 232, stroke changing device 270, component-hold-position rectifying device 300, angular-component-position changing device 302 and angular-head-position resetting device 304. The electronic components 38 are mounted on the printed-wiring-boards 60 by operations of those working devices.

Each of the servomotors used to drive the above-indicated working devices can be controlled with high accuracy in its operating angle, so that a linearly movable member or a rotary member which is moved or rotated by the servomotor can be accelerated and decelerated with an accordingly high degree of accuracy.

When the electronic component 38 is mounted on the printed-wiring board 60, the indexing body 120 is intermittently rotated to intermittently stop the sixteen mounting heads 130 successively or sequentially at the working positions such as the component-receiving position. In the present electronic-component mounting system 12, the engaging member 179 is turned about the axis of rotation of the indexing body 120, by rotation of the externally toothed ring gear 190 by the relative-movement motor 181, independently of the rotation of the indexing body 120, during a movement of each mounting head 130 between the two adjacent working positions by the intermittent rotary motion of the indexing body 120, so that the engaging member 179 reaches the next working position before the mounting head 130, as in an electronic-component mounting system disclosed in JP-A-6-342998. Accordingly, the engaging member 179 is brought into engagement with the engaging member 310 of the component-hold-position rectifying device 300, angular-component-position changing device 302 and angular-head-position resetting device 304, while the indexing body is being still moved to the corresponding working positions. Accordingly, the operations of the devices 300, 302, 304 to rectify and change the angular position of the electronic component 38 and the angular position of the mounting head 130 are performed during the rotary motion of the indexing body 120, as shown in the time chart of FIG. 12.

There will be described an operation in which the electronic component 38 held by the selected suction nozzle 190 held by one of the sixteen mounting heads 130 is mounted on the printed-wiring board 60. When the appropriate mounting head 130 is moved to the component-receiving position, the mounting head 130 is lowered by the head elevating and lowering device 230, to hold the appropriate electronic component 38 by suction under a negative pressure. At this time, one of the two component supply tables 30, 32 of the component-supplying device 14 is moved by the table-positioning device 46 to move the component-supply portion of the appropriate tape feeder 36 to the predetermined component-supplying position, so that the electronic component 38 supplied by this tape feeder 36 is held by the suction nozzle 190 of the mounting head 130.

Then, the mounting head 130 is moved to the angular-component-position changing position at which the angular position of the electronic component 38 as held by the suction nozzle 190 is changed, by rotation of the mounting head 130 about its axis, if the angular position of the electronic component 38 in which the electronic component 38 is different from the angular position in which the electronic component is held by the suction nozzle 190. Whether the mounting and holding angular positions of the electronic component 38 are different from each other may be detected on the basis of the kind of the electronic component 38 and the position of the mounting spot on the printed-wiring board 60, which are determined by the component-mounting program and data. Where the mounting and holding angular positions of the electronic component 38 are different from each other, the mounting head 130 is rotated by the angular-component-position changing device 302, about its axis, to rotate the electronic component 38 from the holding angular position to the mounting angular position. Described in detail, the engaging member 310 is brought into engagement with the engaging member 179, and the rotation transmitting shaft 174 is rotated by the angular-component-position changing motor 328, to rotate the mounting head 130 for thereby rotating the suction nozzle 190. After the mounting head 130 has been rotated by the engaging member 310 of the angular-component-position changing device 302, the engaging member 310 is rotated back to the original angular position in which the engaging member 310 is engageable with the engaging member 179 of the next mounting head 130. This rotation of the engaging member 310 to its original angular position is effected during the turning movement of the head 130, while the engaging member 310 is disengaged from the engaging member 179. At this time, the engaging member 310 is rotated in the clockwise or counterclockwise direction that permits a smaller angle of rotation of the engaging member 310 to its original angular position.

Then, the mounting head 130 is moved to the component-hold-position detecting position at which an image of the electronic component 38 as held by the suction nozzle 190 is obtained by the component camera 402. The obtained image of the electronic component 38 is compared with a reference image indicative of the nominal hold position of the electronic component 38. On the basis of a result of this comparison, the computer 510 calculates horizontal positioning errors $\Delta XE$ and $\Delta YE$ of the electronic component 38 (center position errors of the electronic component 38 in the XY plane), and an angular positioning error $\Delta\theta$ of the electronic component 38 about an axis perpendicular to its suction surface 197.

The mounting head 130 is then moved to the mounting-surface detecting position at which the end portion of the suction nozzle 190 and the electronic component 38 held by the suction nozzle 190 are imaged by the component camera 422 in the radial direction of the suction nozzle 190. On the basis of images taken by the component camera 422, a thickness of the electronic component 38 is obtained. Namely, the thickness is obtained on the basis of a position of the mounting surface 198 of the electronic component 38 and a position of the sucking end face 196 of the suction nozzle 190 as viewed in the axial direction of the suction nozzle 196. Further, the position of the mounting surface 198 of the electronic component 38 in the axial direction of the suction nozzle 190 is compared with a nominal position thereof, to obtain axial positioning error of the mounting surface 198. In addition, an amount of wear of the suction nozzle 190 is detected on the basis of the position of its sucking end face 196.

The mounting head 130 is then moved to the component-hold-position rectifying position at which the suction nozzle 190 is rotated about its axis by the component-hold-position rectifying device 300, to eliminate the detected angular positioning error $\Delta\theta$. To this end, the engaging member 310 is brought into engagement with the engaging member 179, and the mounting head 130 is rotated by the component-hold-position rectifying motor 316, to rotate the suction nozzle 190. If the angular position of the electronic component 38 has been changed by the angular-component-position changing device 302, the engaging member 310 is rotated from its original angular position to the appropriate angular position for engagement with the engaging member 179. This rotation of the engaging member 310 for engagement with the engaging member 179 is effected during the turning movement of the mounting head 130 to the component-hold-position rectifying position, and while the engaging member 310 is released from the engaging member 179. After the angular positioning error AO is eliminated, the engaging member 310 is returned to the angular position for engagement with the engaging member 179 to eliminate the angular positioning error $\Delta\theta$ of the next electronic component 38 held by the next mounting head 130 which will reach the component-hold-position rectifying position. If the angular position of the electronic component 38 has been changed at the angular-component-position changing position, the engaging member 310 is returned to the appropriate angular position at which the engaging member 310 is engageable with the engaging member 179 of the mounting head 130 which has been rotated at the angular-component-position changing position. If the angular position of the electronic component 38 has not been changed at the angular-component-position changing position, the engaging member 310 is returned to the original angular position.

The horizontal positioning errors $\Delta XE$ and $\Delta YE$ of the electronic component 38 are eliminated by adjusting distances of movements of the printed-wiring board 60 by the XY positioning device 64 in the X-axis and Y-axis directions to bring the predetermined mounting spot on the printed-wiring board 60 to the predetermined component-mounting position. In other words, movement data indicative of the distances of X-axis and Y-axis movements of the board 60 by the XY positioning device 64 are adjusted so that the electronic component 38 is mounted at the predetermined mounting spot, irrespective of the horizontal positioning errors $\Delta XE$ and $\Delta YE$ of the electronic component 38 as held by the suction nozzle 190.

The movement data for the printed-wiring board 60 are also adjusted so as to compensate for horizontal positioning errors $\Delta XP$ and $\Delta YP$ of the board 60, and center position errors of the electronic component 38 which result from the rotation of the electronic component 38 to eliminate its angular positioning error $\Delta\theta$ at the component-hold-position rectifying position. To obtain the horizontal positioning errors $\Delta XP$ and $\Delta YP$ of the board 60, images of the fiducial-marks provided on the board 60 are taken by the fiducial-mark camera 113, and the obtained images are used to calculate board-positioning errors of the PWB holding device 18 to position the board 60. The board-positioning errors are used to calculate the horizontal positioning errors $\Delta XP$ and $\Delta YP$ of the board 60. The horizontal positioning errors $\Delta XE$ and $\Delta YEP$ of the electronic component 38, the horizontal positioning errors $\Delta XP$ and $\Delta YP$ of the board 60, and the center position errors of the electronic component 38 due to its rotation to eliminate its angular positioning error $\Delta\theta$ are eliminated by adjusting the movement data used to position the board 60 when the electronic component 38 is mounted on the board 60, so that the electronic component 38 is mounted at the nominal mounting spot, and in the nominal angular position.

At the component-mounting position, the mounting head 130 is lowered and elevated by the head elevating and lowering device 232, to mount the electronic component 38 on the printed-wiring board 60. The operating stroke of the device 232 is constant so that the fully lowered position of the suction nozzle 190 is held constant. To adjust the vertical position or height of the component-mounting surface 84 of the printed-wiring board 60, therefore, the PWB holding device 18 is vertically moved by the Z-axis positioning device 88.

The height or Z-axis position of the PWB holding device 18 which holds the printed-wiring board 60 is adjusted on the basis of the axial or Z-axis positioning error of the mounting surface 198 of the electronic component 38, which has been obtained on the basis of the image of the electronic component 38 taken by the component camera 422. This adjustment of the Z-axis position of the PWB holding device 18 permits the electronic component 38 to be forced against the component-mounting surface 84 of the board 60 with a predetermined optimum force. The Z-axis positioning error of the mounting surface 198 of the electronic component 38 includes various errors such as dimensional errors and component-holding error of the suction nozzle 190, an error due to a wear of the sucking end face 196, and dimensional errors of the electronic component 38 per se. The Z-axis position of the component-mounting surface 84 of the board 60 is adjusted so as to eliminate the Z-axis positioning error of the mounting surface 198 of the electronic component 198, which is obtained on the basis of the detected Z-axis position of the mounting surface 198, so that the electronic component 38 is brought into contact with the component-mounting surface 84 with a reduced amount of impact therebetween after substantial deceleration of the vertical movement of the suction nozzle 190, irrespective of the dimensional errors of the suction nozzle 190, so that the electronic component 38 can be forced onto the component-mounting surface 84 of the board 60 with a force almost equal to the optimum value after the elevator member 238 has been lowered to its fully lowered position.

After the electronic component 38 has been mounted on the printed-wiring board 60, the mounting head 130 is moved to the angular-head-position resetting position at which the mounting head 130 is rotated to its original angular position. That is, the engaging member 310 of the angular-head-position resetting device 304 is brought into engagement with the engaging member 179, and the mounting head 130 is rotated about its axis by the angular-head-position resetting motor 330. To this end, the engaging member 310 of the angular-head-position resetting device 304 is rotated form its original angular position to the appropriate angular position for engagement with the engaging member 179 of the mounting head 130. This rotation of the engaging member 310 for engagement with the engaging member 179 is effected during the turning movement of the mounting head 130 while the engaging member 310 is disengaged from the engaging member 179. The angle of rotation of the engaging member 310 at this time is determined by the mounting angular position of the electronic component 38 and its angular positioning error.

The mounting head 130 is then moved to the component-disposing position to dispose or discard the electronic component 38 if the electronic component 38 which the suction nozzle 190 has received from the tape feeder 36 has not been mounted on the printed-wiring board 60, for some reason or other. For instance, the electronic component 38 is not mounted on the printed-wiring board 60 and is transferred to a component disposing device (not shown), if the electronic component 38 is held in its upright attitude by the suction nozzle 190, or the kind of the electronic component 38 held by the suction nozzle 190 is not correct. The upright attitude of the electronic component 38 is detected on the basis of the images of the electronic component 38 taken at the component-hold-position detecting position and the mounting-surface detecting position. The head elevating and lowering device 232 at the component mounting position is not operated to vertically move the mounting head 130, to prevent mounting of the electronic component 38 on the printed-wiring board 60, where it is determined that the electronic component 38 is not mounted on the board 60. At the component-disposing position, the directional control valve 220 is switched by a switching device to a position for applying a positive pressure to the suction nozzle 190, to thereby release the electronic component 38 from the suction nozzle 190.

Then, the mounting head 130 is moved to the nozzle-holder detecting position at which the nozzle-holder detecting device 380 is operated to detect the kind of the nozzle holder 189 placed in the operating position, that is, the kind of the suction nozzle 190 held by the nozzle holder 189. If the kind of the suction nozzle 190 held by the presently selected nozzle holder 189 is different from the kind of the suction nozzle 190 to be used for the next electronic component 38, the rotary holder 186 of the mounting head 130 is rotated by the nozzle-holder selecting device 340 at the nozzle-holder selecting position, to bring the desired nozzle holder 189 (suction nozzle 190) into the operating position. Since the rotary holder 186 has the six nozzle holders 189 that are equiangularly spaced apart from each other by an angular spacing interval of 60°, the desired nozzle holder 189 can be brought into its operating position by rotating the rotary holder 186 in the clockwise or counterclockwise direction, by a maximum angle of 180°.

The amount of wear of the sucking end face 196 of the suction nozzle 190 which has been obtained on the basis of the image of the suction nozzle 190 taken by the component camera 422 at the mounting-surface detecting position is used to increase the vertical movement stroke of this suction nozzle 190 when the suction nozzle 190 is used to receive the next electronic component 38 at the component-receiving position. That is, the fully lowered position of the suction nozzle 190 is lowered by a distance corresponding to the detected amount of wear of the sucking end face 196. To this end, the amount of operation of the second slide drive motor 284 is increased to increase the operating stroke of the second slide 202, for increasing the distance between the point of connection of the connecting rod 156 to the lever 160 and the pivot axis of the lever 160. The vertical movement stroke of the suction nozzle 190 is also changed to change the fully lowered position of the suction nozzle 190 when the thickness or Z-axis dimension of the electronic component 38 is different from the nominal value. As described above, the thickness of the electronic component 38 is obtained on the basis of the detected Z-axis positions of the sucking end face 196 and the mounting surface 198 of the printed-wiring board 60. The adjustments of the vertical movement stroke of the suction nozzle 190 to compensate for the wear of the sucking end face 196 and the thickness variation of the electronic component 38 permit the suction nozzle 190 to come into contact with the electronic component 38 at the component-supply position, when the lowering speed of the suction nozzle 190 has been substantially zeroed. Accordingly, the electronic component 38 can be received by the suction nozzle 190, with a reduced amount of impact therebetween and a high degree of holding stability.

When one cycle of operation of the electronic-component mounting system 12 to mount a given electronic component 38 on the printed-wiring board 60 is performed, some of the working devices disposed at the respective working positions as described above are simultaneously operated for at least portions of their operations to mount the electronic component 38 on the board 60. The one cycle of operations is performed during one rotation of the roller-gear cam of the head-turning device 194, which is driven by the rotary drive motor 116. During one intermittent rotation of the indexing body 120 by the rotary drive motor 116, the mounting heads 130 are turned about the axis of the indexing body 120, and are sequentially moved to and stopped at the working positions. The rotary drive motor 116 and the roller-gear cam are held operated even while the mounting heads 130 are stopped at the respective working positions. Thus, the head-turning device 194 is held operated even while the mounting heads 130 are located at the respective working positions, that is, during one cycle of operation of the electronic-component mounting system 12. Accordingly, all of the working devices at the respective working positions are operated simultaneously with respective periods of the continuous operation of the head-turning device 194.

The operations or movements of the working devices in relation to the angle of rotation of the roller-gear cam of the head-turning device 194 are indicated in the time chart of FIG. 12. For each of the working devices, angular ranges of the roller-gear cam in which the working device is permitted to operate are determined. Each of these angular ranges is defined by two rotating angles of the roller-gear cam at which the operation of the working device is initiated and terminated, respectively. It will be understood from the time chart of FIG. 12 that the following operations or movements are performed simultaneously with each other and during the intermittent rotation of the indexing body 120: an operation of the XY-positioning device 64 to move the printed-wiring board 60 in the X-axis and Y-axis directions; an operation of the Z-axis positioning device 88 to move the printed-wiring board 60 in the Z-axis direction; an operation of the table-positioning device 46 to move the component supply tables 30, 32; and an operation of the non-relative-movement establishing device 185 to move the engaging member 179. In the present embodiment, an operation of the stroke changing device 270 to change the vertical movement stroke of the mounting head 130 is also performed during the intermittent rotation of the indexing body 120. On the other hand, most of the operations of the component-hold-position rectifying device 300, angular-component-position changing device 302 and angular-head-position resetting device 304 to rotate the corresponding mounting heads 130 and the rotary holder 186 to select the suction nozzle 190 are performed simultaneously with each other, but while the indexing body 120 is held stationary.

During the entire period of one cycle of operation of the electronic-component mounting system 12, two or more of the working devices are operated simultaneously. Simultaneous initiation and termination of the operations of the two or more working devices cause operating vibrations of the working devices to be superimposed on each other, leading to a risk of an increase in the magnitude of the overall vibration of the electronic-component mounting system 12. Further, unnecessarily high values of acceleration and deceleration of the working devices may also lead to an increased magnitude of the overall vibration of the system 12. In view of this potential drawback, the present electronic-component mounting system 12 is arranged to reduce the magnitude of the overall vibration by suitably determining the values of acceleration and deceleration of the operations or movements of the working devices, or by delaying the moment of initiation of the operations or movements.

The determination of the acceleration and deceleration values and delaying of the moment of initiation of the operations or movements to reduce the vibration of the system 12 are effected for selected ones of the above-indicated working devices except the non-relative-movement establishing device 185, head elevating and lowering devices 230, 232, stroke changing device 270 and component-hold-position rectifying device 300. These working devices are referred to as "selected working devices". However, the operations of the non-relative-movement establishing device 185 and the head elevating and lowering devices 230, 232 are influenced by the acceleration and deceleration values determined for the rotating movement of the indexing body 120. In this respect, it is noted that the head elevating and lowering devices 230, 232 use as its drive source the rotary drive motor 116, which is the drive source of the head-turning device 194, so that the operations of the devices 230, 232 are influenced by the acceleration and deceleration values determined for the head-turning device 194.

As described above, the stroke changing device 270 is operated to adjust the vertical movement stroke of each suction nozzle 190, depending upon the thickness variation of the individual electronic components 38 and the amount of wear of the sucking end face 196 of the individual suction nozzles 190. In the present embodiment, the second slide 278 has a relatively small maximum distance of movement, so that the vertical movement stroke of each suction nozzle 190 can be suitably adjusted within the required operating times of the other working devices operating simultaneously with the stroke changing device 270, even where the acceleration and deceleration values of the second slide 278 are considerably low. That is, the stroke changing device 270 does not require an increase of the component mounting cycle time, even if the stroke changing device 270 is operated at relatively low acceleration and deceleration values. For this reason, the stroke changing device 270 is not selected as one of the selected working devices whose operations are controlled so as to reduce the magnitude of the overall vibration of the system 12. The acceleration and deceleration values of the second slide 278 in the stroke changing device 270 are set to be sufficiently low values, which however permit the second slide 278 to be moved by the expected maximum distance before the operations of the simultaneously operating other working devices are completed.

Usually, the angular positioning error Δθ of the electronic components 38 is relatively small, and the required angle of rotation of the mounting head 130 by the component-hold-position rectifying device 300 to eliminate the angular positioning error Δθ is accordingly small. Accordingly, the required angle of rotation of the mounting head 130 can be completed before the operations of the other working devices to be effected simultaneously with the rectifying device 300 are completed, even where the mounting head 130 is rotated by the expected maximum angle at relatively low acceleration and deceleration values. Accordingly, the component-hold-position rectifying device 300 is not selected as one of the selected working devices. The acceleration and deceleration values of the rotating motion of the mounting head 130 by the component-hold-position-rectifying device 300 are set to be sufficiently low values, which however permit the mounting head 130 to be rotated by the expected maximum angle (to eliminate the expected maximum positioning error Δθ) before the operations of the simultaneously operating other working devices are completed. Those acceleration and deceleration values are low enough to permit smooth rotation of the mounting head 130, for any kinds of the electronic components 38.

In the component-hold-position rectifying device 300, the rotation of the engaging member 310 from its original angular position to the angular position for engagement with the engaging member 179 is effected during the turning movement of the mounting heads 130 about the axis of rotation of the indexing body 120, as described above. This operation of the rectifying device 300 to rotate the engaging member 310, which is effected to prepare for rotation of the mounting head 130 to eliminate the angular positioning error of the electronic component 38, is effected while the engaging member 310 is not in engagement with the engaging member 179. Accordingly, the mass to be rotated during this preparatory rotation of the engaging member 310 is comparatively small, so that this operation of the rectifying device 300 does not cause a considerable magnitude of vibration, and is performed independently of the electronic component 38. Accordingly, the rotation of the engaging member 310 for engagement with the engaging member 179 can be effected at higher acceleration and deceleration values than the rotation for rectifying the angular position of the electronic component 38. For this reason, the component-hold-position rectifying device 300 is not selected as the selected working devices whose operations are controlled so as to reduce the magnitude of the overall vibration of the system 12.

Figure 14:
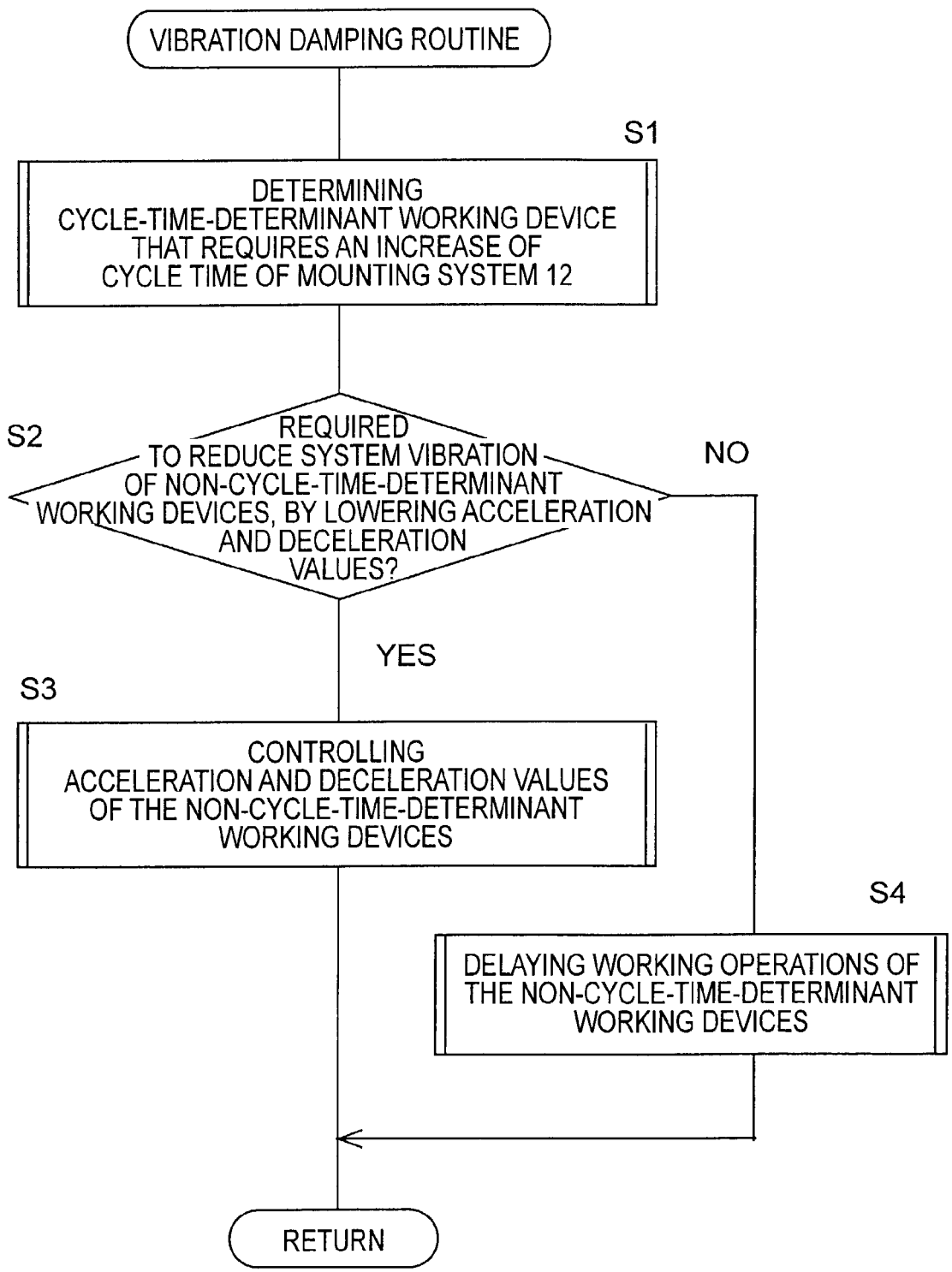
FIG. 14 is a flow chart illustrating a vibration damping routine executed according to a control program stored in a RAM of a computer of the control device.

The determination of the acceleration and deceleration values and the delay times of operations of the working devices so as to reduce the magnitude of the overall vibration of the system 12 are effected according to a vibration damping routine illustrated in the flow chart of FIG. 14, for instance. This vibration damping routine is performed as a part of the component mounting program, before the operation of the system 12 to mount the electronic components 38 on the printed-wiring board 60. The vibration damping routine of FIG. 14 is initiated with step S1 to determine, as a cycle-time-determinant working device, each of at least one of the selected working devices that determines a cycle time of the system 12, which. is a time required for performing a series of operations to mount one electronic component 38 on the printed-wiring board 60.

The determination in step S1 is effected by first obtaining the required operating time of each selected working device if the presently required operation is performed at its predetermined maximum acceleration and deceleration values. Then, the cycle time of the system 12 is determined for each of the selected working devices, on the basis of its required operating time, such that the presently required operation of each selected working device can be performed in a corresponding period of the determined cycle time. On the basis of the thus determined cycle times of the working devices, one of the selected working devices which has the longest cycle time is determined as the above-indicated cycle-time-determinant working device which determines the cycle time of the component mounting cycle time of the system 12.

In the present embodiment, the RAM 506 of the computer 510 stores a plurality of predetermined acceleration and deceleration values of each of the working devices, as indicated in FIG. 13. In this embodiment, the acceleration and deceleration values of each operation have the same absolute value.

The presently required operation of the head-turning device 194 is a rotary motion of the indexing body 120 at the acceleration and deceleration values depending upon the kind of the electronic components 38 to be held by the suction nozzles 190. That is, the ease of displacement or dislocation of the electronic component 38 on the suction nozzle 190 varies depending upon the configuration, dimensions and mass of the electronic component 38. The acceleration and deceleration values of the rotary motion of the indexing body 120 are required to decrease with an increase in the ease of displacement of the electronic component 38 on the suction nozzle 190. Accordingly, the rotating speed of the roller-gear cam used to intermittently rotate the indexing body 120 is determined depending upon the kind of the electronic component 38, namely, depending upon the acceleration and deceleration values suitable to permit the intermittent rotation of the indexing body 120 for moving the electronic component 38 with substantially no displacement on the suction nozzle 190. The thus determined rotating speeds of the roller-gear cam are stored in the RAM 506, as maximum rotating speed values, in relation to the kinds of the electronic components 38. The maximum acceleration and deceleration values for the different kinds of electronic components 38 are determined by the maximum rotating speed values of the roller-gear cam of the head-turning device 194.

In the present embodiment, eight mounting heads 130 of the sixteen mounting heads 130 carried by the indexing body 120 are moved with the respective electronic components 38 while the indexing body 120 is intermittently rotated. The eight electronic components 38 held by the respective eight mounting heads 130 are not necessarily of the same kind. Therefore, the lowest one of the rotating speeds of the roller-gear cam which correspond to the different kinds of the electronic components 38 held by the eight mounting heads 130 is determined as the rotating speed of the roller-gear cam for the indexing body 120. On the basis of the thus determined rotating speed, the time required for one rotation of the roller-gear cam (indexing body 120) is obtained. Generally, the order in which the electronic components 38 are mounted on the printed-wiring board 60 is determined such that the electronic components 38 which are relatively unlikely to be displaced or dislocated on the suction nozzles 190 are mounted before the electronic components 38 which are relatively like to be displaced. According to this order of mounting of the electronic components 38, the rotation of the roller-gear cam at the speed determined for the electronic component 38 held by the suction nozzle 190 at the component-receiving position does not cause displacement of the electronic components 38 present held by the other suction nozzles 190 as well as the electronic component 38 held by the suction nozzle 190 at the component-receiving position. In this respect, the time required for one rotation of the roller-gear cam may be obtained on the basis of the rotating speed determined for the electronic component 38 held by the suction nozzle 190 at the component-receiving position. As described before, the head-turning device 194 is held operated during one rotation of the roller-cam cam. The obtained time required for one rotation of the roller-cam cam is used as the required operating time of the head-turning device 194 corresponding to the maximum permissible acceleration and deceleration values.

The presently required operation of the table-positioning device 46 is a movement of the component supply table 30 or 32 for bringing the component-supply portion of the desired tape feeder to the predetermined component-supplying position. The electronic components 38 are supplied from the component supply tables 30, 32 in the predetermined order. According to this order, table movement data used to move the component supply tables 30, 32 to successively supply the electric components 38 are determined. Accordingly, the distances of movements of the component supply tables 30, 32 required to supply the electronic components 38 can be obtained on the basis of the table movement data. The acceleration and deceleration values of the movement of the component supply table 30, 32 are determined depending upon the required distance of the movement. The required operating time of the table-positioning device 47 is obtained on the basis of the maximum acceleration and deceleration values stored in the RAM 506. These maximum acceleration and deceleration values are used as predetermined maximum acceleration and deceleration values for the presently required movement of the component supply table 30, 32.

In the present embodiment, the tape feeders 36 are arranged on the feeder carriage 34 of each component supply table 30, 32 in the order in which the electronic components 38 are mounted on the printed-wiring board 60. Accordingly, the distance of movement of the component supply table 30, 32 to move the appropriate tape feeder 36 to the component-supplying position for supplying each electronic component 38 is considerably small, that is, equal to the pitch at which the tape feeders 36 are arranged.

The presently required operation of the XY positioning device 64 is a movement of the printed-wiring board 60 so that the mounting spot at which the next electronic component 38 is to be mounted is located right below the mounting head 130 located at the component-mounting position. The electronic components 38 are mounted at the respective mounting spots on the board 60 in the predetermined order. According to this order, board movement data used by the XY positioning device 64 to position the PWB holding device 18 (board 60) are determined. The required operating time of the XY positioning device 64 is determined by the board movement data and the kinds of the electronic components 38 already mounted on the board 60.

The electronic component 38 already mounted on the printed-wiring board 60 is more likely to be displaced or dislocated on the board 60 when the thickness or height dimension of the electronic component 38 is relatively large than when it is relatively small. In view of this tendency, different acceleration and deceleration values of movement of the board 60 are stored in the RAM 506, in relation to the respective different kinds of the electronic components 38 already mounted on the board 60. The kinds of the electronic components 38 already mounted on the board 60 can be obtained on the basis of the component mounting data or program. The required operating time of the XY positioning device 64 is determined on the basis of the acceleration and deceleration values (determined by the kind of the electronic components 38 already mounted on the board 60) and the required distance of movement of the board 60. Where the different kinds of electronic components 38 have been mounted on the board 60, the required operating time of the XY positioning device 64 is determined by the minimum acceleration and deceleration values which correspond to one of the above-indicated different kinds. The acceleration and deceleration values of the movement of the printed-wiring board 60 which are determined by the determined required operating time of the XY positioning device 64 are used as predetermined maximum acceleration and deceleration values for the presently required movement of the board 60.

As described above with respect to the head-turning device 194, the electronic components 38 which are relatively like to be displaced on the printed-wiring board 60 are generally mounted on the board 60 before the electronic components 38 which are relatively unlikely to be displaced. In this respect, the acceleration and deceleration values determined for the electronic component 38 which has been mounted last on the board 60 may be used as predetermined maximum acceleration and deceleration values for the movement of the board 60 for the next electronic component 38. In this case, the required operating time of the XY positioning device 64 is determined on the basis of the these predetermined maximum acceleration and deceleration values.

The printed-wiring board 60 is moved to bring the next mounting spot to the component-mounting position, by a movement of the X-axis slide 74 and a movement of the Y-axis slide 82. Accordingly, the required operating times of the X-axis positioning device 83 and the Y-axis positioning device 85 of the XY positioning device 64 are obtained to determine the required operating time of the XY positioning device 64. The acceleration and deceleration values for the X-axis positioning device 83 and those for the Y-axis positioning device 85 are the same and determined by the kinds of the electronic components 38 already mounted on the board 60. However, the required distances of movements of the X-axis and Y-axis slides 74, 82 are not necessarily the same, and the required operating time of the XY positioning device 64 is determined by the longer one of the required operating times of the X-axis and Y-axis positioning devices 83, 85.

The presently required operation of the Z-axis positioning device 88 is a vertical movement of the printed-wiring board 60 to a Z-axis position suitable for the specific kind of the electronic component 38 to be mounted, that is, to the Z-axis position at which the electronic component 38 is pressed onto the board 60 with an optimum force. Different optimum Z-axis positions of the board 60 are stored in the RAM 506, in relation to the respective different kinds of the electronic components 38.

The height of the printed-wiring board 60 is adjusted to prevent damaging of the electronic component 38 which would take place due to vertical or Z-axis positioning errors of the board 60 and/or the mounting surface 198 of the electronic component 38 as held by the suction nozzle 190. However, these Z-axis positioning errors are obtained during mounting of the electronic component 38. Therefore, the calculation of the required operating time of the Z-axis positioning device 88 before initiation of the component mounting operation is effected on the basis of the Z-axis position of the board 60 determined by the kinds of the electronic component 38, the expected maximum Z-axis positioning error of the electronic component 38, and the maximum acceleration and deceleration values of the Z-axis positioning device 88 stored in the RAM 506. These maximum acceleration and deceleration values are used as predetermined maximum acceleration and deceleration values of the Z-axis positioning device 88. The required operating time of the Z-axis positioning device 88 to adjust the Z-axis position of the printed-wiring board 60 may be obtained on the basis of the maximum acceleration and deceleration values determined by the kinds of the electronic components 38 already mounted on the board 60.

The presently required operation of the angular-component-position changing device 302 is a rotary motion of the mounting head 130 to change the angular position of the electronic component 38 to its mounting angular position. The required angle and direction of rotation of the mounting head 130 are obtained according to the component mounting data, and the acceleration and deceleration of the rotary motion of the mounting head 130 are determined depending upon the kind of the electronic component 38. These acceleration and deceleration values are used as predetermined maximum acceleration and deceleration values for the presently required operation of the angular-component-position changing device 302. Based on the predetermined maximum acceleration and deceleration values and the angle and direction of rotation of the mounting head 130, the required operating time of the angular-component-position changing device 302 is calculated.

In the angular-component-position changing device 302, the engaging member 310 is rotated back to the original angular position, during the turning movement of the mounting head 130, as described above. Thus, the changing device 302 is operated to be ready for the next electronic component 38, after the angular position of the present electronic component 38 has been changed. This rotation of the engaging member 310 back to the original angular position is effected while the engaging member 310 is not in engagement with the engaging member 179. Accordingly, the mass to be rotated during the rotation of the engaging member 310 back to the original angular position is comparatively small, so that this operation of the angular-component-position changing device 302 does not cause a considerable magnitude of vibration, and is performed independently of the electronic component 38. Accordingly, the acceleration and deceleration values for the rotation of the engaging member 310 back to the original angular position can be set to be considerably higher than those for the rotation to change the angular position of the electronic component 38. For this reason, the angular-component-position changing device 302 is not treated as one of the selected working devices, regarding the rotation of the engaging member 310 back to the original angular position.

The presently required operation of the angular-head-position resetting device 304 is a rotary motion of the mounting head 130 to rotate the angular position of the mounting head 130 back to its original angular position. The required angle and direction of rotation of the mounting head 130 are obtained on the basis of the mounting angular position and the angular positioning error of the electronic component 38. However, the angular positioning error of the electronic component 38 as held by the mounting head 130 is obtained during the component mounting operation. Therefore, the required operating time of the angular-head-position resetting device 304 is calculated on an assumption that the electronic component 38 has a predetermined maximum angular positioning error. Since the mounting head 130 located at the angular-head-position resetting position does not carry the electronic component 38, so that the mounting head 130 at this position can be rotated at the second highest acceleration and deceleration values stored in the RAM 506. These acceleration and deceleration values are used as predetermined maximum acceleration and deceleration values for the presently required rotation of the mounting head 130, which are used to calculate the required operating time of the angular-head-position resetting device 304.

In the angular-head-position resetting device 304, the engaging member 310 is first rotated to the angular position for engagement with the engaging member 179, during the turning movement of the mounting head 130, as described above. Thus, the resetting device 304 is operated to enable the engaging member 310 to rotate the engaging member 179 to reset the mounting head 130 to the original angular position. This preparatory rotation of the engaging member 310 is effected while the engaging member 310 is not in engagement with the engaging member 179. Accordingly, the mass to be rotated during this preparatory rotation of the engaging member 310 is comparatively small, so that this operation of the angular-head-position resetting device 304 does not cause a considerable magnitude of vibration, and is performed independently of the electronic component 38. Accordingly, the acceleration and deceleration values for the preparatory rotation of the engaging member 310 can be set to be considerably higher than those for the rotation to reset the mounting head 130 to the original angular position. For this reason, the angular-head-position resetting device 304 is not treated as one of the selected working devices, regarding the preparatory rotation of the engaging member 310. The mounting head 130 at the angular-head-position resetting position may be rotated at the maximum acceleration and deceleration values stored in the RAM 506, rather than the second highest acceleration and deceleration values.

In the present embodiment, the engaging member 310 of each of the component-hold-position rectifying device 300, angular-component-position changing device 302 and angular-head-position resetting device 304 is engageable with the engaging member 179 of each mounting head 130, at two angular positions (i.e., 0° and 180° positions). If the engaging members 310 and 179 are engageable with each other at three angular positions (0°, 120° and 240° positions), the required angle of rotation of the engaging member 310 for engagement with the engaging member 179 to rectify, change or reset the angular position of the electronic 38 or mounting head 130 can be reduced. Further, the required angle of rotation of the engaging member 310 back to the original position after rectifying, changing or resetting the angular position can also be reduced. In this case, the required operating amounts of the rectifying, changing and resetting devices 300, 302, 304 are comparatively small, so that the engaging member 310 can be rotated at comparatively high acceleration and deceleration values even where the mass to be rotated is relatively large. Accordingly, the operations of the devices 300, 302, 304 can be completed before the operations of the other working devices are completed. In the present case, the acceleration and deceleration values for the devices 300, 302, 304 are set to be comparatively small. In this respect, the devices 300, 302, 304 are not treated as the selected working devices.

The presently required operation of the nozzle-holder selecting device, 340 is a rotary motion of the rotary holder 186 to bring a selected one of the nozzle holders 189 (holding the suction nozzles 190) into the operating position, that is, to bring the suction nozzle 190 for holding the next electronic component 38 into the operating position. The nozzle holder 189 to be placed in the operating position is selected according the component mounting data. The required operating time of the nozzle-holder selecting device 340 is calculated on the basis of the required angle of rotation of the rotary holder 186 to select the desired nozzle holder 189 and the maximum acceleration and deceleration values of the device 340 stored in the ROM 506. These maximum acceleration and deceleration values are used as predetermined maximum acceleration and deceleration values for the presently required rotary motion of the rotary holder 186.

After the required operating times of the selected working device, that is, after the times required for the selected working devices to perform the presently required operations at the predetermined maximum acceleration and deceleration values have been obtained, the operating cycle times of the selected working devices are determined so that the presently required operations can be performed for the obtained required operating times. The operating cycle time of the head-turning device 194 is equal to the required operating time obtained on the basis of the predetermined maximum acceleration and deceleration values. The operating cycle times of the other selected working devices are obtained on the basis of the required angle of rotation of the roller-gear cam for the appropriate working device, and its required operating time obtained on the basis of the predetermined acceleration and deceleration values. One of the selected working devices (including the head-turning device 194) which has the longest cycle time is determined as the cycle-time-determinant working device that requires an increase of the cycle time of the system 12.

Step S1 in which the cycle-time-determinant working device is determined is followed by step S2 to determine whether it is required to reduce the magnitude of the overall vibration of the system 12, by suitably determining or controlling the acceleration and deceleration values of the selected working devices except the cycle-time-determinant working device. If a negative decision (NO) is obtained in step S2, it means that it is required to reduce the magnitude of the overall vibration of the system 12, by delaying the moments of initiation of the presently required operations of the selected working devices except the cycle-time-determinant working device. The reduction of the overall vibration of the system 12 by either controlling the acceleration and deceleration values or delaying the moments of initiation of the presently required operations is manually selected by the machine operator, using an input device 530, for example, or automatically selected according to a command received from a host computer (not shown), for instance.

If an affirmative decision (YES) is obtained in step S2, the control flow goes to step S3 to determine the acceleration and deceleration values of all of the selected working devices. In Step S3, the predetermined maximum acceleration and deceleration values used to obtain the required operating time of the cycle-time-determinant working device are used as the actual acceleration and deceleration values for the presently required operation of the cycle-time-determinant working device. On the other hand, the actual acceleration and deceleration values of the other selected working devices (non-cycle-time-determinant working devices) are determined to be the lowest values such that the presently required operation of each non-cycle-time-determinant working device can be completed within respective predetermined periods of the cycle time determined by the cycle-time-determinant working device.

If the head-turning device 194 is the cycle-time-determinant working device, the actual acceleration and deceleration values of the other selected working devices are determined to be the lowest values such that the presently required operation of each of those non-cycle-time-determinant working devices can be completed within a corresponding period of the cycle time of the head-turning device 194. As described below, the angular ranges of the roller-gear cam are predetermined for the selected working devices except the head-turning device 194. The corresponding periods of the cycle time of the head-turning device 194 which correspond to the respective other selected working devices can be obtained on the basis of the above-indicated angular ranges of the roller-gear cam corresponding to the selected working devices.

When any one of the selected working devices except the head-turning device 194 is the cycle-time-determinant working device, the rotating speed of the roller-gear cam for the head-turning device 194 and the actual acceleration and deceleration values of the head-turning device 194 are determined so as to provide a cycle time cycle time determined by the cycle-time-determinant working device. The thus determined actual acceleration and deceleration values of the head-turning device 194 are lower than the predetermined maximum acceleration and deceleration values which are used to determine the required operating time of the head-turning device 194. Further, the actual acceleration and deceleration values for each of the selected working devices except the head-turning device 194 and the cycle-time-determinant working device are selected from among a plurality of pairs of predetermined acceleration and deceleration values set for each of those selected working devices. The operating period of each of those selected working devices is determined on the basis of the cycle time of the system 12 determined by the cycle-time-determinant working device, and the predetermined angular range of the roller-gear cam assigned to each of those selected working devices. One of a plurality of pairs of predetermined acceleration and deceleration values which provides the lowest values and which permits the presently required operation to be performed within the corresponding period of the determined cycle time is selected as the actual acceleration and deceleration values. Namely, the actual acceleration and deceleration values of each non-cycle-time-determinant working device are selected to be the lowest that permits the presently required operation of each non-cycle-time-determinant working device to be completed within the determined operating period corresponding to the above-indicated predetermined angular range of the roller-gear cam assigned to that selected working device.

Figure 15:
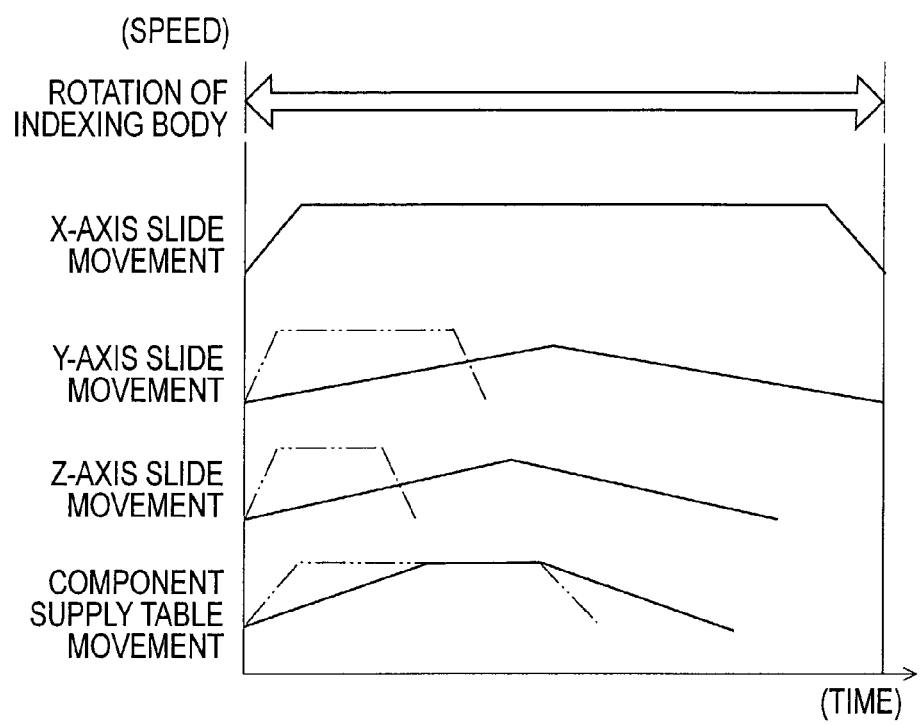
FIG. 15 is a view for explaining a manner in which the acceleration and deceleration values of the working devices are lowered according to the vibration damping routine, to reduce the magnitude of vibration of the electronic-component mounting system.

The determination of the actual acceleration and deceleration values of the selected working devices so as to reduce the magnitude of the overall vibration of the system 12 will be described referring to FIG. 15, with respect to the table-positioning device 46, XY positioning device 64 and Z-axis positioning device 88, by way of example. Portions of the operations of those working devices take place concurrently with each other. The distance of vertical movement of the printed-wiring board 60 by the Z-axis positioning device 88 and the distance of movement of the component supply table 30, 32 by the table-positioning device 46 are comparatively small, as described above. If the distance of movement of the printed-wiring board 60 in the X-axis direction is larger than that in the Y-axis direction, and if the X-axis positioning device 83 is the cycle-time-determinant working device, the X-axis slide 74 is moved at the maximum acceleration and deceleration values determined by the kinds of the electronic components 38 already mounted on the printed-wiring board 60, such that the speed of movement of the X-axis slide 74 changes as indicated in FIG. 15. It is noted that the change of the speed of movement of the X-axis slide 74 is represented by broken lines in FIG. 15, for easier understanding, although the speed of movement actually changes smoothly.

The actual acceleration and deceleration values of movement of the Y-axis slide 82 by the Y-axis positioning device 85 are determined to be lower than the maximum acceleration and deceleration values determined by the kinds of the electronic components 38 mounted on the board 60, more precisely, determined to be the lowest within a range in which the required distance of movement of the Y-axis slide 82 can be completed during the movement of the X-axis slide 74 by the required distance. As a result of the movements of the X-axis and Y-axis slides 74, 82 by the X-axis and Y-axis positioning devices 83, 85, the printed-wiring board 60 takes a curved path of movement. Although this curved path of movement of the board 60 is longer than a linear path, the magnitude of the vibration upon initiation and termination of the movement of the board 60 is significantly reduced. Similarly, the actual acceleration and deceleration values of the Z-axis positioning device 88 and table-positioning device 46 are determined to be lower than the maximum acceleration and deceleration values. The speed of rotation of the roller-gear cam of the head-turning device 194 is determined to provide the cycle time which is determined or required by the cycle-time-determinant working device. Accordingly, the indexing body 120 is rotated at least during the operation of the X-axis positioning device 83.

By determining the acceleration and deceleration values of the Y-axis positioning device 85, Z-axis positioning device 88 and table-positioning device 46 as described above, the speeds of movements of the Y-axis slide 82, printed-wiring board 60 and component supply table 30, 32 are changed as indicated by solid lines in FIG. 15, with lower acceleration and deceleration values than where the movements take place at the maximum acceleration and deceleration values as indicated by two-dot chain line in the same figure.

The actual acceleration and deceleration values of the selected working devices such as the angular-component-position changing device 302, angular-head-position resetting device 304 and nozzle-holder selecting device 340, which are not operated concurrently with the X-axis positioning device 83, are determined to be the lowest values such that the presently required operations of those selected working devices can be completed within respective predetermined periods of the cycle time determined by the required operating time of the X-axis positioning device 83.

As described above, the present electronic-component mounting system 12 is arranged to determine or select the actual acceleration and deceleration values of each of the non-cycle-time-determinant working devices of the system 12, depending upon the cycle-time-determinant working device that determines the cycle time of the system 12, such that the determined or selected actual acceleration and deceleration values of each non-cycle-time-determinant working devices are lower than its maximum acceleration and deceleration values. This arrangement is effective to reduce the amounts of impact and the magnitudes of vibrations upon initiation and termination of the linear, rotary and turning movements of the operating members of the selected working devices, providing advantages such as improved accuracy of mounting of the electronic components 38, and reduced occurrence of a failure of the mounting heads 130 to receive the electronic components 38 from the component-supplying device 14.

If the negative decision (NO) is obtained in step S2, it means that it is required to reduce the magnitude of the overall vibration of the system 12, by delaying the moments of initiation of the presently required operations of the selected working devices except the cycle-time-determinant working device. In this case, the control flow goes to step S4 in which the moments of initiation of the presently required operations of the non-cycle-time-determinant working device are delayed such that the presently required operations of the non-cycle-time-determinant working devices can be completed within respective periods of the cycle time of the system 12 determined by the cycle-time-determinant working device.

Figure 16:
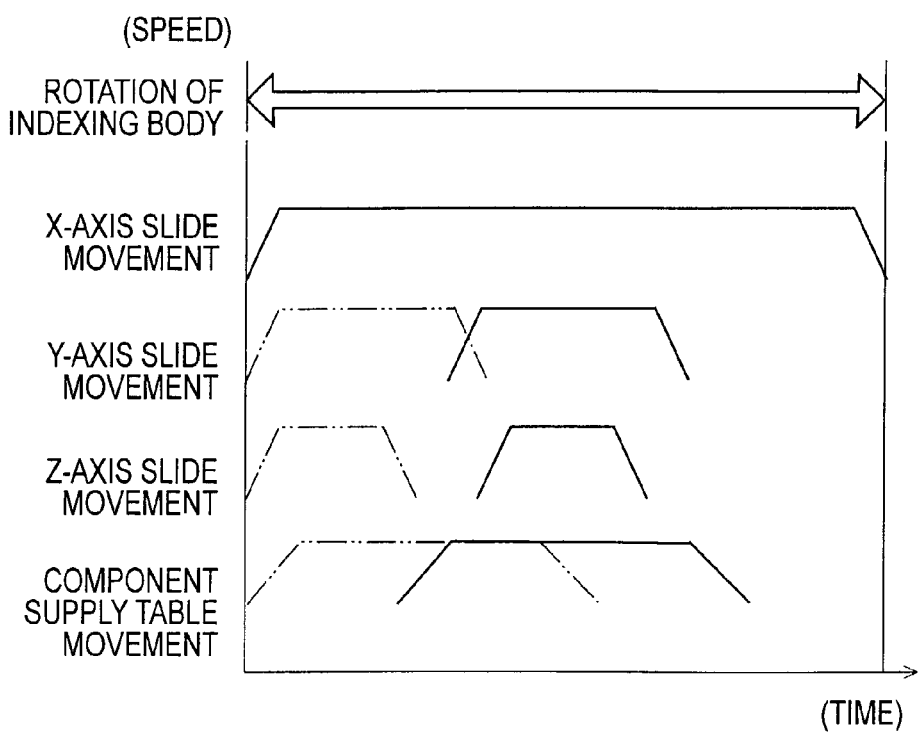
FIG. 16 is a view for explaining a manner in which the operations of the working devices are delayed according to the vibration damping routine, to reduce the magnitude of vibration of the system.

If the working devices consist of the head-turning device 194, table-positioning device 46, and X-axis, Y-axis and Z-axis positioning devices 83, 85, 88 for the printed-wiring board 60, and if the X-axis positioning device 83 is the cycle-time-determinant working device, the operation of the X-axis positioning device 83 is initiated and terminated in synchronization with the rotation of the roller-gear cam of the head-turning device 194 or the intermittent rotation of the indexing body 120, as indicated by solid line in FIG. 16. Since the required operating times of the table-positioning device 46 and the Y-axis and Z-axis positioning devices 85, 88 are shorter than that of the X-axis positioning device 83, the moments of initiation of the operations of those devices 46, 85, 88 can be delayed, provided these operations are completed on or before the moment of termination of the operation of the X-axis positioning device 83. In the example of FIG. 16, the operations of the devices 46, 85, 88 are not initiated at the same time as the operation of the X-axis positioning device 83 (as indicated by two-dot chain lines), but are initiated after the moment of initiation of the device 83, at respective different moments or times as indicated by solid lines.

In the example of FIG. 16, the moments of initiation of the operations of the table-positioning device 46 and the Y-axis and Z-axis positioning devices 85, 88 are delayed such that intermediate points of the delayed operations of the devices 46, 85, 88 are aligned with an intermediate point of the operation of the X-axis positioning device 83. This arrangement makes it possible to complete the operations of both the cycle-time-determinant working device 83 and the non-cycle-time-determinant working devices 46, 85, 88, at respective different times or moments. Since the required operating times of the selected working devices 83, 85, 88, 46 are different from each other, the above-indicated arrangement also makes it possible to initiate the operations of those devices at respective different moments. Where the moments of initiation of the operations of the non-cycle-time-determinant working devices are delayed, these working devices are operated at their predetermined maximum acceleration and deceleration values which are used to determine the cycle-time-determinant working device.

In the example of FIG. 6, the moments of initiation of the non-cycle-time-determinant working devices 46, 85, 88 are further determined such that the operations are initiated in the order of the required operating time, that is, such that the operation of the table-positioning device 46 having the longest operating time is initiated first, the operation of the Y-axis positioning device 85 having the intermediate operating time is initiated next, and the operation of the Z-axis positioning device 88 having the shortest operating time is initiated last. The moments of initiation of the working devices 46, 85, 88 are further determined such that the operation of the Y-axis positioning device 85 is initiated upon termination of the acceleration of the table-positioning device 46, and the operation of the Z-axis positioning device 88 is initiated upon termination of the acceleration of the Y-axis positioning device 85. If any of the non-cycle-time-determinant working devices whose operations are initiated in the order and manner described above could not be completed within the cycle time of the cycle-time-determinant working device (X-axis positioning device 83) or indexing body 120, this non-cycle-time-determinant working device must be initiated so that the operations of all of the selected working devices can be completed within the cycle time.

Thus, the presently required operations of the table-positioning device 46 and the Y-axis and Z-axis positioning devices 85, 88 are initiated at respective different moments and terminated at respective different moments, such that the operations of those non-cycle-time-determinant working devices 46, 85, 88 can be completed within the cycle time of the system 12 determined by the predetermined maximum acceleration and deceleration values of the X-axis positioning device 83, which is the cycle-time-determinant working device. However, the moments of initiation of the non-cycle-time-determinant working devices may be determined otherwise, provided the operations of all of the non-cycle-time-determinant working devices are completed within the cycle time.

The moments of initiation of the operations of the non-cycle-time-determinant working devices (e.g., angular-component-position changing device 302, angular-head-position resetting device 304 and suction-holder selecting device 340) which are not performed concurrently with the operation of the cycle-time-determinant working device (e.g., X-axis positioning device 83) are delayed such that the operations of these cycle-time-determinant working devices 302, 304, 340 can be completed within the respective predetermined periods of the cycle time determined by the X-axis positioning device 83. Since the required operating times of those cycle-time-determinant working devices 302, 304, 340 which are not performed concurrently with the cycle-time-determinant working device 83 are shorter than the required operating time of the cycle-time-determinant working device 83, the operations of those non-cycle-time-determinant working devices 302, 304, 340 can be completed within the respective predetermined periods of the cycle time, even where the moments of initiation of the operations are delayed.

The foregoing description refers to the manners of reducing the magnitude of the overall vibration of the system 12 when one electronic component 38 is mounted on one printed-wiring board 60. The component mounting program for each printed-wiring board 60 incorporates a program for executing the vibration damping routine of FIG. 14 to determine the acceleration and deceleration values and delay the moments of initiation, of the operations of the non-cycle-time-determinant working devices, for all of the electronic components 38 to be mounted on the board 60. The magnitude of the overall vibration of the electronic-component mounting system 12 can be effectively reduced owing to the time-differential delay of the moments of initiation of the operations of the two or more selected working devices, portions of which take place concurrently with each other.

It will be understood from the foregoing description that portions of the control device 500 assigned to implement steps S1, S2, S3 and S4 constitute determinant-device determining means, vibration-damping-mode setting or selecting means, slowdown means and operation-delaying means, respectively. The determinant-device determining means is arranged to determine, as at least one cycle-time-determinant working device, at least one of the plurality of selected working devices that determines the cycle time of the electronic-component mounting system 12. The vibration-damping-mode setting or selecting means is arranged to select either the determination of the acceleration and deceleration values of each non-cycle-time-determinant working device, or the delaying of the moment of initiation of an operation of each non-cycle-time-determinant working device, for reducing the magnitude of the overall vibration of the system 12. The slowdown means is arranged to determine the actual acceleration and deceleration values or operating speed of each of at least one of the non-cycle-time-determinant working devices, so as to be lower than the predetermined maximum acceleration and deceleration values or operating speed, such that the presently required operation can be completed within a predetermined period of the cycle time determined by the cycle-time-determinant working device. The operation-delaying means is arranged to delay the moments of initiation of the presently required operation of each of at least one of the non-cycle-time-determinant working devices, such that the operation can be completed within a corresponding period of the cycle time.

While the sixteen mounting heads 130 are turned about the vertical common axis by the head-turning device 194 in the embodiment described above, the principle of the present invention is applicable to an electric-component mounting system which uses a mounting head that is arranged to be movable in the X-axis and Y-axis directions by an XY positioning device in an XY plane parallel to the plane of a printed-wiring board. An example of this type of electric-component mounting system will be described as a second embodiment of this invention, by reference to FIGS. 17–24. This mounting system is constructed as disclosed in Japanese Patent No. 2824378.

Figure 17:
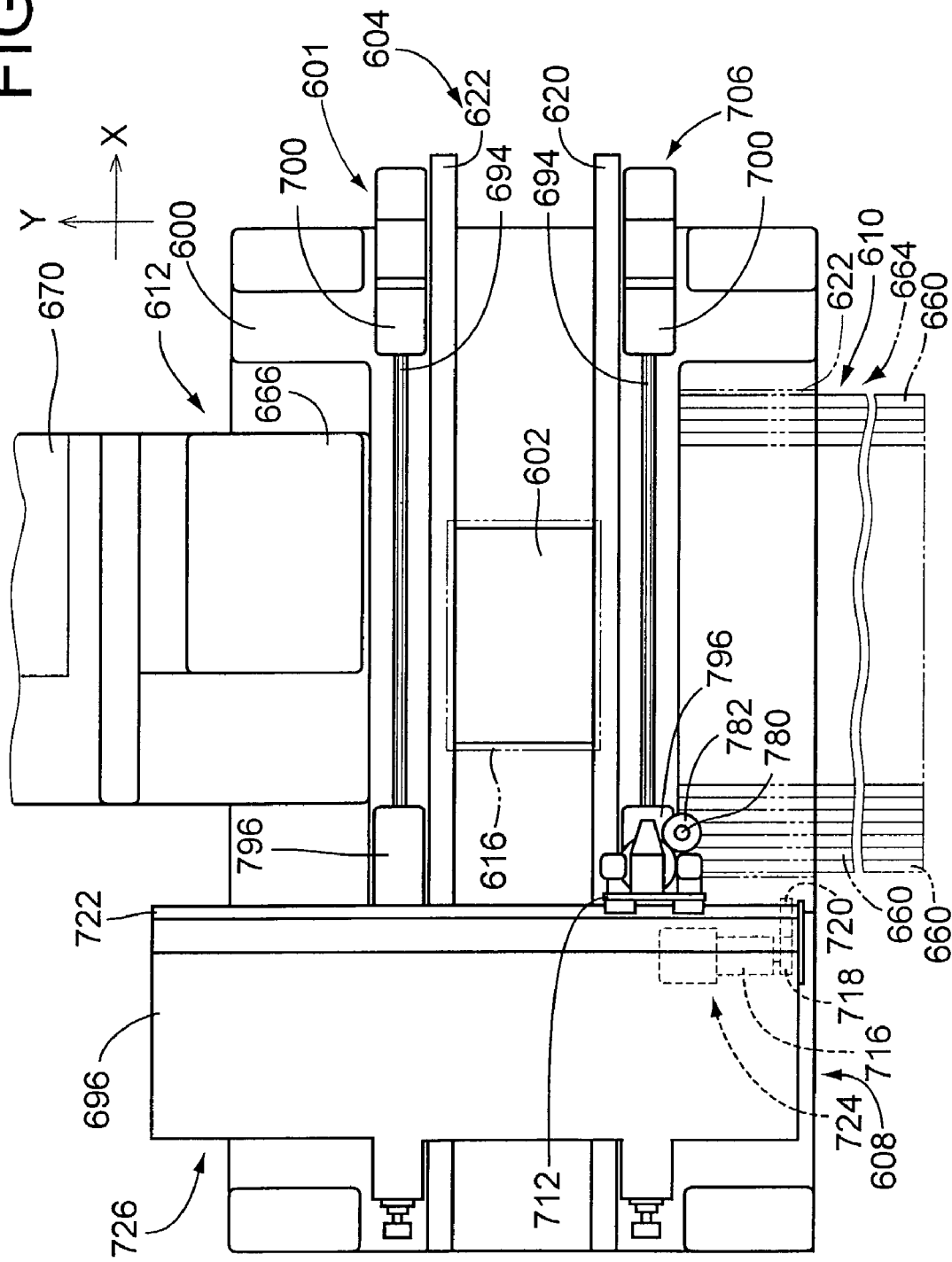
FIG. 17 is a plan view showing an electronic-component mounting system according to another embodiment of this invention.

Referring to FIG. 17, the electronic-component mounting system according to the second embodiment is shown generally at 601. The electronic-component mounting system 601 has a main body in the form of a machine base 600. The present mounting system 601 includes a printed-wiring board conveyor (PWB conveyor) 604, a component-mounting device 608 and component-supplying devices 610, 612, which are mounted on the machine base 600. The PWB conveyor 604 is arranged to transfer a circuit substrate in the form of a printed-wiring board 602 in an X-axis direction (in the left and right directions as seen in FIG. 17). The component-mounting device 608 is arranged to mount electric components in the form of electronic components 606 (shown in FIG. 19)on the printed-wiring board 602. The component-supplying devices 610, 612 are arranged to supply the component-mounting device 608 with the electronic components 606.

In the present second embodiment, the printed-wiring board 602 is transferred by the PWB conveyor 604 such that the printed-wiring board 602 maintains a horizontal attitude or posture. The PWB conveyor 14 is stopped by a suitable stopper device (not shown), to locate the board 602 at a predetermined component-mounting position. The board 602 located at the component-mounting position is supported by a circuit-substrate holding device in the form of a printed-wiring-board holding device (PWB holding device) 616. In the present electronic-component mounting system 601, the printed-wiring board 602 is supported such that a component-mounting surface 618 (shown in FIG. 20) of the board 602 on which the electronic components 606 are mounted is parallel to the horizontal plane. The above-indicated X-axis direction is parallel to an X axis of an XY coordinate system in an XY plane parallel to the horizontal component-mounting surface 618.

Figure 21:
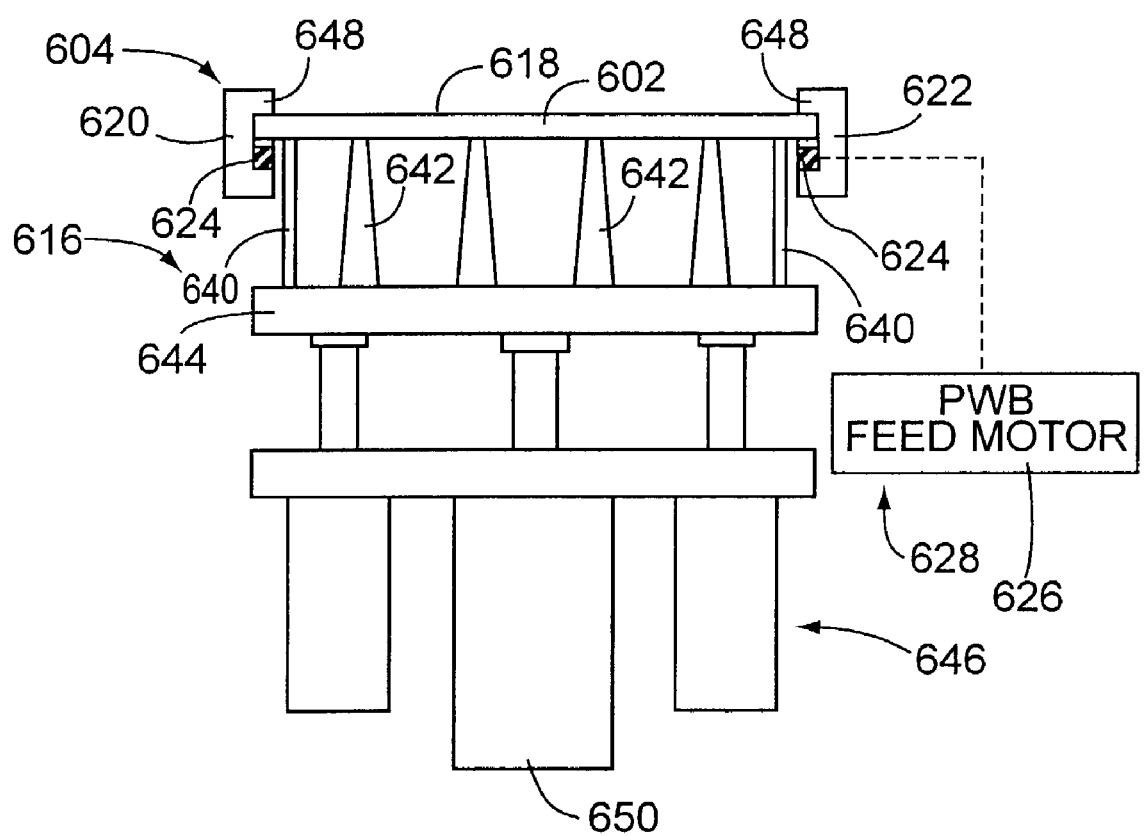
FIG. 21 is a side elevational view showing a printed-wiring-board holding device of the electronic-component mounting system of FIG. 17.

The PWB conveyor 604 is provided with a pair of guide rails 620, 622, as schematically shown in FIGS. 17 and 21. Each of the guide rails 620, 622 is constructed to guide an endless conveyor belt 624 such that the belt 624 can travel in a hoop. The printed-wiring board 602 is placed on the conveyor belts 624, and is transferred by the conveyor belts 624 when the conveyor belts 624 are rotated in synchronization with each other by a drive source in the form of a belt drive device 628 which includes a printed-wiring-board feed motor (PWB feed motor) 626, as indicated in FIG. 21.

Figure 18:
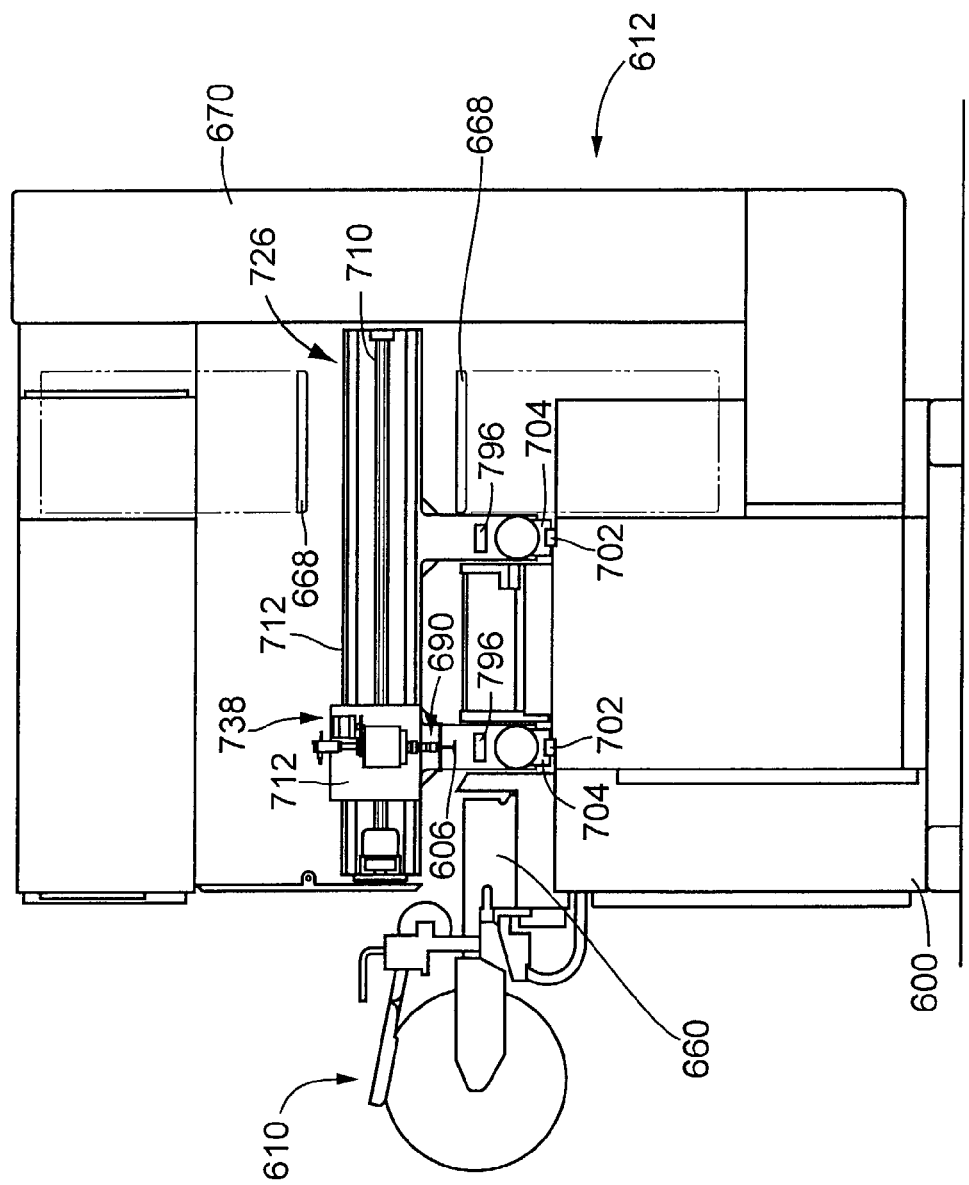
FIG. 18 is a side elevational view showing the electronic-component mounting system of FIG. 17.

As schematically shown in FIGS. 17 and 18, the PWB holding device 616 includes a pair of clamping members 640 and a plurality of support members 642. The clamping members 640 are fixed upright at the respective opposite ends of an elevator platform 644, which is lifted and lowered by an elevator drive device 646. The support members 642 are fixed upright in an intermediate width portion of the elevator platform 644 between the two clamping members 640. The elevator platform 644 is located under the printed-wiring board 602 at the predetermined component-mounting position, such that the elevator platform 644 is opposed to the lower surface of the board 602 which is opposite to the component-mounting surface 618. The guide rails 620, 624 are provided with hold-down portions 648. When the elevator platform 644 is placed at its elevated operating position, the clamping members 640 hold the board 602 apart from the upper surfaces of the conveyor belts 624 such that the board 602 is clamped at its opposite ends corresponding to the conveyor belts 624, in pressing contact with the upper ends of the clamping members 640 and the hold-down portions 648. In the present embodiment, the elevator drive device 646 uses as a drive source a fluid-actuator actuator or a fluid-operated cylinder in the form of an air cylinder 650.

The component-supplying devices 610, 612' are spaced from each other in a Y-axis direction perpendicular to the X-axis direction, and located on the opposite sides of the PWB conveyor 604, as shown in FIGS. 17 and 18. In the present embodiment, the component-supplying device 610 is of tape feeder type, while the component-supplying device 612 is of tray type.

The component-supplying device 610 of tape feeder type has a component supply table 664, which includes a feeder carriage 662 and a multiplicity of tape feeders 660 that are mounted on the feeder carriage 622 such that the component-supply portions of the tape feeders 660 are arranged along a straight line parallel to the X-axis direction. Like the tape feeder 36 used in the first embodiment, each of the tape feeders 660 uses a carrier tape accommodating a succession of electronic components 606.

The component-supplying device 612 of tray type includes a multiplicity of component trays 666 as shown in FIG. 17. The component trays 666, which accommodate the electronic components 606, are accommodated in respective multiple tray boxes 668, which are vertically arranged and are supported by respective support members. The tray boxes 668 are elevated one after another by an elevator device disposed within a column 670, to a predetermined component-supply position. For a mounting head 690 (which will be described) to receive the electronic components 606 from the component tray 666 in the tray box 668 located at the component-supply position, some vertical space must be provided above the component-supply position. To provide this vertical space, the tray box 668 from which the electronic components 606 have been transferred to the mounting head 690 is moved further upwards from the component-supply position to a predetermined retracted position when the next tray box 668 is moved to the component-supply position, so that the required vertical space is provided between the component-supply position and the retracted position. The component-supplying device 612 of tray type is identical in construction with a component-supplying device disclosed in JP-B2-2-57719.

Figure 19:
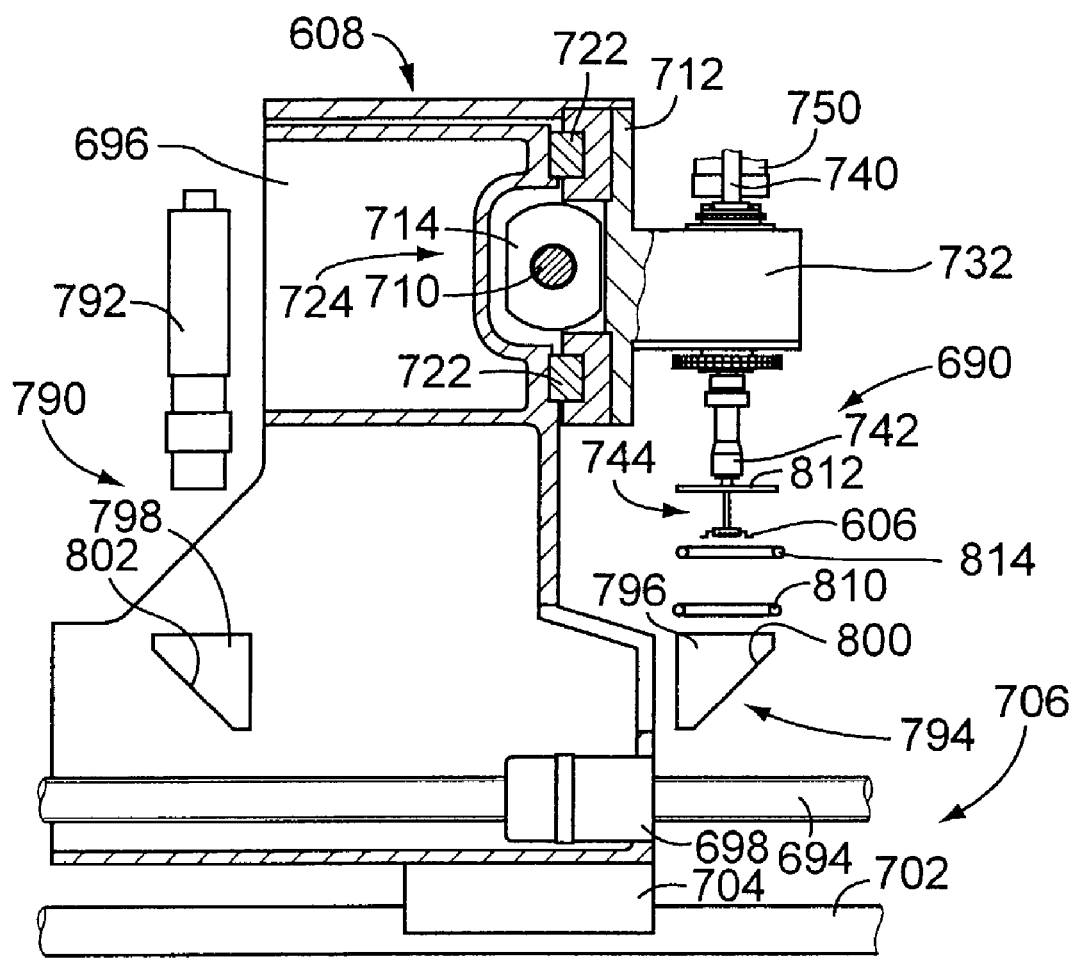
FIG. 19 is a front elevational view partly in cross section showing the electronic-component mounting system of FIG. 17.

The mounting head 690 of the component-mounting device 608 is movable in the mutually perpendicular X-axis and Y-axis directions, so that the mounting head 690 can take a linear movement having X-axis and Y-axis components, to move each electronic component 606 to a desired position on or above the component-mounting surface 618 of the printed-wiring board 602. To move the mounting head 690 in the X-axis direction, the component-mounting device 608 includes two ballscrews 694 disposed on the machine base 600, on the opposite sides of the PWB conveyor 612, so as to extend in the X-axis direction, as shown in FIG. 17, and an X-axis slide 696 having two ballnuts 698 (only one of which is shown in FIG. 19) which engage the respective ballscrews 694. The component-mounting device 708 further includes two X-axis drive motors 700 for rotating the ballscrews 694, for moving the X-axis slide 696 in the X-axis direction.

As shown in FIG. 17, the X-axis slide 696 extends in the Y-axis direction across the PWB conveyor 604, and has a length corresponding to the distance between the component-supplying device 610 of feeder type and the component-supplying device 612 of tray type. On the machine base 600, there are disposed two guide rails 702 (shown in FIG. 19) located under the respective ballscrews 694. The X-axis slide 696 has two guide blocks 704 which slidably engage the guide rails 702, for guiding the X-axis slide 696 in the X-axis direction. It will be understood that the ballscrews 694, ballnuts 698 and X-axis drive motors 700 cooperate with each other to constitute an X-axis positioning device 706.

On the X-axis slide 696, there is disposed a ballscrew 710 so as to extend in the Y-axis direction, as shown in FIG. 19. The X-axis slide 696 carries a Y-axis slide 712 having a ballnut 714 which engages the ballscrew 710. The ballscrew 710 is rotated by a Y-axis drive motor 716 (shown in FIG. 17) through gears 718, 720, so that the Y-axis slide 712 is moved in the Y-axis direction while being guided by a pair of guide rails 722 (FIG. 19). It will be understood that the ballscrew 710, ballnut 714 and Y-axis drive motor 716 constitute a Y-axis positioning device 724, and that the Y-axis positioning device 724 cooperates with the X-axis slide 696, X-axis positioning device 706 and Y-axis slide 712, to constitute an XY positioning device 726 operable to move the mounting head 690 to a desired position in the XY plane.

The Y-axis slide 712 has a support portion 732 on which there are mounted the above-indicated mounting head 690, a head elevating and lowering device 734 for moving up and down the mounting head 690 in a Z-axis direction, and a head-rotating device 736 about its axis. The mounting head 690, the head elevating and lowering device 734 and the head-rotating device 736 constitute a component-mounting unit 738. Although the component-mounting device 608 in the present electronic-component mounting system 601 includes only one component-mounting unit, the system may include a plurality of component-mounting units. For instance, two or more component-mounting units are disposed on the Y-axis slide 712 such that the units are arranged in a row in the Y-axis direction.

The component-mounting unit 738 in the present embodiment is identical with a component-mounting unit as disclosed in JP-B2-4-3093339. The component-mounting unit 738 will be described only briefly. The support portion 732 of the Y-axis slide 712 carries a rotary shaft 740 which is movable in the Z-axis direction and rotatable about a vertical axis. The rotary shaft 740 has a nozzle holder 742 at its lower end portion. The nozzle holder 742 is provided to removably hold a component holder in the form of a suction nozzle 744. In the present embodiment, the nozzle holder 732 and the rotary shaft 740 constitute the mounting head 690. The Z-axis direction is perpendicular to the X-axis and Y-axis directions which define the XY plane parallel to the horizontal component-mounting surface 618 of the printed-wiring board 602.

Figure 20:
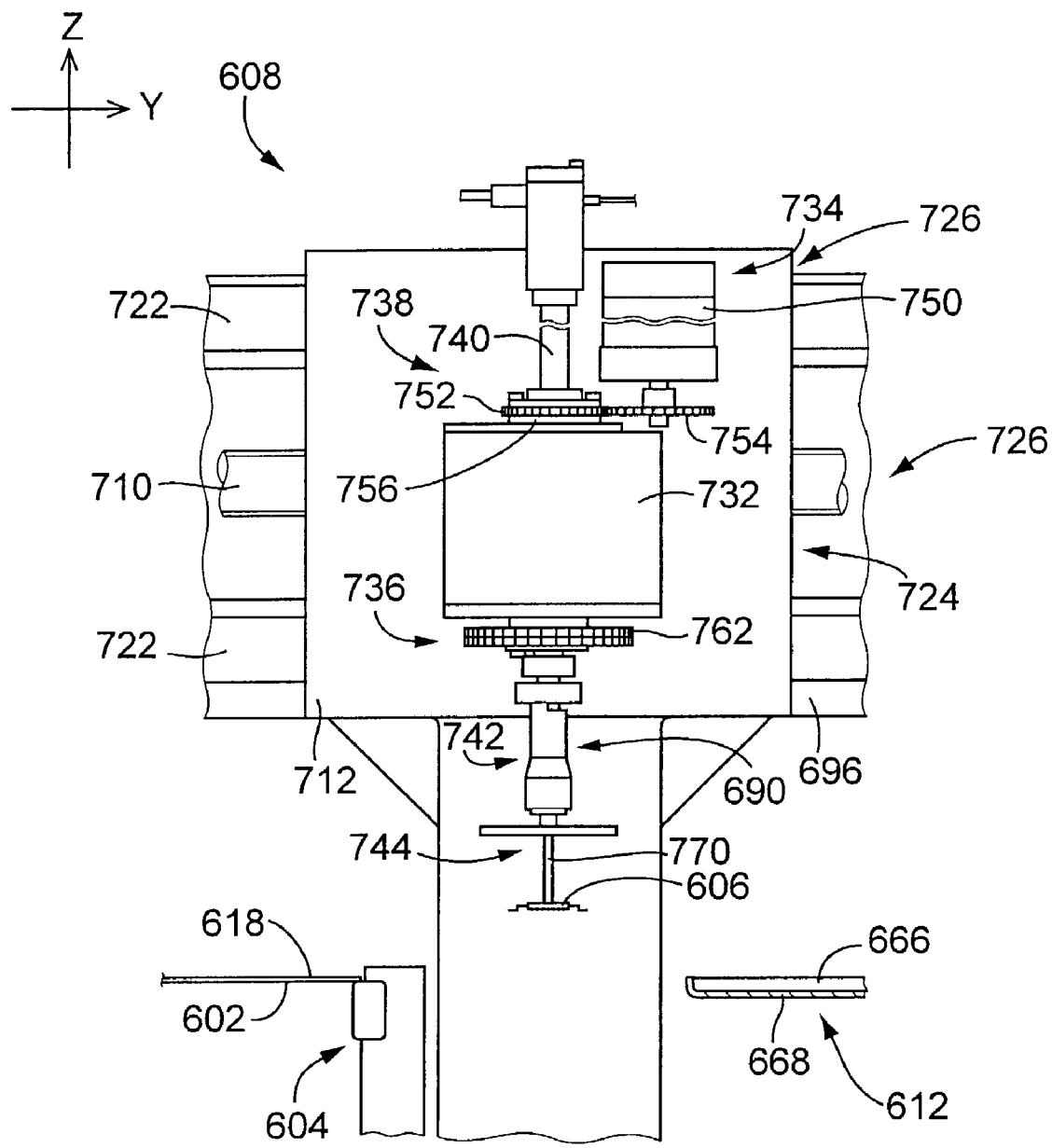
FIG. 20 is a side elevational view showing a mounting head of the electronic-component mounting system of FIG. 17.

As shown in FIG. 20, the head elevating and lowering device 734 includes a vertical drive motor 750 as a drive source, a motion transmitting device including gears 752, 654, and a ballnut 756. A rotary motion of the vertical drive motor 750 is transmitted through the motion transmitting device to the ballnut 756, so that the rotary shaft 740 engaging the ballnut 756 is vertically moved to move the mounting head 690 in the Z-axis direction. The head-rotating device 736 includes a rotary drive motor 760 (shown in FIG. 22), and a motion transmitting device including a gear 762. A rotary motion of the rotary drive motor 760 is transmitted to the rotary shaft 740 through the motion transmitting device, so that the rotary shaft 740 is rotated about its axis to rotate the mounting head 690.

The suction nozzle 744 is arranged to hold the electronic component 606 by suction under a negative pressure, so that the electronic component 606 is transferred from the suction nozzle 744 onto the printed-wiring board 602. The suction nozzle 744 is connected to a negative-pressure source, a positive-pressure source and the atmosphere, which are not shown. With a switching operation of a solenoid-operated directional control valve, a suction tube 770 of the suction nozzle 744 is selectively communicated with the negative- and positive-pressure sources and the atmosphere.

The Y-axis slide 712 further carries a stationary image-taking device in the form of a fiducial-mark camera 780 (shown in FIG. 17) operable to take an image of fiducial marks (not shown) provided on the printed-wiring board 602. In the present second embodiment, the fiducial-mark camera 780 is a CCD camera capable of taking a two-dimensional images of the fiducial marks. An illuminating device 782 is provided to illuminate the fiducial marks and its vicinity.

The X-axis slide 696 is provided with two image-taking devices 790, which are disposed at respective Y-axis positions at which the respective two ballscrews 694 are disposed. Namely, one of the two image-taking devices 790 is located between the component-supplying device 610 of feeder type and the PWB conveyor 604 (printed-wiring board 602 placed thereon), while the other image-taking device 790 is located between the component-supplying device 612 of tray type and the PWB conveyor 604. The two image-taking devices 790 are identical in construction with each other.

Each image-taking device 790 includes a component camera 792 for taking an image of the electronic component 606, and a light guiding device 794, as shown in FIG. 19. The light guiding device 794 includes a reflecting device in the form of reflecting mirrors 796, 798, which are attached through respective brackets to the underside of the X-axis slide 690. The reflecting mirror 796 is disposed at a position within a path of movement of the mounting head 690 in the Y-axis direction, and ha a reflecting surface 800 which is inclined about 45° with respect to a vertical plane including the centerline of the suction nozzle 844, such that one of the opposite ends of the reflecting surface 800 (as viewed in the X-axis direction) which is closer to the X-axis slide 696 is the lower end, that is, the left end of the reflecting surface 800 is the lower end.

The other reflecting mirror 798 is disposed on the side of the X-axis slide 696 which is remote from the reflecting mirror 796, and has a reflecting surface 802 which is inclined with respect to the vertical plane, symmetrically with the reflecting surface 800. The component camera 792 for taking the image of the electronic component 606 held by the suction nozzle 744 is located on the side of the X-axis slide 696 remote from the mounting head 690, such that the component camera 792 faces downwards toward the reflecting surface 802 of the reflecting mirror 798.

In the above arrangement of the image-taking device 790, the image of the electronic component 606 held by the suction nozzle 744 can be taken by the component camera 792 when the mounting head 690 is moved by the XY positioning device 726 to the Y-axis position of the corresponding ballscrew 694 at which the electric component 606 is located right above the reflecting mirror 796. Thus, the image-taking device 790 is arranged to image the electronic component 606 located at the predetermined image-taking position which lies within a path of movement of the electronic component 606 when the Y-axis slide 712 is moved in the Y-axis direction relative to the X-axis slide. 696. In the present embodiment, the component camera 792 is a two-dimensional CCD camera, like the fiducial-mark camera 780 described above. The reflecting mirror 798 may be eliminated. In this case, the component camera 792 is disposed so as to have a horizontal attitude and face toward the reflecting mirror 796. Alternatively, the component camera 792 may be disposed right below the path of movement of the mounting head 690 in the Y-axis direction, so as to have a vertical attitude and face upwards.

A strobe light 810 as a UV irradiating device is disposed near the reflecting mirror 796, for irradiating a light-emitting plate 812 of the suction nozzle 744 with a ultraviolet radiation. The light-emitting plate 812 absorbs the ultraviolet radiation, and emits a visible light for illuminating the bottom surface of the electronic component 606. The component camera 792 takes a silhouette image of the electronic component 606 in the axial direction of the suction nozzle 744, with the light-emitting plate 812 used as a background light. In the present embodiment, the light-emitting plate 812 and the strobe light 810 provided as the UV irradiating device cooperate to constitute an illuminating device for the image-taking device 790.

Another strobe light 814 for emitting a visible light is disposed nearer to the suction nozzle 744 than the above-indicated strobe light 810. This strobe light 814 serves as an illuminating device for illuminating the bottom surface of the electronic component 606 with a visible light, for taking a normal image of the electronic component 606 rather than a silhouette image. The image-taking device 790 and the illuminating device constitute an imaging system.

Figure 22:
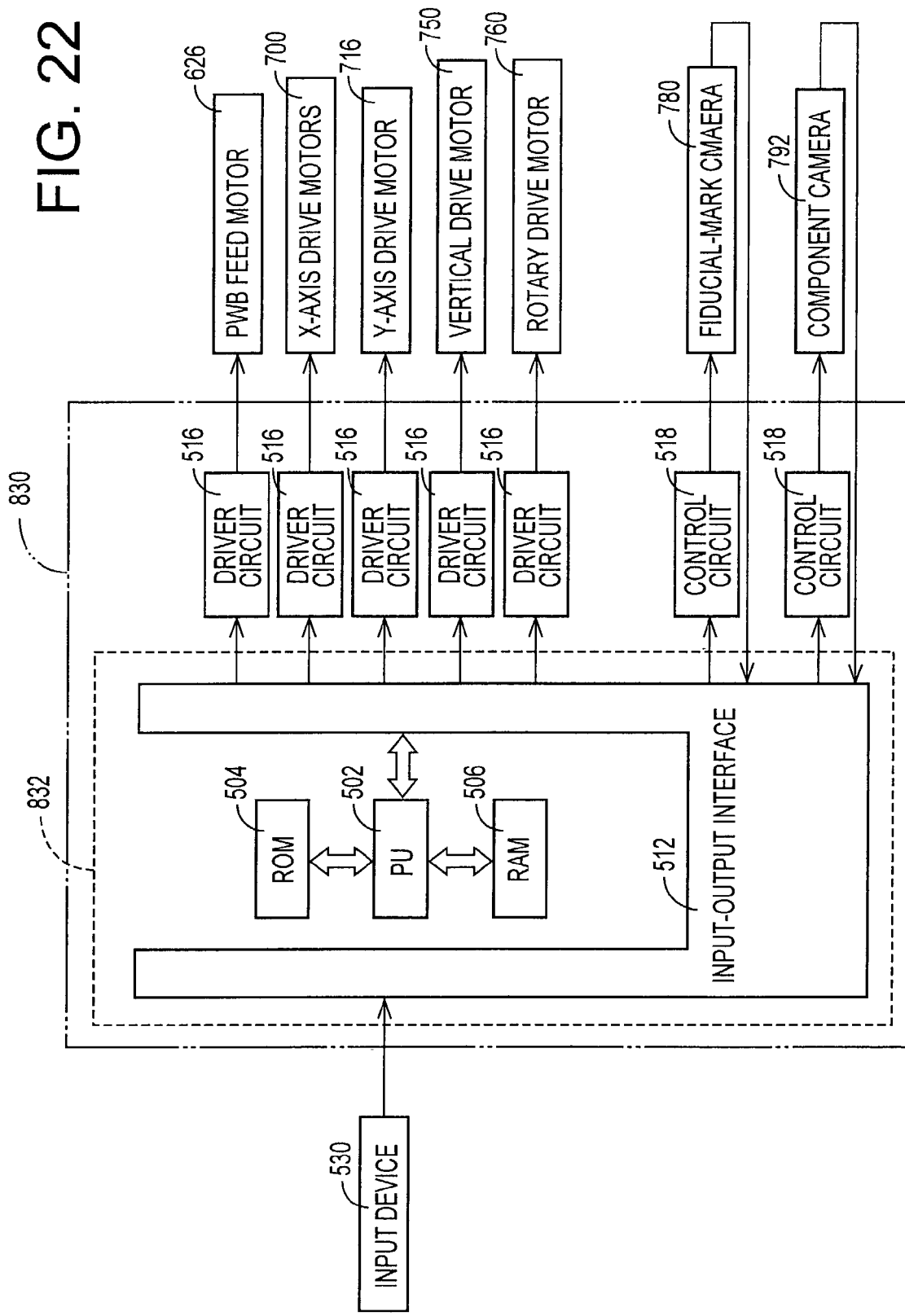
FIG. 22 is a block diagram showing elements of a control device of the electronic-component mounting system of FIG. 17, which elements relate to the present invention.

The present electronic-component mounting system 601 has a control device 830 as shown in FIG. 22. Like the control device 500 used in the first embodiment, the control device 830 is principally constituted by a computer 832. In FIG. 22, the same reference signs as used in FIG. 10 are used to identify the functionally corresponding elements. In the present second embodiment, too, the X-axis drive motors 700 and other drive motors are servomotors whose operating angles are detected by rotary encoders (not shown), the output signals of which are applied to the computer 832. The RAM 506 stores various control programs such as programs for executing a main control routine, a vibration damping routine and a component-mounting routine, and various kinds of data necessary to execute the control programs.

An operation of the present electronic-component mounting system 601 will be described. The mounting system 601 operates to mount the electronic components 606 on the printed-wiring board 602, in a manner as disclosed in JP-B2-2824378. Since the understanding of the operation of mounting the electronic components 606 on the board 602 in general is not deemed necessary to understand the present invention, the following description primarily refers to those aspects which relate to the present invention.

When the electronic component 606 is mounted on the printed-wiring board 602, the mounting head 690 is moved to the component-supply position of the component-supplying device 610 of tape feeder type or component-supplying device 612 of tray type, by movements of the X-axis slide 696 and the Y-axis slide 712. Further, the mounting head 690 is vertically moved by the head elevating and lowering device 734, to permit the suction nozzle 744 to hold the electronic component 606 by suction under the negative pressure. The following description refers to a component mounting operation where the mounting head 690 receives the electronic component 606 from the component-supplying device 610 of tape feeder type.

The mounting head 690 with its suction nozzle 744 holding the electronic component 606 is moved from the component-receiving position to a predetermined component-mounting spot on the printed-wiring board 602 on which the electronic component 606 is mounted. At the component-receiving position, the mounting head 690 receives the electronic component 606 from an appropriate one of the tape feeders 660. During the movement of the mounting head 690 from the component-receiving position to the component-mounting spot, the mounting head 690 is necessarily moved over the reflecting mirror 696 which is fixed to a portion of the X-axis slide 696 which is located between the component-receiving position and the component-mounting spot. In other words, the mounting head 690 necessarily passes across the reflecting mirror 696 between the component-supplying device 610 and the board 602, in the Y-axis direction, while the mounting head 690 is moved from the component-supplying position to the component-mounting spot. Accordingly, an image of the electronic component 606 can be taken by the component camera 792. A position at which the component camera 792 takes the image of the electronic component 606 while the mounting head 690 is located right above the reflecting mirror 796 will be referred to as "a component-hold-position detecting position" or "an image-taking position".

Where the angular position of the electronic component 606 in which the electronic component 606 is mounted on the board 602 is different from the angular position in which the electronic component 606 is held by the suction nozzle 744, the mounting head 690 is rotated about its axis by the head-turning device 736, to rotate the electronic component 606 to its mounting angular position, while the mounting head 690 is moved from the component-receiving position to the component-hold-position detecting position.

When the mounting head 690 has reached the component-hold-position detecting position, the image of the electronic component 606 is taken by the image-taking device 790. Since the image-taking device 790 and the strobe lights 810, 814 are disposed on the X-axis slide 696, the image of the electronic component 606 is taken while the mounting head 690 is moved in the X-axis direction and while the movement of the mounting head 690 in the Y-axis direction is interrupted. The control device 830 compare actual image data indicative of the image of the electronic component 606 with reference image data indicative of a nominal image of the electronic component 606 which does not have any errors of positioning on the suction nozzle 744. As a result of comparison of the actual image data with the reference image data, the control device 830 calculates horizontal positioning errors $\Delta XE$ and $\Delta YE$ and an angular positioning error $\Delta\theta$ of the electronic component 606. Further, center position errors of the electronic component 606 due to its rotation to its mounting angular position are also calculated.

Horizontal positioning errors $\Delta XP$ and $\Delta YP$ of the printed-wiring board 602 are calculated on the basis of images of the fiducial-marks provided on the board 602, which have been taken by the fiducial-mark camera 780. During the movement of the mounting head 690 to the component-mounting spot on the board 602, movement data representative of the distances of movements of the mounting head 690 to the component-mounting spot on the board 602 are adjusted for compensation for the horizontal positioning errors ΔXE and ΔYE of the electronic component 606 the horizontal positioning errors ΔXP and ΔYP of the board 602, and the center position errors of the electronic components 606. Further, the mounting head 690 is rotated by the head-turning device 736, for compensation for the angular positioning error Δθ of the electronic component 606. These compensations permit the electronic component 606 to be mounted exactly at the predetermined mounting spot, in the desired attitude. When the electronic component 606 is mounted on the board 602, the mounting head 690 is moved to the component-mounting spot in the XY plane and lowered to its mounting position. During this movement of the mounting head 690, the above-indicated positioning errors are calculated by the control device 830. This, one cycle of operation to mount one electronic component 606 on the printed-wiring board 602 is completed.

In the present electronic-component mounting system 601 constructed as described above, a plurality of working devices such as the belt drive device 628, XY positioning device 726, heat elevating and lowering device 734 and head-turning device 736 are disposed on the common main body in the form of the machine base 600. As indicated in FIG. 23, some of those working devices are concurrently operated. In this embodiment, too, a plurality of pairs of acceleration and deceleration values are stored in the RAM 506, for each of the working devices.

In the present second embodiment, selected working devices include the X-axis positioning device 706 and the Y-axis positioning device 724 of the XY positioning device 726, and the head-turning device 736. The control device 830 is arranged to determine the acceleration and deceleration values or delays the moments of initiation of the following operations: a movement of the mounting head 690 in the Y-axis direction from the component-receiving position to the component-hold-position detecting position; a rotary movement of the mounting head 690 to change the angular position of the electronic component 606; and movements of the mounting head 690 in the X-axis and Y-axis directions from the component-receiving position to the component-mounting position or spot on the printed-wiring board 602.

The determination of the acceleration and deceleration values of the selected working devices or the determination of delays of the moments of initiation of their operations is effected before the operation to mount the electronic component 606 on the printed-wiring board 602 is initiated, or when a component mounting program for the component mounting operation is prepared. The control device 830 has; data indicative of a predetermined order in which the electronic components 606 are mounted on the board 602; data indicative of predetermined angles of rotation of the mounting head 690 to change the angular position of the electronic components 606 of different kinds; data indicative of a distance in the Y-axis direction between the component-receiving position and the component-hold-position detecting position; and data indicative of distances of movements of the mounting head 690 in the X-axis and Y-axis direction between the component-receiving position and the component-mounting position. The distance between the component-receiving position and the component-hold-position detecting position is constant when the component-supplying device 610 of tape feeder type is used to supply the mounting head 690 with the electronic components 606. When the component-supplying device 612 of tray type is used, however, this distance varies depending upon the kind of the electronic component 606 to be mounted. In the latter case, the distance can be obtained on the basis of the position of the electronic component 606 within the appropriate component tray 666.

The determination of the acceleration and deceleration values and the delaying of the moments of initiation of the operations of the selected working devices are effected in the same manner as in the first embodiment. Initially, the control device 830 determines, as a cycle-time-determinant working device, each of at least one of the selected working devices 706, 724, 736 which determines the cycle time of the electronic-component mounting system 601. The acceleration and deceleration values of the non-cycle-time-determinant working devices are determined, or the moments of initiation of the operations of the non-cycle-time-determinant working devices are delayed, depending upon a signal of a suitable selector switch operated by the machine operator, for instance.

First, the control device 830 determines the cycle-time-determinant working device, for the Y-axis movement and rotation of the mounting head 690. Described in detail, the time required by the Y-axis positioning device 724 to move the mounting head 690 from the component-receiving position to the component-hold-position detecting position is calculated on the basis of the distance of movement of the mounting head 690 in the Y-axis direction, and predetermined maximum acceleration and deceleration values of the XY positioning device 726 which are determined depending upon the kind (configuration, dimensions and mass) of the electronic component 606 to be mounted. Further, the time required by the head-turning device 736 to rotate the mounting head 690 is calculated on the basis of the predetermined angle of rotation of the electronic component 606, and predetermined maximum acceleration and deceleration values of rotation of the mounting head 690 which are determined depending upon the kind of the electronic component 606. The control device 830 determines, as the cycle-time-determinant working device, one of the Y-axis positioning device 724 and the head-turning device 736 which has the longer required operating time.

Then, the control device 830 determines the cycle-time-determinant working device, for the X-axis and Y-axis movements of the mounting head 690 between the component-receiving and component-mounting positions. Described in detail, the time required by the X-axis positioning device 706 to move the mounting head 690 from the component-receiving position to the component-mounting position is calculated on the basis of the predetermined maximum acceleration and deceleration values determined depending upon the kind of the electronic component 606 to be mounted. The thus calculated required operating time of the X-axis positioning device 706 is compared with a sum of (1) the required operating time of the cycle-time-determinant working device determined for the Y-axis movement and rotation of the mounting head 690 as described above, (2) a time during which the mounting head 690 is held stopped in the Y-axis direction at the component-hold-position detecting position to take the image of the electronic component 60, and (3) a time required by the Y-axis positioning device 724 to move the mounting head 690 in the Y-axis direction from the component-hold-position detecting position to the component-mounting position, at predetermined maximum acceleration and deceleration values determined for the kind of the electronic component 606. The time required for taking the image of the electronic component 606 is predetermined and constant. As a result of the comparison, the control device 830 determines the X-axis positioning device 706 as the cycle-time-determinant working device, if the required operating time of this positioning device 706 is longer than the above-indicated sum, and determines the Y-axis positioning device 724 as the cycle-time-determinant working device, if the above-indicted sum is longer than the required operating time of the X-axis positioning device 706.

Where the determination of the acceleration and deceleration values is selected, the actual acceleration and deceleration values of the non-cycle-time-determinant working device are determined for the Y-axis movement of the mounting head 690 between the component-receiving position and the component-hold-position detecting position and the rotation of the mounting head 690. Then, the actual acceleration and deceleration values of the non-cycle-time-determinant working device are determined for the X-axis and Y-axis movements of the mounting head 690 between the component-receiving and component-mounting positions. The cycle-time-determinant working device is operated at its predetermined maximum acceleration and deceleration values, while the non-cycle-time-determinant working device is operated at the acceleration and deceleration values that are determined so as to be lower than the predetermined maximum values and so as to be lowered as much as possible such that the presently required operation of the non-cycle-time-determinant working device can be completed within a corresponding period of the cycle time of the system 601 determined by the cycle-time-determinant working device.

The Y-axis positioning device 724 may be the cycle-time-determinant working device when the mounting head 690 is moved from the component-receiving position to the component-hold-position detecting position, and the non-cycle-time-determinant working device when the mounting head 690 is moved from the component-hold-position detecting position to the component-mounting position, or vice versa. In this case, the actual acceleration and deceleration values of the Y-axis positioning device 724 during the movement of the mounting head 690 between the component-receiving and component-hold-position detecting positions are different from those during the movement of the mounting head 690 between the component-hold-position detecting and component-mounting positions. Further, the Y-axis positioning device 724 may be the non-cycle-time-determinant working device during both of the movements of the mounting head 690.

When the delaying of the moments of initiation of operation of the non-cycle-time-determinant working device is selected, the moment of initiation is delayed such that the presently required operation can be completed within a corresponding period of the cycle time of the system 601 determined by the cycle-time-determinant working device. Where the head-turning device 736 is the cycle-time-determinant working device for the movement of the mounting head 690 between the component-receiving position and the component-hold-position detecting position, for example, the operation of the Y-axis positioning device 724 is initiated after the operation of the head-turning device 736 is initiated to rotate the mounting head 690 which has received the electronic component 606. Where the Y-axis positioning device 724 is the cycle-time-determinant working device for the movements of the mounting head 690 in the X-axis and Y-axis directions, the operation of the X-axis positioning device 706 is initiated after the operation of the Y-axis positioning device 724 is initiated.

Where the mounting head 690 is moved by the XY positioning device 726, the head elevating and lowering device 734 may be included in the selected working devices. In this case, the determination of the actual acceleration and deceleration values or the delaying of the moment of initiation of the non-cycle-time-determinant working devices may be effected for the downward movement of the mounting head 690 to receive the electronic component 606 from the component-supplying device 610, 612 and to mount the electronic component 606 on the board 602, and for the movements of the mounting head 690 in the X-axis and Y-axis directions.

In the electronic-component mounting system 601, the movements of the mounting head 690 to the component-receiving position and the component-mounting position partially take place concurrently with the downward movements of the mounting head 690 to receive and mount the electronic component 606, as indicated in FIG. 23. In this case, the downward movement of the mounting head 690 may be controlled in a predetermined pattern, in relation to the component-receiving position and the component-mounting position. This pattern of control of the vertical movement of the mounting head 690 is represented by a curve representative of a relationship between the positions of the mounting head 690 in the horizontal and vertical directions (in the XY plane and a plane perpendicular to the XY plane), as indicated in the graph of FIG. 24. Usually, the mounting head 690 is moved in the XY plane linearly to the component-receiving and component-mounting positions, from a position relatively close to these positions. In this case, the downward movements of the mounting head 690 in relation to the horizontal movements are controlled so as to prevent an interference of the mounting head 690 or the electronic component 606 with the members located near the component-receiving or component mounting position. For example, the downward movement of the mounting head 690 near the component-receiving position is controlled to prevent an interference of the mounting head 690 with the guide rails 620, 622 of the PWB conveyor 604 and the members of the tape feeders 660, while the downward movement near the component-mounting position is controlled to prevent an interference of the electronic component 606 held by the mounting head 690, with the electronic components 606 already mounted on the printed-wiring board 602.

While the acceleration and deceleration values of the mounting head 690 in the X-axis and Y-axis directions are determined depending upon the mass of the electronic component 606 to be held by the mounting head 690, those of the mounting head 690 in the Z-axis direction is determined depending upon the material of the electronic component 606, for instance. Where the electronic component 606 is formed of a comparatively brittle material, the deceleration and speed values of the downward movement of the mounting head 690 at the component-receiving position are selected to be small enough to prevent a risk of damaging of the electronic component 606 due to a large impact between the suction tube 770 with the electronic component 606 upon abutting contact therebetween. Similarly, the deceleration and speed values of the downward movement of the mounting head 690 at the component-mounting position are selected to be small enough to reduce an impact between the electronic component 606 and the printed-wiring board 602 upon abutting contact therebetween.

There is a risk of the interference described above where the relationship between the horizontal and vertical positions of the mounting head 690 falls within an area located below the curve of FIG. 24. Therefore, the acceleration and deceleration values of the X-axis and Y-axis positioning devices 706, 724 and the acceleration and deceleration values of the head elevating and lowering device 734 must be determined so as to avoid the relationship falling within the above-indicated area. Where the relationship falls within an area located above the curve of FIG. 24, the acceleration and deceleration values of the X-axis and Y-axis positioning devices 706, 724 actually established for the electronic component 606 are lower than those of the head elevating and lowering device 734. In this respect, the optimum acceleration and deceleration values of the mounting head 690 are required to be determined such that the relationship between the horizontal and vertical positions of the mounting head 690 is held located above but close to the curve of FIG. 24. If the maximum acceleration and deceleration values of the selected working device predetermined for the electronic component 606 to be mounted are lower than the optimum values, this selected working device is determined as the cycle-time-determinant working device.

The head elevating and lowering devices 230, 232 in the first embodiment of FIGS. 1–16 wherein the mounting heads 130 are turned about the common axis of turning may be handled as the selected working devices whose acceleration and deceleration values are determined to reduce the magnitude of the overall vibration of the system 12. Although the downward movement speed of each mounting head 130 immediately before abutting contact of the mounting head 130 with the electronic component 38 at the component-receiving position is substantially zero, it is desirable to minimize the deceleration value to completely prevent the abutting impact between the suction tube 200 and the electronic component 38, where the electronic component 38 is formed of a brittle material. Similarly, it is desirable to minimize the deceleration value of the mounting head 130 at the component-mounting position, to minimize the abutting impact between the electronic component 38 and the printed-wiring board 60, where the electronic component is formed of the brittle material. Thus, the head elevating and lowering devices 230, 232 may be the cycle-time-determinant working devices.

Where the head elevating and lowering devices 230, 232 are handled as the selected working devices, the downward movement of the mounting head 130 in relation to the horizontal movement must be controlled in a pattern slightly different from that of FIG. 24 described above. In the first embodiment wherein the head elevating and lowering devices 230, 232 are operated in synchronization with the operation of the head-turning device 194, with the common drive source, so that the relationship between the vertical and horizontal positions of the mounting head 130 changes in a predetermined constant pattern, irrespective of changes in the acceleration and deceleration values of the head-turning device and head elevating and lowering devices 230, 232, in the absolute coordinate system set on the main body of the electronic-component mounting system 12. However, the above-indicated relationship must be considered in the coordinate system set for the table-positioning device 46 for positioning the component supply tables 30, 32 and the XY positioning device 64 for positioning the printed-wiring board 60. When the acceleration and deceleration values of the head-turning device 194 and the head elevating and lowering devices 230, 232 are controlled, the acceleration and deceleration values of the table-positioning device 46 and the XY positioning device 64 must be controlled.

In the first embodiment wherein the electronic components 38 are supplied by moving the component supply tables 30, 32, the acceleration and deceleration values of the component supply tables 30, 32 are held constant, irrespective of the numbers of the electronic components 38 accommodated in the tape feeders 36. However, the acceleration and deceleration values of the table-positioning device 46 may be controlled according to a change in the mass of the selected component supply table 30, 32. That is, the mass of the selected component supply table 30, 32 changes depending upon the number of the tape feeders 36 mounted on the feeder carriage 34, and/or the total number of the electronic components 38 accommodated in the tape feeders 36. The acceleration and deceleration values of the selected component supply table 30 may be increased as the mass of the table 30 decreases with a decrease in the total number of the electronic components 38, even where the number of the tape feeders 36 mounted on the feeder carriage 34 is held constant. Namely, the control device 500 increases the predetermined maximum acceleration and deceleration values of the table-positioning device 46 used for calculating the required operating time used to determine whether the device 46 should be selected as a cycle-time-determinant working device or not. Similarly, the control device 500 increases the predetermined maximum acceleration and deceleration values of the table-positioning device 46, where the number of the tape feeders 36 mounted on the feeder carriage 34 decreases. The predetermined acceleration and deceleration values are reduced when the tape feeders 36 are replenished with the new electronic components 38, or the number of the mounted tape feeders 36 is increased.

In the illustrated first and second embodiments described above, the actual acceleration and deceleration values or the moments of initiation of the operations of the non-cycle-time-determinant working devices are determined before the initiation of the series of operations to mount the electronic component or during the preparation of the component mounting control program. However, the determination of the actual acceleration and deceleration values or the moments of initiation of the operations of the non-cycle-time-determinant working devices may be effected after the initiation of the series of operations to mount the electronic component.

The component-hold-position rectifying device 300 to rectify the angular positioning error of the electronic component as held by the mounting head may be handled as one of the selected working devices. In this case, the determination of the actual acceleration and deceleration values or the moments of initiation of the operations of the non-cycle-time-determinant working devices is effected after the initiation of the series of operations to mount the electronic components, since the angular positioning error of the electronic component is detected on the basis of the image of the electronic component as held by the mounting head. The required operating time of the component-hold-position rectifying device used to determine whether this device should be determined as the cycle-time-determinant working device or not may be calculated on the basis of the detected angular positioning error of the electronic component.

The stroke changing device 270 may also be handled as the selected working devices. In operation of the stroke changing device 270, one of a plurality of pairs of acceleration and deceleration values is selected for the second slide 278, and the amount of wear the suction nozzle and the thickness or height dimension error of the electronic component are detected during the series of component-mounting operations. The vertical movement stroke of the mounting head 130 is determined on the basis of the detected amount of wear of the suction nozzle and the detected thickness error of the electronic component. The required operating time of the stroke changing device 270 to establish the determined vertical movement stroke of the mounting head 130 is calculated on the basis of the distance of movement and the selected acceleration and deceleration values of the second slide 278. The calculated required operating time is used to determine whether the stroke changing device 270 should be handled as the cycle-time-determinant working device or not.

On the other hand, the Z-axis positioning device 88 may be excluded from the group of the selected working devices. The required operating amount of the Z-axis positioning device varies primarily with the thickness or height dimension of the electronic component 38. Where the difference of the thickness of different kinds of the electronic component is small, the required operating amount of the Z-axis positioning device 88 may be accordingly small, so that the operation of the Z-axis positioning device 88 even at comparatively low acceleration and deceleration values may be completed within the required operating times of the other working devices that are operated concurrently with the positioning device 88. In this respect, the Z-axis positioning device 88 need not be handled as the selected working devices.

In the illustrated embodiments, a plurality of pairs of acceleration and deceleration values are set for each of the working devices, as indicated in FIG. 13, such that the absolute value of the acceleration value of each pair is equal to the absolute value of the deceleration value. However, the absolute values of the acceleration and deceleration values need not be equal to each other. Further, the number of the acceleration values and the number of the deceleration values that are set for each working device may be different from each other. The working device may be operated with a selected one of predetermined combinations of the acceleration and deceleration values. Alternatively, the combination of the acceleration and deceleration values of the non-cycle-time-determinant working device may be determined depending upon the degree in which the acceleration and deceleration values are required to be lowered to reduce the magnitude of the overall vibration of the electronic-component mounting system.

While the illustrated first and second embodiments are arranged to select the lowering of the acceleration and deceleration values of the non-cycle-time-determinant working devices, or the delaying of the moments of operations of the non-cycle-time-determinant working devices, the electric-component mounting system according to the present invention may be arranged to effect only one or both of the lowering of the acceleration and deceleration values and the delaying of the moments of initiation of the operations of the non-cycle-time-determinant working devices. In the latter case, the lowering of the acceleration and deceleration values is effected for some of the non-cycle-time-determinant working devices, while the moments of initiation of the operations of the other non-cycle-time-determinant working devices are delayed, for example. Alternatively, both the lowering of the acceleration and deceleration values and the delaying of the moment of initiation of the operation are effected for one non-cycle-time-determinant working device.

While the illustrated embodiments use a component holder in the form of the suction nozzle 190, 742 having the suction tube for holding the electronic component by suction, the electronic component may be mechanically held by a component holder which has a plurality of gripper members which are closed and opened by a suitable actuator.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An electric-component mounting system operable to mount electric components on a circuit substrate and including a common main body, and a plurality of working devices which are disposed on said common main body and each of which has an actuator that is variable in acceleration and deceleration values and/or an operating speed thereof, comprising:

determinant-device determining means, operable with respect to presently required operations of a plurality of selected working devices selected from said plurality of working devices, for determining, as a cycle-time-determinant working device, each of at least one of said selected working devices which determines a cycle time of the electric-component mounting system such that said cycle time is determined on the basis of a required operating time of each cycle-time-determinant working device as calculated when the presently required operation of said cycle-time-determinant working device is performed at predetermined maximum acceleration and deceleration values or a predetermined maximum operating speed thereof; and slowdown means for determining actual acceleration and deceleration values or an actual operating speed of each of at least one of non-cycle-time-determinant working devices which are said plurality of selected working devices except said each cycle-time-determinant working device, said slowdown means determining said actual acceleration and deceleration values or said actual operating speed of said each non-cycle-time-determinant working device, so as to be lower than predetermined maximum acceleration and deceleration values or a predetermined maximum operating speed thereof, such that the presently required operation of said each non-cycle-time-determinant working device can be completed within a corresponding period of said cycle time determined by said each cycle-time-determinant working device.

2. The electric-component mounting system according to claim 1, wherein each of at least one of said plurality of selected working devices is operable at a selected one of a plurality of pairs of predetermined acceleration and deceleration values, or at a selected one of a plurality of predetermined operating speeds, and said determinant-device determining means calculates said required operating time of each of said plurality of selected working devices, on the basis of one of said plurality of pairs of predetermined acceleration and deceleration values which is selected as said predetermined maximum acceleration and deceleration values of said each selected working device, or one of said plurality of predetermined operating speeds which is selected as said predetermined maximum operating speed of said each working device.

3. The electric-component mounting system according to claim 1, wherein each of at least one of said plurality of selected working devices is operable at a selected one of a plurality of pairs of predetermined acceleration and deceleration values, or at a selected one of a plurality of predetermined operating speeds, and said slowdown means determines said actual acceleration and deceleration values or said actual operating speed of said each non-cycle-time-determinant working device, by selecting one of said plurality of pairs of predetermined acceleration and deceleration values or one of said plurality of predetermined operating speeds.

4. The electric-component mounting system according to claim 1, further comprising:
   a component-supplying device operable to supply said electric components;
   a circuit-substrate holding device operable to hold said circuit substrate on which said electric components are to be mounted;
   a mounting head operable to receive the electric component from said component-supplying device, and mount the electric component onto said circuit substrate held by said circuit-substrate holding device;
   a head-moving device operable to move said mounting head in a plane intersecting an axis of rotation of said mounting head; and
   a head-rotating device operable to rotate said mounting head about said axis of rotation,
   and wherein said plurality of selected working devices includes at least said head-moving device.

5. The electric-component mounting system according to claim 4, wherein said plurality of selected working devices includes said head-rotating device.

6. The electric-component mounting system according to claim 4, wherein said plurality of selected working devices includes an axially moving device operable to axially move said mounting head.

7. The electric-component mounting system according to claim 4, wherein said component-supplying device includes a component supply table including a plurality of component feeders, and a feeder carriage on which said plurality of component feeders is mounted such that component-supply portions of said component feeders are arranged along a line, said component feeders accommodating respective groups of electric components of different kinds and operable to supply the electric components of different kinds from said component-supply portions thereof.

8. The electric-component mounting system according to claim 4, wherein said head-moving device includes a head-turning device operable to turn said mounting head about an axis of turning, to sequentially move said mounting head to a plurality of working positions including a component-receiving position at which said mounting head receives the electric component from said component-supplying device, and a component-mounting position at which the mounting head transfers the electric component onto said circuit substrate held by said circuit-substrate holding device.

9. The electric-component mounting system according to claim 8, wherein said determinant-device determining means determines, as said cycle-time-determinant working device, each of said plurality of selected working devices except said head-turning device, the required operating time of which is longer than a corresponding portion of the required operating time of said head-turning device.

10. The electric-component mounting system according to claim 7, wherein said plurality of selected working devices includes a table-positioning device operable to move said component supply table along a line.

11. The electric-component mounting system according to claim 4, wherein said head-moving device includes an XY positioning device operable to move said mounting head in mutually perpendicular X-axis and Y-axis directions in an XY plane parallel to a surface of said circuit substrate as held by said circuit-substrate holding device.

12. The electric-component mounting system according to claim 4, wherein said plurality of selected working devices includes an XY positioning device operable to move said circuit-substrate holding device in mutually perpendicular X-axis and Y-axis directions in an XY plane parallel to a surface of said circuit substrate as held by said circuit-substrate holding device.

13. The electric-component mounting system according to claim 4, wherein said mounting head has a plurality of component holders for holding the respective electric components, and said plurality of selected working devices includes a component-holder selecting device operable to place a selected one of said component holders in an operating position thereof.

14. The electric-component mounting system according to claim 4, wherein said plurality of selected working devices includes a Z-axis positioning device operable to move said circuit-substrate holding device in a Z-axis direction substantially perpendicular to a surface of said circuit substrate as held by said circuit-substrate holding device.

15. The electric-component mounting system according to claim 4, wherein said plurality of selected working devices include at least one of: a first stroke-end changing device operable to change one of opposite ends of an axial operating stroke of said mounting head at a component-receiving position at which the mounting head receives the electric component, said one of said opposite ends being located on the side of said component-supplying device; and a second stroke-end changing device operable to change one of opposite ends of an axial operating stroke of said mounting head at a component-mounting position at which said mounting head mounts the electric component on said circuit substrate, said one of said opposite ends of said axial operating stroke at said component-mounting position being located on the side of said circuit substrate.

16. An electric-component mounting system operable to mount electric components on a circuit substrate and including a common main body, and a plurality of working devices which are disposed on said common main body and each of which has an actuator that is variable in acceleration and deceleration values and/or an operating speed thereof, comprising:
   determinant-device determining means, operable with respect to presently required operations of a plurality of selected working devices selected from said plurality of working devices, for determining, as a cycle-time-determinant working device, each of at least one of said selected working devices which determines a cycle time of the electric-component mounting system such that said cycle time is determined on the basis of a required operating time of each cycle-time-determinant working device as calculated when the presently required operation of said cycle-time-determinant working device is performed a predetermined maximum acceleration and deceleration values or a predetermined maximum operating speed; and
   at least one of (a) slowdown means for determining actual acceleration and deceleration values or an actual operating speed of each of at least one of non-cycle-time-determinant working devices which are said plurality of selected working devices except said each cycle-time-determinant working device, said slowdown means determining said actual acceleration and deceleration values or said actual operating speed of said each non-cycle-time-determinant working device, so as to be lower than predetermined maximum acceleration and deceleration values or a predetermined maximum operating speed thereof, such that the presently required operation of said each non-cycle-time-determinant working device can be completed within a corresponding period of said cycle time determined by said each cycle-time-determinant working device, and (b) operation-delaying means for delaying a moment of initiation of a presently required operation of each of at least one of the non-cycle-time-determinant working devices, said operation-delaying means delaying said moment of initiation of said presently required operation of said each of at least one of non-cycle-time-determinant working devices such that the presently required operation of said each non-cycle-time-determinant working device can be completed within a corresponding period of said cycle time determined by said each cycle-time-determinant working device.

17. An electric-component mounting system operable to mount electric components on a circuit substrate and including a common main body, and a plurality of working devices which are disposed on said common main body and each of which has an actuator that is variable in acceleration and deceleration values and/or an operating speed thereof, comprising:

determinant-device determining means, operable with respect to presently required operations of a plurality of selected working devices selected from said plurality of working devices, for determining, as a cycle-time-determinant working device, each of at least one of said selected working devices which determines a cycle time of the electric-component mounting system such that said cycle time is determined on the basis of a required operating time of said cycle-time-determinant working device where the presently required operation of said each cycle-time-determinant working device is performed at predetermined maximum acceleration and deceleration values or a predetermined maximum operating speed thereof; and operation-delaying means for delaying a moment of initiation of a presently required operation of each of at least one of non-cycle-time-determinant working devices which are said plurality of selected working devices except said each cycle-time-determinant working device, said operation-delaying means delaying said moment of initiation of said presently required operation of said each of at least one of said non-cycle-time-determinant working devices such that the presently required operation of said each non-cycle-time-determinant working device can be completed within a corresponding period of said cycle time determined by said each cycle-time-determinant working device.

18. An electric-component mounting system according to claim 17, wherein said operating-delaying means delays the moments of initiation of the presently required operations of at least two of said non-cycle-time-determinant working devices with respect to the moment of initiation of said each cycle-time-determinant working device such that the presently required operations of said at least two non-cycle-time-determinant working devices are initiated at different times.

* * * * *